(12) United States Patent
Wong et al.

(10) Patent No.: US 7,136,265 B2
(45) Date of Patent: Nov. 14, 2006

(54) LOAD RECOGNITION AND SERIES ARC DETECTION USING BANDPASS FILTER SIGNATURES

(75) Inventors: Kon B. Wong, Cedar Rapids, IA (US); Gary W. Scott, Mt. Vernon, IA (US); Robert F. Dvorak, Mt. Vernon, IA (US)

(73) Assignee: Square D Company, Palatine, IL (US)

( * ) Notice: Subject to any disclaimer, the term of this patent is extended or adjusted under 35 U.S.C. 154(b) by 553 days.

(21) Appl. No.: 10/436,671

(22) Filed: May 13, 2003

(65) Prior Publication Data

US 2004/0042137 A1 Mar. 4, 2004

Related U.S. Application Data

(63) Continuation-in-part of application No. 10/107,621, filed on Mar. 27, 2002, now Pat. No. 7,068,480, which is a continuation-in-part of application No. 09/981,603, filed on Oct. 17, 2001.

(51) Int. Cl.
*H02H 9/08* (2006.01)
(52) U.S. Cl. .......................................... 361/42; 361/43
(58) Field of Classification Search ............ 361/42–50; 702/58, 66
See application file for complete search history.

(56) References Cited

U.S. PATENT DOCUMENTS

| | | | |
|---|---|---|---|
| 2,808,566 A | 10/1957 | Douma | 324/127 |
| 2,832,642 A | 4/1958 | Lennox | 299/132 |
| 2,898,420 A | 8/1959 | Kuze | 200/87 |
| 3,471,784 A | 10/1969 | Arndt et al. | 324/126 |
| 3,538,241 A | 11/1970 | Rein | 174/143 |
| 3,588,611 A | 6/1971 | Lambden et al. | 317/31 |
| 3,600,502 A | 8/1971 | Wagenaar et al. | 174/143 |
| 3,622,872 A | 11/1971 | Boaz et al. | 324/52 |
| 3,660,721 A | 5/1972 | Baird | 361/55 |
| 3,684,955 A | 8/1972 | Adams | 324/72 |
| 3,716,757 A | 2/1973 | Rodriguez | 317/40 |
| 3,746,930 A | 7/1973 | Van Best et al. | 317/31 |
| 3,775,675 A | 11/1973 | Freeze et al. | 324/51 |
| 3,812,337 A | 5/1974 | Crosley | 235/153 AC |
| 3,858,130 A | 12/1974 | Misencik | 335/18 |
| 3,869,665 A | 3/1975 | Kenmochi et al. | 324/72 |

(Continued)

FOREIGN PATENT DOCUMENTS

CA  2256208  6/1999

(Continued)

OTHER PUBLICATIONS

International Search Report dated Oct. 29, 2004 for application No. PCT/US2004/014829.

(Continued)

*Primary Examiner*—Steven W. Jackson
*Assistant Examiner*—Danny Nguyen

(57) ABSTRACT

A method and system for determining whether arcing is present in an electrical circuit includes sensing a change in an alternating current in the circuit and developing a corresponding input signal, analyzing the input signal to determine the presence of broadband noise in a predetermined range of frequencies, and producing a corresponding output signal, and processing the input signal and the output signal in a predetermined fashion to determine whether an arcing fault is present in the circuit. The processing includes determining a type of load connected to the electrical circuit, based at least in part upon the input signal and the output signal, and monitoring high frequency noise in a 20 KHz band for each ⅛ cycle of the alternating current.

69 Claims, 62 Drawing Sheets

U.S. PATENT DOCUMENTS

| | | | | |
|---|---|---|---|---|
| 3,878,460 | A | 4/1975 | Nimmersjo | 324/52 |
| 3,911,323 | A | 10/1975 | Wilson et al. | 317/18 |
| 3,914,667 | A | 10/1975 | Waldron | 317/36 |
| 3,932,790 | A | 1/1976 | Muchnick | 317/18 D |
| 3,939,410 | A | 2/1976 | Bitsch et al. | 324/72 |
| 4,052,751 | A | 10/1977 | Shepard | 361/50 |
| 4,074,193 | A | 2/1978 | Kohler | 324/126 |
| 4,081,852 | A | 3/1978 | Coley et al. | 361/45 |
| 4,087,744 | A | 5/1978 | Olsen | 324/51 |
| 4,115,828 | A | 9/1978 | Rowe et al. | 361/1 |
| 4,156,846 | A | 5/1979 | Harrold et al. | 324/158 |
| 4,166,260 | A | 8/1979 | Gillette | 335/20 |
| 4,169,260 | A | 9/1979 | Bayer | 340/562 |
| 4,214,210 | A | 7/1980 | O'Shea | 455/282 |
| 4,233,640 | A | 11/1980 | Klein et al. | 361/44 |
| 4,245,187 | A | 1/1981 | Wagner et al. | 324/54 |
| 4,251,846 | A | 2/1981 | Pearson et al. | 361/30 |
| 4,264,856 | A | 4/1981 | Frierdich et al. | 322/25 |
| RE30,678 | E | 7/1981 | Van Zeeland et al. | 361/44 |
| 4,316,187 | A | 2/1982 | Spencer | 340/664 |
| 4,344,100 | A | 8/1982 | Davidson et al. | 361/45 |
| 4,354,154 | A | 10/1982 | Olsen | 324/51 |
| 4,356,443 | A | 10/1982 | Emery | 324/51 |
| 4,358,809 | A | 11/1982 | Blok | 361/46 |
| 4,378,525 | A | 3/1983 | Burdick | 324/127 |
| 4,387,336 | A | 6/1983 | Joy et al. | 324/51 |
| 4,459,576 | A | 7/1984 | Fox et al. | 336/84 |
| 4,466,071 | A | 8/1984 | Russell, Jr. | 364/492 |
| 4,477,855 | A | 10/1984 | Nakayama et al. | 361/54 |
| 4,559,491 | A | 12/1985 | Saha | 324/52 |
| 4,587,588 | A | 5/1986 | Goldstein | 361/54 |
| 4,589,052 | A | 5/1986 | Dougherty | 361/94 |
| 4,590,355 | A | 5/1986 | Nomura et al. | 219/125.12 |
| 4,616,200 | A | 10/1986 | Fixemer et al. | 335/35 |
| 4,639,817 | A | 1/1987 | Cooper et al. | 361/62 |
| 4,642,733 | A | 2/1987 | Schacht | 361/656 |
| 4,644,439 | A | 2/1987 | Taarning | 361/87 |
| 4,652,867 | A | 3/1987 | Masot | 340/638 |
| 4,658,322 | A | 4/1987 | Rivera | 361/37 |
| 4,697,218 | A | 9/1987 | Nicolas | 633/882 |
| 4,702,002 | A | 10/1987 | Morris et al. | 29/837 |
| 4,707,759 | A | 11/1987 | Bodkin | 831/642 |
| 4,771,355 | A | 9/1988 | Emery et al. | 361/33 |
| H536 | H | 10/1988 | Strickland et al. | 324/456 |
| H538 | H | 11/1988 | Betzold | 89/134 |
| 4,792,899 | A | 12/1988 | Miller | 323/317 |
| 4,810,954 | A | 3/1989 | Fam | 324/142 |
| 4,816,958 | A | 3/1989 | Belbel et al. | 361/93 |
| 4,833,564 | A | 5/1989 | Pardue et al. | 361/93 |
| 4,835,648 | A | 5/1989 | Yamauchi | 361/14 |
| 4,839,600 | A | 6/1989 | Kuurstra | 324/127 |
| 4,845,580 | A | 7/1989 | Kitchens | 361/91 |
| 4,847,719 | A | 7/1989 | Cook et al. | 361/13 |
| 4,853,818 | A | 8/1989 | Emery et al. | 361/33 |
| 4,858,054 | A | 8/1989 | Franklin | 361/57 |
| 4,866,560 | A | 9/1989 | Allina | 361/104 |
| 4,882,682 | A | 11/1989 | Takasuka et al. | 364/507 |
| 4,893,102 | A | 1/1990 | Bauer | 335/132 |
| 4,901,183 | A | 2/1990 | Lee | 361/56 |
| 4,922,368 | A | 5/1990 | Johns | 361/62 |
| 4,922,492 | A | 5/1990 | Fasang et al. | 371/22.1 |
| 4,931,894 | A | 6/1990 | Legatti | 361/45 |
| 4,939,495 | A | 7/1990 | Peterson et al. | 337/79 |
| 4,949,214 | A | 8/1990 | Spencer | 361/95 |
| 4,969,063 | A | 11/1990 | Scott et al. | 361/93 |
| 5,010,438 | A | 4/1991 | Brady | 361/56 |
| 5,012,673 | A | 5/1991 | Takano et al. | 73/118.1 |
| 5,032,744 | A | 7/1991 | Wai Yeung Liu | 307/355 |
| 5,047,724 | A | 9/1991 | Boksiner et al. | 324/520 |
| 5,051,731 | A | 9/1991 | Guim et al. | 340/638 |
| 5,063,516 | A | 11/1991 | Jamoua et al. | |
| 5,107,208 | A | 4/1992 | Lee | 324/158 |
| 5,117,325 | A | 5/1992 | Dunk et al. | 361/93 |
| 5,121,282 | A | 6/1992 | White | 361/42 |
| 5,166,861 | A | 11/1992 | Krom | 361/379 |
| 5,168,261 | A | 12/1992 | Weeks | 340/515 |
| 5,179,491 | A | 1/1993 | Runyan | 361/45 |
| 5,185,684 | A | 2/1993 | Beihoff et al. | 361/45 |
| 5,185,685 | A | 2/1993 | Tennies et al. | 361/45 |
| 5,185,686 | A | 2/1993 | Hansen et al. | 361/45 |
| 5,185,687 | A | 2/1993 | Beihoff et al. | 361/45 |
| 5,206,596 | A | 4/1993 | Beihoff et al. | 324/536 |
| 5,208,542 | A | 5/1993 | Tennies et al. | 324/544 |
| 5,223,795 | A | 6/1993 | Blades | 324/536 |
| 5,224,006 | A | 6/1993 | MacKenzie et al. | 361/45 |
| 5,233,511 | A | 8/1993 | Bilas et al. | 364/146 |
| 5,257,157 | A | 10/1993 | Epstein | 361/111 |
| 5,280,404 | A | 1/1994 | Ragsdale | 361/113 |
| 5,283,708 | A | 2/1994 | Waltz | 361/93 |
| 5,286,933 | A | 2/1994 | Pham | 218/119 |
| 5,307,230 | A | 4/1994 | MacKenzie | 361/96 |
| 5,334,939 | A | 8/1994 | Yarbrough | 324/424 |
| 5,353,014 | A | 10/1994 | Carroll et al. | 340/638 |
| 5,359,293 | A | 10/1994 | Boksiner et al. | 324/544 |
| 5,363,269 | A | 11/1994 | McDonald | 361/45 |
| 5,373,241 | A | 12/1994 | Ham, Jr. et al. | 324/536 |
| 5,383,084 | A | 1/1995 | Gershen et al. | 361/113 |
| 5,432,455 | A | 7/1995 | Blades | 324/536 |
| 5,546,266 | A | 8/1996 | Mackenzie et al. | 361/93 |
| 5,561,605 | A | 10/1996 | Zuercher et al. | 364/483 |
| 5,568,371 | A | 10/1996 | Pitel et al. | 363/39 |
| 5,578,931 | A | 11/1996 | Russell et al. | 324/536 |
| 5,590,010 | A | 12/1996 | Ceola et al. | 361/93 |
| 5,590,012 | A | 12/1996 | Dollar | 361/113 |
| 5,602,709 | A | 2/1997 | Al-Dabbagh | 361/85 |
| 5,608,328 | A | 3/1997 | Sanderson | 324/529 |
| 5,617,019 | A | 4/1997 | Etter | 324/117 |
| 5,638,244 | A | 6/1997 | Mekanik et al. | 361/62 |
| 5,657,244 | A | 8/1997 | Seitz | 364/492 |
| 5,659,453 | A | 8/1997 | Russell et al. | 361/93 |
| 5,682,101 | A | 10/1997 | Brooks et al. | 324/536 |
| 5,691,869 | A | 11/1997 | Engel et al. | 361/42 |
| 5,701,110 | A | 12/1997 | Scheel et al. | 335/132 |
| 5,706,154 | A | 1/1998 | Seymour | 361/42 |
| 5,706,159 | A | 1/1998 | Dollar, II et al. | 361/113 |
| 5,726,577 | A | 3/1998 | Engel et al. | 324/536 |
| 5,729,145 | A | 3/1998 | Blades | 324/536 |
| 5,754,386 | A | 5/1998 | Barbour et al. | 361/154 |
| 5,764,125 | A | 6/1998 | May | 336/92 |
| 5,774,555 | A | 6/1998 | Lee et al. | 381/4 |
| 5,784,020 | A | 7/1998 | Inoue | 341/141 |
| 5,805,397 | A | 9/1998 | MacKenzie | 361/42 |
| 5,805,398 | A | 9/1998 | Rae | 361/42 |
| 5,815,352 | A | 9/1998 | Mackenzie | 361/42 |
| 5,818,237 | A | 10/1998 | Zuercher et al. | 324/536 |
| 5,818,671 | A | 10/1998 | Seymour et al. | 361/42 |
| 5,825,598 | A | 10/1998 | Dickens et al. | 361/42 |
| 5,834,940 | A | 11/1998 | Brooks et al. | 324/424 |
| 5,835,319 | A | 11/1998 | Welles, II et al. | 361/5 |
| 5,835,321 | A | 11/1998 | Elms et al. | 361/45 |
| 5,839,092 | A | 11/1998 | Erger et al. | 702/58 |
| 5,847,913 | A | 12/1998 | Turner et al. | 361/93 |
| 5,886,860 | A | 3/1999 | Chen et al. | 361/9 |
| 5,886,861 | A | 3/1999 | Parry | 361/42 |
| 5,889,643 | A | 3/1999 | Elms | 361/42 |
| 5,896,262 | A | 4/1999 | Rae et al. | 361/94 |
| 5,905,619 | A | 5/1999 | Jha | 361/93 |
| 5,933,305 | A | 8/1999 | Schmalz et al. | 361/42 |
| 5,933,308 | A | 8/1999 | Garzon | 361/62 |
| 5,933,311 | A | 8/1999 | Chen et al. | 361/106 |
| 5,946,179 | A | 8/1999 | Fleege et al. | 361/93 |
| 5,963,406 | A | 10/1999 | Neiger et al. | 361/42 |
| 5,999,384 | A | 12/1999 | Chen et al. | 361/42 |
| 6,002,561 | A | 12/1999 | Dougherty | 361/42 |

| | | | | | |
|---|---|---|---|---|---|
| 6,011,680 A | 1/2000 | Solleder et al. ............... 361/90 | EP | 0 813 281 A2 | 12/1997 |
| 6,031,699 A | 2/2000 | Dollar, II et al. ............. 361/42 | EP | 0 981 193 A2 | 2/2000 |
| 6,054,887 A | 4/2000 | Horie et al. ................. 327/307 | EP | 1 005 129 A2 | 5/2000 |
| 6,088,205 A | 7/2000 | Neiger et al. | GB | 227930 | 1/1925 |
| 6,097,884 A | 8/2000 | Sugasawara ........... 395/500.05 | GB | 865775 | 4/1961 |
| 6,185,732 B1 | 2/2001 | Mann et al. ................. 717/128 | GB | 2 177 561 A | 6/1985 |
| 6,242,922 B1 | 6/2001 | Daum et al. ................. 324/520 | GB | 2 241 396 A | 8/1991 |
| 6,246,556 B1 | 6/2001 | Haun et al. ................... 361/42 | GB | 2 285 886 A | 7/1995 |
| 6,259,996 B1 | 7/2001 | Haun et al. ................... 702/58 | JP | 58 180960 | 10/1983 |
| 6,339,525 B1 | 1/2002 | Neiger et al. ................. 361/42 | WO | WO 97/30501 | 8/1997 |
| 6,362,628 B1 * | 3/2002 | Macbeth et al. ............. 324/536 | WO | WO 99/43065 | 8/1999 |
| 6,377,427 B1 | 4/2002 | Haun et al. ................... 361/42 | WO | WO 03/105303 A1 | 12/2003 |
| 6,414,829 B1 | 7/2002 | Haun et al. ................... 361/42 | | | |
| 6,456,471 B1 | 9/2002 | Haun et al. ................... 361/42 | | | |
| 6,477,021 B1 | 11/2002 | Haun et al. ................... 361/42 | | | |
| 6,525,918 B1 | 2/2003 | Alles et al. | | | |
| 6,532,424 B1 | 3/2003 | Haun et al. ................... 702/58 | | | |
| 6,567,250 B1 | 5/2003 | Haun et al. ................... 361/42 | | | |
| 6,570,392 B1 | 5/2003 | Macbeth et al. | | | |
| 6,577,138 B1 | 6/2003 | Zuercher et al. | | | |
| 6,590,754 B1 | 7/2003 | Macbeth | | | |
| 6,621,669 B1 | 9/2003 | Haun et al. ................... 361/42 | | | |
| 6,625,550 B1 | 9/2003 | Scott et al. ................... 702/58 | | | |
| 2001/0033469 A1 | 10/2001 | Macbeth et al. ............. 361/42 | | | |

FOREIGN PATENT DOCUMENTS

| | | |
|---|---|---|
| CA | 2256243 | 6/1999 |
| DE | 105100 | 6/1924 |
| DE | 195 15 067 | 2/1997 |
| DE | 196 01 884 A1 | 7/1997 |
| DE | 196 33 527 | 2/1998 |
| EP | 0 094 871 A1 | 5/1983 |
| EP | 0 615 327 A2 | 9/1994 |
| EP | 07255110 | 3/1995 |
| EP | 0 649 207 A1 | 4/1995 |
| EP | 0 712 193 | 5/1996 |
| EP | 0 748 021 A1 | 12/1996 |
| EP | 0 762 591 A2 | 3/1997 |
| EP | 0 802 602 A2 | 10/1997 |

OTHER PUBLICATIONS

Supplementary European Search Report dated Jan. 14, 2005 for application No. EP 99 93 5468.

Preliminary Search Report dated Jul. 16, 2004 for application No. 01/16901.

Preliminary Search Report dated Jul. 15, 2004 for application No. 00/16481.

Preliminary Search Report dated Jul. 15, 2004 for application No. 00/16479.

Preliminary Search Report dated Jul. 15, 2004 for application No. 00/04956.

JP 0158365 Japan.

Paolantonio, Antonio N., P.E., Directional Couplers, R.F. Design, pp. 40-49 (Sep./Oct. 1979).

Duenas, Alejandro J., Directional Coupler Design Graphs For Parallel Coupled Lines And Interdigitated 3 dB Couplers, RF Design, pp. 62-64 (Feb. 1986).

Joubert, Jean-Francois, Feasibility Of Main Service Ground-Fault Protection On The Electrical Service To Dwelling Units, Consultants Electro-Protection Ins., pp. 1-77 (Oct. 26, 1990).

Russell, B.D., Detection Of Arcing Faults On Distribution Feeders, Texas A & M Research Foundation, Final Report, pp. 1-B18 (Dec. 1982).

Supplementary European Search Report dated Feb. 25, 2005 for application No. EP 99 90 5523.

* cited by examiner

Store_Half_Cycle_Results

LOAD RECOGNITION AND SERIES ARC DETECTION USING BANDPASS FILTER SIGNATURES

CROSS-REFERENCE TO RELATED APPLICATION

This is a continuation-in-part of U.S. patent application Ser. No. 10/107,621, filed Mar. 27, 2002 now U.S. Pat. No. 7,068,480, entitled "Arc Detection Using Load Recognition, Harmonic Content and Broadband Noise", which is a continuation-in-part of U.S. patent application Ser. No. 09/981,603, filed Oct. 17, 2001, entitled "Arc Fault Circuit Interrupter System".

FIELD OF THE INVENTION

The present invention relates to the protection of electrical circuits and, more particularly, to the detection of electrical faults of the type known as arcing faults in an electrical circuit.

BACKGROUND OF THE INVENTION

The electrical systems in residential, commercial and industrial applications usually include a panelboard for receiving electrical power from a utility source. The power is then routed through protection devices to designated branch circuits supplying one or more loads. These overcurrent devices are typically circuit interrupters such as circuit breakers and fuses which are designed to interrupt the electrical current if the limits of the conductors supplying the loads are surpassed.

Circuit breakers are a preferred type of circuit interrupter because a resetting mechanism allows their reuse. Typically, circuit breakers interrupt an electric circuit due to a disconnect or trip condition such as a current overload or ground fault. The current overload condition results when a current exceeds the continuous rating of the breaker for a time interval determined by the trip current. A ground fault trip condition is created by an imbalance of currents flowing between a line conductor and a neutral conductor which could be caused by a leakage current or an arcing fault to ground.

Arcing faults are commonly defined as current through ionized gas between two ends of a broken conductor or at a faulty contact or connector ("series" arcs), or, between two conductors supplying a load, or between a conductor and ground ("parallel" arcs). However, arcing faults may not cause a conventional circuit breaker to trip. Arcing fault current levels may be reduced by branch or load impedance to a level below the trip curve settings of the circuit breaker. In addition, an arcing fault which does not contact a grounded conductor or person will not trip a ground fault protector.

There are many conditions that may cause an arcing fault. For example, corroded, worn or aged wiring, connectors, contacts or insulation, loose connections, wiring damaged by nails or staples through the insulation, and electrical stress caused by repeated overloading, lightning strikes, etc. These faults may damage the conductor insulation and/or cause the conductor to reach an unacceptable temperature.

The present invention concerns detection of low current series arcs that occur within the normal operating range of household appliances and/or low current series arc fault detection that is within the handle rating of the protection device (e.g., a household circuit breaker).

U.S. Pat. No. 6,008,973 (commonly assigned) based largely on slope changes in the load current and does not look at specific sub harmonic, broadband noise content and/or utilize load recognition. In contrast, this invention uses sub harmonic content, broadband noise and load recognition to set thresholds and select arc signatures.

In our above-referenced application (pending U.S. patent application Ser. No. 10/107,621, filed Mar. 27, 2002) frequency was monitored at half cycle intervals for broadband noise, primarily in 33 KHz and 58 KHz bands. We have discovered that certain load types, such as a light dimmer load, have certain high frequency characteristics which can be used to develop algorithms to detect, for example, approximately what phase angle the light dimmer is set at and to use the appropriate arcing algorithms to detect arcing for that particular dimmer setting. We have found that the high frequency component of a typical light dimmer wave form will occur primarily on the rising edge of the current wave form. During arcing, noise is not localized to the rising edge of the current waveform, however. Therefore, this characteristic can be used to better distinguish arcing from normal operating noise. Also, in some load types, during arcing conditions, noise is present only where the current is non-zero; however, during arcing, currents are zero around the voltage zero crossings. High frequency noise is therefore essentially zero at these areas of the wave form. We have found that this generally holds true for any arcing in any type of load.

Furthermore, in the present invention, we have discovered that monitoring high frequency noise in a 20 KHz band at ⅛ line cycle intervals may be used to obtain improved load recognition using arc detection methods and apparatus described in the above-referenced parent applications.

The invention may be applied to residential, commercial, industrial applications for circuit protection against series arc faults.

OBJECTS AND SUMMARY OF THE INVENTION

It is an object of the present invention to provide an arc fault detection system and method which reliably detects arc fault conditions which may be ignored by conventional circuit interrupters.

Another object of the invention is to provide an arc fault detection system which utilizes a minimum number of highly reliable electronic signal processing components, such as a microcontroller, to perform most of the signal processing and analyzing functions, so as to be relatively simple and yet highly reliable in operation.

Other and further objects and advantages of the invention will be apparent to those skilled in the art from the present specification taken with the accompanying drawings and appended claims.

In accordance with one aspect of the invention, a method of determining whether arcing is present in an electrical circuit comprises sensing a change in current in the circuit and developing a corresponding input signal, analyzing the input signal to determine the presence of broadband noise in a predetermined range of frequencies including a 20 KHz band, and producing a corresponding output signal, and processing the input signal and the output signal in a predetermined fashion to determine whether an arcing fault is present in the circuit, the processing including determining a type of load connected to the electrical circuit, based upon the input signal and the output signal.

In accordance with another aspect of the invention, a system for determining whether arcing is present in an electrical circuit comprises a sensor for sensing an alternating current in the circuit and developing a corresponding sensor signal, a circuit for analyzing the sensor signal to determine the presence of broadband noise in a predetermined range of frequencies, and producing a corresponding output signal, and a controller for processing the sensor signal and the output signal to determine load current characteristics and to determine, using the load current characteristics and the presence of broadband noise, a type of load connected to the electrical circuit and whether an arcing fault is present in the circuit, said circuit for analyzing including a circuit for detecting high frequency noise in a 20 KHz frequency band for each ⅛ cycle of said alternating current.

In accordance with another aspect of the invention, there is provided a controller for a system for determining whether arcing is present in an electrical circuit in response to input signals, the input signals corresponding to an alternating current in the circuit and to the presence of broadband noise in a predetermined range of frequencies including 20 KHz frequency band, the controller comprising a plurality of counters, means for incrementing one or more of the plurality of counters in accordance with the input signals and means for periodically determining a type of load connected to the electrical circuit and whether an arcing fault is present using at least the states of one or more of the plurality counters, and a means for monitoring high frequency wire in said 20 KHz band for each ⅛ cycle of said alternating current.

In accordance with another aspect of the invention, there is provided a method of determining whether arcing is present in an electrical circuit in response to input signals, the input signals corresponding to an alternating current in the circuit and to the presence of broadband noise in a predetermined range of frequencies in the circuit including a 20 KHz band, the method comprises incrementing one or more of a plurality of counters in accordance with the input signals, periodically determining a type of load connected to the electrical circuit and whether an arcing fault is present using the states of one or more of the plurality of counters, and monitoring high frequency noise in said 20 KHz band for each ⅛ cycle of said alternating current.

DETAILED DESCRIPTION OF THE ILLUSTRATED EMBODIMENT

Figure 1A:
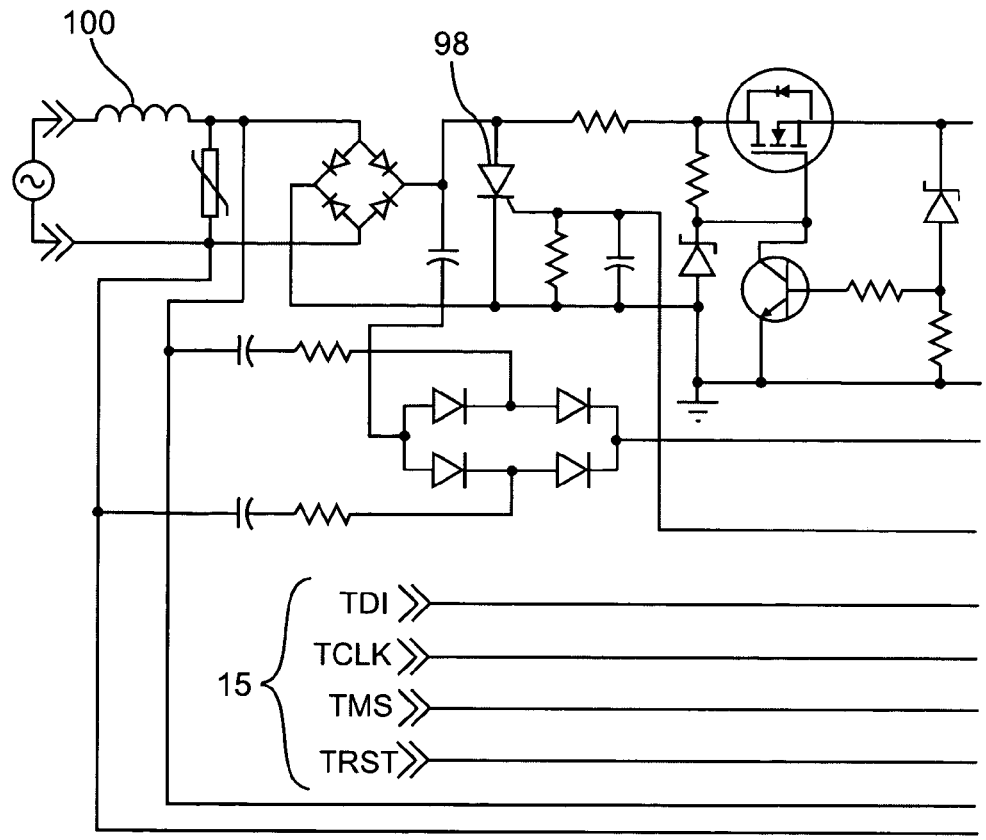
FIGS. 1a and 1b form a circuit schematic of an arc fault circuit interrupter system in accordance with the invention.
Figure 1A:
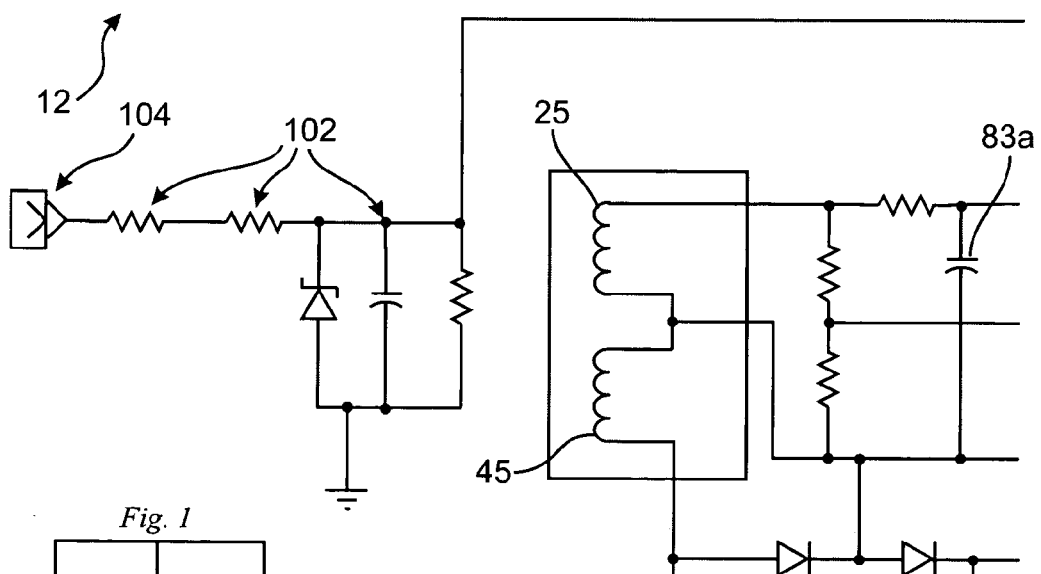
Figure 1B:
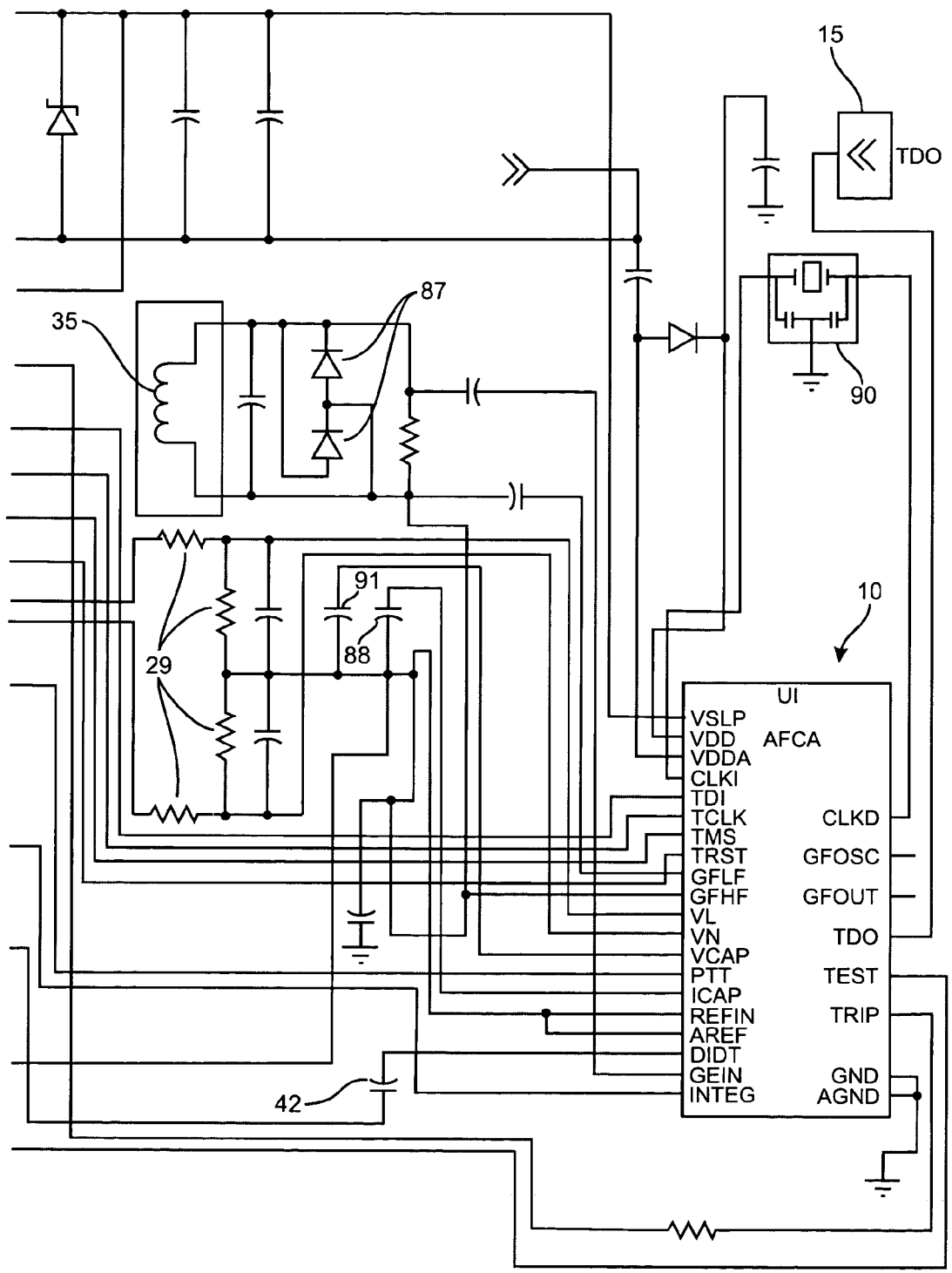

This invention pertains to the use of a system on chip solution for arc fault detection primarily for use in circuit breakers or electrical outlet receptacles, or other electrical devices, typically but not limited to the 15 or 20 ampere size. Referring to FIGS. 1a and 1b, this microchip 10, when incorporated on an electronic printed wiring board 12 with a minimum of external components, provides arc fault detection and tripping of the host wiring device.

Figure 2:
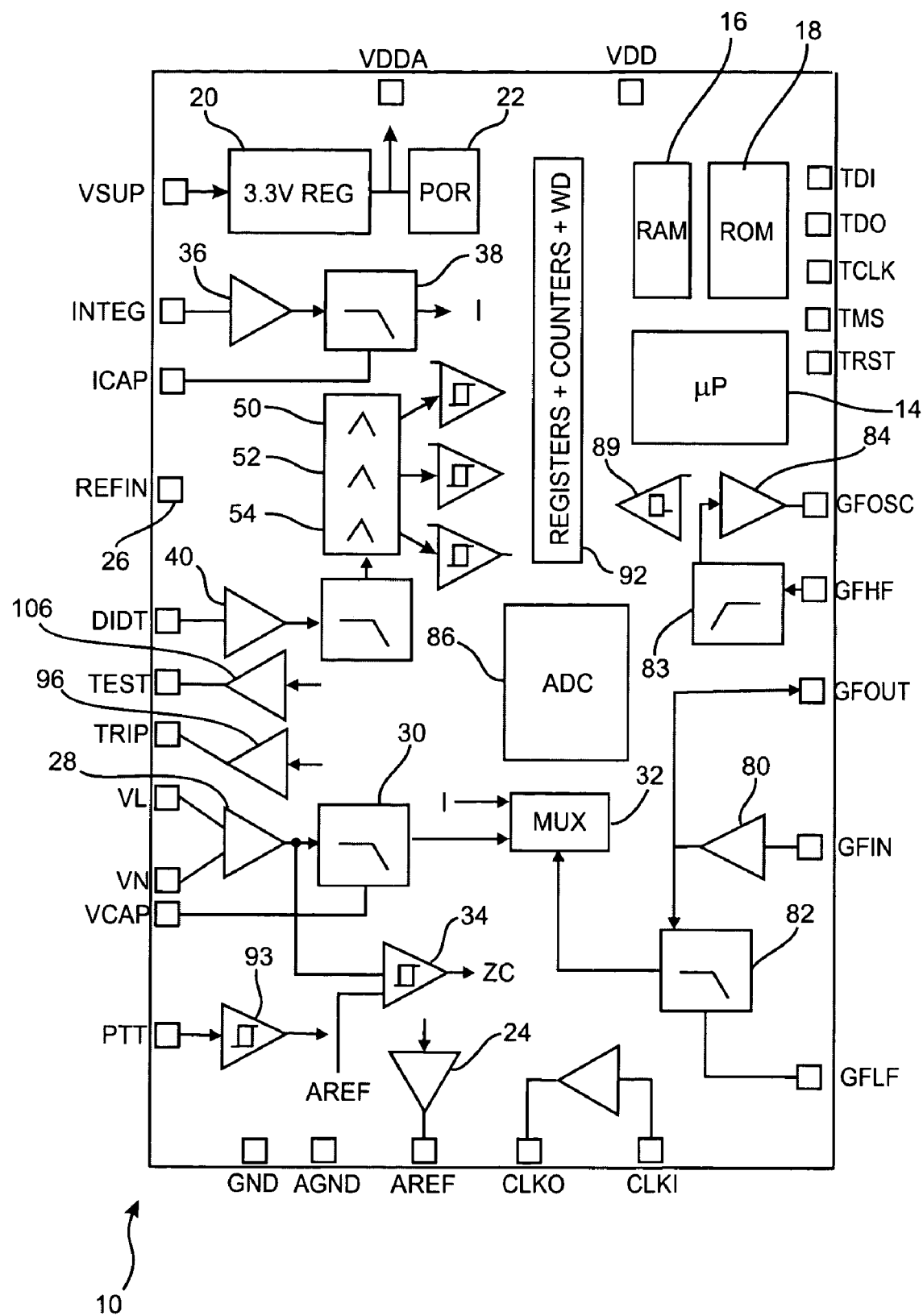
FIG. 2 is a functional diagram showing further details of an application specific integrated circuit chip which forms a part of a system of FIG. 1.

The system on chip is an application specific integrated circuit which combines analog and digital signal processing on a single microchip. A block diagram is shown in FIG. 2.

The "system on chip" 10 monitors line voltage and current in the host device and analyzes them for the presence of an arc fault. If certain arc detection criteria are met as determined by an arcing algorithm embedded within the software of a microcontroller's 14 memory 18, the chip signals an external SCR98 causing it to disconnect the device from the load.

The ASIC generally includes a processor or microcontroller 14, memories, amplifier stages, filters, A/D converter, analog multiplexer, a voltage regulator and power on reset circuit. The tasks of the ASIC are: measure line voltage, detect voltage zero crossings, measure 60 Hz line current, measure ground fault current, detect ground loops (grounded neutral) in neutral line, detect high frequency components of line current, provide voltage regulation for all ASIC circuits, detect presence of a signal to commence self test, generate a self test high frequency current source, provide under voltage reset (POR) for the microcontroller, provide a trip signal to fire a trip solenoid driver, provide a watchdog to reset the microcontroller, and make a trip decision based on embedded code in the microcontroller.

The ASIC can operate in two different modes:

The "normal" mode corresponds to the mode where the processor 14 is the master. In normal mode, the microprocessor controls the data conversion rate (A-to-D), counters, interruptions and data memories. The microprocessor executes code stored in a ROM memory. Moreover, the microprocessor controls the activity of all analog blocks by forcing "power down" signal in order to limit the power dissipation. This mode is the normal operation mode of the ASIC.

The "slave" mode corresponds to the mode where the processor 14 is the slave and is controlled by a standard communication channel (e.g., a JTAG) interface or port 15 (see FIGS. 1a and 1b). Two main operations can be done in this mode using the JTAG interface 15: debug mode, and register values and data transfer. The JTAG port can be used to couple a personal computer (PC) or other external processor to the ASIC, using the processor 14 of the ASIC as a slave processor. This permits interrogation of the ASIC counters, registers, etc. as well as rewriting to memories, registers, etc. of the ASIC. The JTAG ports 15 include data in/out ports (TDI, TDO), and reset (TRST), clock (TCLK) and mode select (TMS) ports.

The processor 14, in one embodiment, is the ARM7TDMI from ARM company. The ARM has a boundary scan circuit around its interface which is used for production test or for connection to an in-circuit emulator (ICE) interface (i.e., the JTAG) for system and software debugging. The JTAG interface is accessible via the pins TDI, TDO, TMS, TCK and TRST and behaves as specified in the JTAG specification.

The processor is 32 bits wide and has a CPU frequency of 12 MHz. An external resonator 90 (FIG. 1b) has a frequency of 24 MHz which is divided by two for the CPU. The microprocessor analyzes the current, ground fault and di/dt signals and by means of an arc detection algorithm makes a trip decision, using the presence of broadband noise and the current signature and rise time (di/dt). One such algorithm is described in U.S. Pat. No. 6,259,996, issued Jul. 10, 2001 to which reference is invited. While the line voltage is fed to the microprocessor, it may be optionally used by the algorithm to effect various levels of arc detection as dictated by the embedded software. The microprocessor uses the zero crossing signal to synchronize the arc detection algorithm with line voltage.

There are different clock domains in the ASIC: A clock for the ARM, the bus controller and the memories. The microprocessor clock frequency is 12 MHz. Clocks for the peripherals (counters, watchdog, ADC, BP filters) are 4 MHz, 1 MHz and 250 KHz frequencies. These clocks are fixed and derived from the ARM clocks.

There are two memory domains. The program memory, which contains the software for the ARM operation, the program memory space contains a 10 kb ROM (2560 words of 32 bits), and the program memory start address is 0000:0000hex. The data memory 16 contains the program data and consists of two RAMs of 128 bytes×16 bits for a total of 512 bytes. The memory access can be 32 bits or 16 bits wide. The ARM selects the access mode. The data memory start address is 0004:0000hex. In addition to the memories, the processor can also access registers. The register memory start address is 0008:0000hex.

The various functional blocks (see FIG. 2) and their respective operation is described briefly below:

A 3.3V regulator 20 provides a finely regulated DC power source for use by the analog and digital sections of the chip. The input to the chip need only be roughly regulated to within coarse limits, for example 4 to 7 volts.

The POR or power on reset circuit 22 senses the chip's regulated voltage supply and holds the microcontroller in a reset state if the voltage is below a safe operating limit.

The analog reference circuit (AREF) 24 provides a reference point for the input signals at the midpoint of the analog power supply to allow the amplified signals to swing both positive and negative. The AREF is externally connected to the REFIN pin 26.

A V1/Vn differential amplifier 28 differentially measures line voltage at the terminals of the host device via an externally located voltage divider 29 (FIG. 1b). The voltage signal is low pass filtered as shown at the low pass filter block 30 to remove high frequency noise or harmonics and to provide anti-aliasing. The filtered signal is sent to a first channel of a multiplexer 32 and also to the input of a zero crossing detector 34. The output voltage at VCAP pin and an external capacitor 91 (FIG. 1b) provides an anti-aliasing low-pass filter (LPF) for the A/D converter 86. The typical differential input range at the inputs is +/−0.65V.

A comparator 34 at the output of the line voltage differential amplifier 28 detects zero crossings (ZC) in the line voltage for use in synchronizing an arc detection algorithm.

An amplifier 36 at the INTEG input amplifies the externally integrated output of a di/dt sensor before it is lowpass filtered 38 for anti-aliasing and sent to a second channel of the multiplexer 32 previously referenced.

The output of a di/dt sensor 25 (see FIG. 1) monitoring line current through the host device is connected to the input of a di/dt amplifier 40 after first being high pass filtered by filter capacitors 42 (FIG. 1b) to remove the 60 Hz component. The di/dt signal is amplified at amplifier 40 and sent to the input of three bandpass filters 50, 52, 54. Broadband noise in the 10 KHz to 100 KHz range appearing at the DIDT input is one indicator of the presence of arcing.

Figure 3:
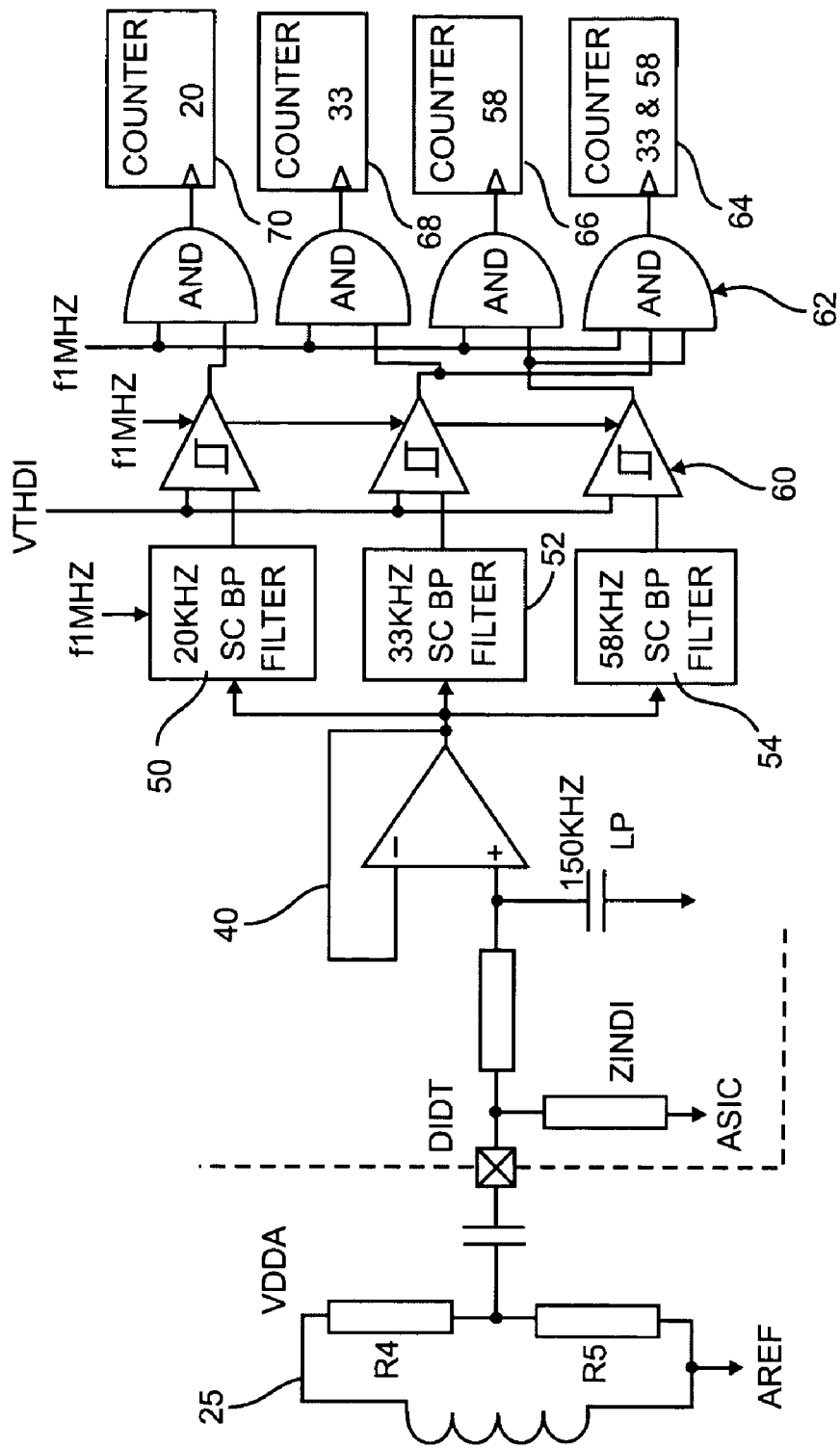
FIG. 3 is a functional block diagram illustrating operation of a digital circuit portion of the chip of FIG. 2.

FIG. 3 shows a more detailed block diagram of the di/dt sensing system. Three switched cap (SC) bandpass filters (BPF) 50, 52, 54 set respectively at 20, 33 and 58 KHz, filter the di/dt signal to determine if there is broadband noise in the line current. The output of the filters is monitored by a set of comparators 60 whose outputs change state when a predetermined threshold is exceeded. The microprocessor 14 (FIG. 2) monitors the state of each filter's comparator individually and also the logically ANDed output at AND gates 62 of the 33 and 58 KHz filters to determine the presence of broadband noise. The comparator 60 outputs and the AND gates 62 are synchronized by the same clock (f=1 MHz) as the switched capacitor bandpass filters 50, 52 54. It should be noted that the ANDing of the comparator outputs with the clock insures that the components of high frequency in the passbands of both the 33 KHz and 58 KHz filters must be simultaneously present and of sufficient amplitude in order to be considered broadband noise and therefore be counted by the 33/58 counter. Separate counters are provided for future use, for counting the components in the passbands of the 20 KHz, 33 KHz and 58 KHz BPF's, respectively.

The ASIC provides an amplification of the di/dt input signal and performs analog signal processing. As described above, the signal going through three independent switched-cap bandpass filters (BP) (20, 33 and 58 KHz) is compared to a fixed threshold reference voltage in both directions (positive and negative). The 20 KHz BP has a typical quality factor Q of 4. Both 33 and 58 KHz BP have typical Q of 8. The outputs of the comparators control separate counters. The ANDed boolean combination of 33 and 58 KHz BP comparator outputs controls a $4^{th}$ counter as shown in FIG. 3. All comparator outputs are synchronized on the switched-cap clock (1 MHz) and are stable during each period of 1 µs. The counters can be reset or disable by software. An anti-aliasing filter is placed in the first stage. The cut-off frequency is typically 150 KHz. The sampling clock frequency of bandpass filters is $F_{1MHz}$. Clamping anti-parallel diodes are placed between AREF and DIDT pins internal to the ASIC.

The Z-domain function of the switched-cap bandpass filters can be described by the following expression:

$$Y_i = a(X_i - X_{i-1}) - b\, Y_{i-1} - c\, Y_{i-2}$$

Where $X_i$ and $Y_i$ are, respectively, the $i^{th}$ samples of input and output voltages and a, b and c are the filter coefficients.

| Coefficient of normalized BP | 20 KHz | 33 KHz | 58 KHz |
|---|---|---|---|
| a | 0.031 | 0.026 | 0.047 |
| b | −1.953 | −1.932 | −1.825 |
| c | 0.969 | 0.974 | 0.952 |

The output of a ground fault sensing transformer 35 (FIG. 1*b*) is connected to the input of a GFIN amplifier 80 (FIG. 2), which has a high gain to amplify the small output from the sensor. The ground fault signal is amplified and lowpass filtered (82) (FIG. 2) for anti-aliasing before being fed to the third channel of the multiplexer 32 (FIG. 2).

Figure 4:
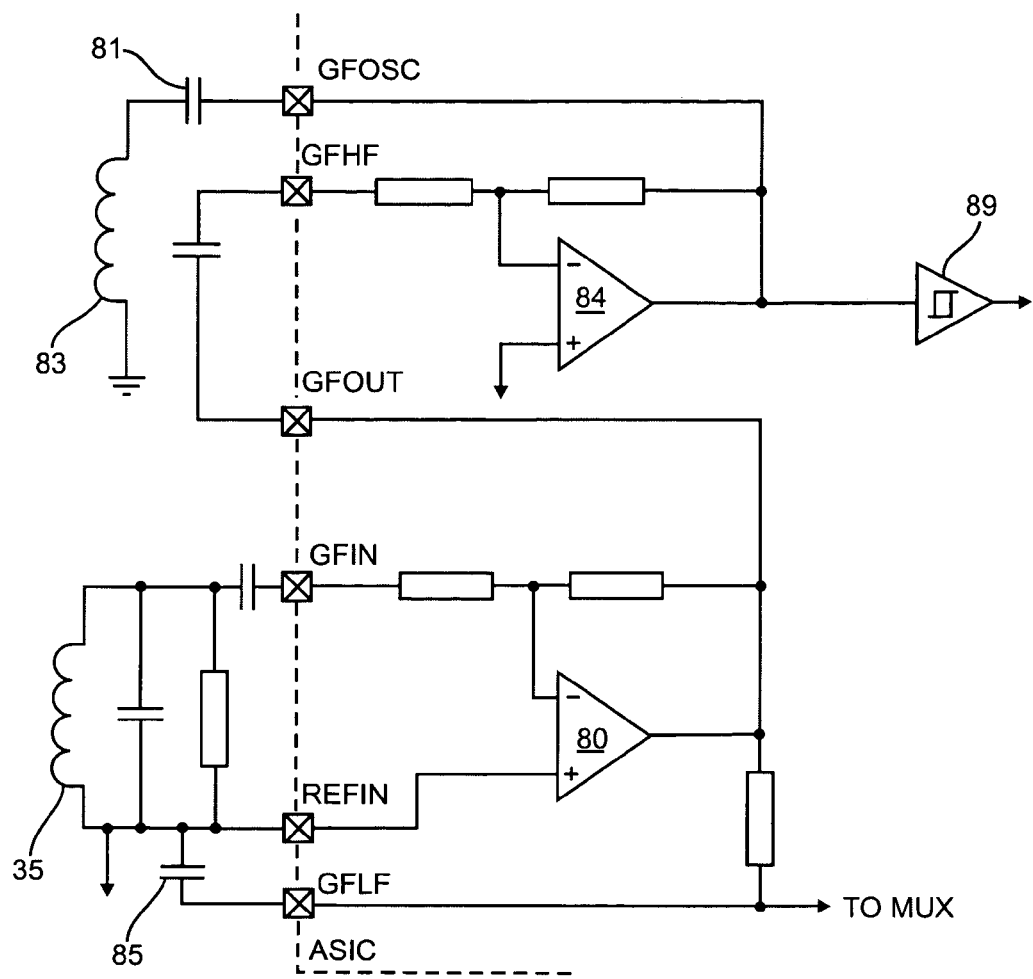
FIG. 4 is a circuit schematic of a signal processing circuit which forms a part of the chip of FIG. 1b.

Referring also to FIG. 4, this circuit performs an amplification and anti-aliasing low pass (LP) filtering of the ground fault (GF) input voltage before A-to-D conversion and provides high pass (HP) filtering and amplification for the grounded neutral detection at pin GFOSC. The first gain stage 80 is a current-to-voltage converter providing signal for both low and high pass filters 82, 83 (FIG. 2). The 3 dB bandwidth of the high pass filter will be typical 15 KHz. The LP and HP filters are made by internal resistors and external capacitors 81 and 85 respectively. Clamping anti-parallel diodes 87 (see FIG. 1*b*) are placed between AREF and GFIN pins for transient protection.

The chip 10 has provision for personnel level ground fault protection when provided with a grounded neutral sensing transformer 83 (FIG. 4) as well as the 5 mA ground fault transformer 35 (FIG. 4). To make this feature functional, the output GFOUT may be coupled by means of a capacitor 81 to the input of GFHF. GFOSC is then capacitively coupled to the winding of the neutral sensing transformer 83. When thus connected, this forms a dormant oscillator neutral detection system, including second opamp 84 and comparator 89. The function of the second amplifier 84 at GFHF is to provide the total loop gain necessary to put the dormant oscillator into oscillation when a sufficiently low resistance grounded neutral condition exists.

The multiplexer 32 (FIG. 2) alternately selects between the three channel inputs, i.e., current, line voltage or ground fault and passes the selected signal to the input of an analog to digital (A/D) converter (ADC) 86 (FIG. 2). The analog to digital converter 86 is a single channel sigma delta converter which alternately digitizes the current, line voltage and ground fault signals for analysis by the microprocessor.

The line current signal at ASIC pin INTEG is obtained by an external low-pass 30 filter 83*a* placed in the output of the di/dt coil 25 (FIG. 1*a*). The ASIC amplifies the INTEG signal. An anti-aliasing LP filter is obtained by an external capacitor 88 (FIG. 1*b*) placed at ICAP pin before A-to-D conversion stage.

The watchdog (WD) 92 monitors the operation of the ARM microprocessor 14. If the software does not reset the watchdog counter at periodic times, the watchdog generates a hard reset of the microprocessor. Alternately, it could be used to cause a trip condition. The watchdog is based on a 15 bit wide periodic counter which is driven by the 250 KHz clock. The counter is reset by software with the WDG_RST address. Writing a 1 on this address resets the counter. As noted, the watchdog must be reset only in a specific time window, otherwise a hard reset is generated. If the watchdog is reset before the counter reaches $2^{14}$, or if the counter is not reset before the counter reaches $2^{15}$, the watchdog reset is generated for the ARM and for the WD counter.

To allow the ARM to check the watchdog value, the MSB (bit 14) can be read and if the value is 1, the processor must reset the counter.

When the watchdog generates a reset, a specific register is set to indicate that a watchdog reset has occurred. This register value can be read even after the reset.

When a trip decision is reached, a trip signal buffer 96 latches and drives the gate of an SCR 98 of an external firing circuit (FIG. 1*a*). In order to conserve stored energy during the trip sequence, the microprocessor is halted and portions of the analog circuitry are disabled. The SCR 98 is connected in series with a trip coil 100. In the ON state, the SCR 98 causes the coil 100 to be momentarily shorted across the line to mechanically de-latch the contacts of the host device and to subsequently interrupt flow of current.

The push to test (PTT) circuit 102 monitors the status of a push to test (PTT) button 104. When the push to test button is depressed, line voltage is applied through an external voltage divider in circuit 102 to the PTT input of the chip 10. The circuit senses that a system test is being requested and signals the microprocessor to enter a test mode. The activation of the test button 104 (not part of the ASIC) is detected by the PTT comparator 93 (FIG. 2) as a voltage at a PTT (Push-to-Test) pin.

With the microprocessor in the test mode, test signal buffer 106 acts as a current source driving a test winding 45 (FIG. 1*a*) of the di/dt sensor with a sharply rising and falling edge square wave at each of the center frequencies of the bandpass filters, namely 20 KHz (when used), 33 KHz and 58 KHz in turn.

TABLE 1 below briefly describes each pin of the ASIC 10.

| Name | Type | Description |
|---|---|---|
| VSUP | Power | High positive ASIC supply voltage |
| VDDA | Power | Analog positive ASIC supply voltage and regulator output |
| VDD | Power | Digital positive ASIC supply voltage (input) |
| AGND | Power | Analog ground |
| GND | Power | Digital ground |
| INTEG | Analog | Input for Current measurement |
| ICAP | Analog | Input for LP filter |
| REFIN | Analog | Input sense of reference voltage |
| AREF | Analog | Analog reference output |
| DIDT | Analog | Input for DIDT measurement |
| TEST | Analog | Test output signal |
| TRIP | Analog | Trip output signal |
| VL | Analog | Input for voltage measurement |
| VN | Analog | Input for voltage measurement |
| VCAP | Analog | Input for LP filter |
| PTT | Analog | PTT Input signal |
| CLKI | Analog | Input clock of quartz |
| CLKO | Analog | Output clock of quartz |
| GFIN | Analog | Input signal for GF measurement |
| GFOUT | Analog | Output of gain stage |
| GFLF | Analog | Input for LP filter |
| GFHF | Analog | Input for HP filter |

-continued

| Name | Type | Description |
| --- | --- | --- |
| GFOSC | Analog | Output of GF dormant gain stage |
| TDI | Digital-in | Data in |
| TDO | Digital-out | Data out |
| TCLK | Digital-in | Clock in |
| TMS | Digital-in | Select in |
| TRST | Digital-in | Reset in (active low) |

Additional Operational Description

The ground fault detection feature's primary purpose is to detect arcing to ground, in the incipient stages of arcing, where a grounding conductor is in the proximity of the faulty line conductor. Such detection and tripping can clear arc faults before they develop into major events. As discussed earlier, by the use of appropriate ground fault and neutral sensing transformers, this feature can be used to provide personnel protection as well as arc to ground detection.

When the push to test button 104 is depressed, line voltage is applied to push to test circuit 102 in such a way as to cause ground fault current to flow through the ground fault sensing transformer 83 and simultaneously force the microcontroller 14 into the test mode as described previously. The microprocessor monitors the output of both the ground fault detection circuitry and the output of the bandpass filters (caused by the test buffer driving the test winding) to determine if the bandpass filter detection circuitry is functional. Only if counters 66 and 68 have sufficiently high counts and sufficiently high ground fault signal peaks are present, will a trip signal be given.

A calibration routine allows the microprocessor 14 to compensate for the offset voltages generated by each of the operational amplifiers in the line voltage, current and ground fault measurement circuits. Immediately following power up and at periodic intervals (to update the data, e.g., to compensate for thermal drift), the microprocessor initiates a calibration procedure. During this time period, the line voltage and current measurement circuits are internally disconnected from their respective input terminals and each of the operational amplifiers is connected in turn to analog reference voltage (AREF) 24. The respective offset voltages (one for each op amp) are then read by the microprocessor and their values are stored in memory. The stored offset voltages are subtracted from the measured signal values by the software. The ground fault offset is measured by internally shorting the first stage amplifier (80) gain setting resistors and reading the offset voltage on an external AC coupling capacitor directly from the input. The software subtracts this value from the measured signal value.

Residential type circuit breakers incorporating arc fault circuit protection require a very small printed wiring board with low power dissipation. Arc fault circuit interruption requires significant analog and digital signal processing in order to reliably distinguish between arc faults and electrically noisy loads, such as arcs from light switches and universal motors. In a previous embodiment, such processing was achieved using a separate analog ASIC (application specific integrated circuit) and a microcontroller.

The system on chip design provides a reduced package size, approximately 1/3 reduction, as well as a reduction in external components required. The combination of reduced parts and part placement results in a significant cost reduction and ease of assembly. Bandpass filter performance is more consistent, offset voltage correction is improved, test circuit performance is improved, and ground fault personnel protection can be provided.

Using load current, rate of rise of the load current (di/dt) and system line voltage, the invention detects series arcing conditions in household appliance cords and electrical wiring. Using load current, rate of rise of the load current (di/dt) and system line voltage inputs the method presented below will recognize the load if one is present, use the appropriate arc detection algorithms that match the load and determine if there are arcing signatures. When arcing signatures are detected, a trip signal is initiated and opens the circuit breaker, disabling the arcing source.

The described embodiment of the invention is for 15 A or 20 A household branch circuit breakers but the invention is not so limited.

We have found that series arc signatures are different with different types of loads in series with the arc. We have found that the best way to detect series arcing is to first categorize the signature of the load current and then look for arcing signatures for that type of load. We have found that most residential loads can be categorized, by their wave shape and phase relationship, into eight categories. We have designated these categories: "compressors," "computers," "computers and resistive," "brush motor," "light dimmer," "light dimmer and resistive," "variable speed motors" and "resistive." Even though these load type designations were used, others may be included or substituted, without departing from the invention.

We have achieved improved arc detection times and improved resistance to nuisance trips using the below-described technique. This technique is described hereinbelow in connection with a number of flowcharts briefly described above and which will be more fully described hereinbelow. In particular, in addition to the technique described in our above-referenced parent applications, we have found that the use of the high gain low queue factor 20 KHz bandpass filter divided into 1/8 line cycle increments offers additional improvement in some types of load. That is, using the high-resolution high frequency components at each 1/8 line cycle and looking for the presence of high frequency components at different locations of the line cycle, provides improved arc detection and resistance to nuisance tripping. Depending on the load type, the signature for the high frequency components will be different under normal load conditions, such as start up, and steady state conditions, from that under arcing conditions.

In particular, we have discovered with some loads such as a typical vacuum cleaner load, that a high gain low queue filter bandpass filter will have a constant non-zero output. However, during series arcing of such a load, the continuous filter output will go to zero near the voltage zero crossings when the arcing current is zero. During arcing, there will be no high frequency components when the currents are zero, which occur randomly in arcing events, whereas during normal running loads the high frequency components are generally more uniform. Thus, using a high gain, low queue filter and dividing the line cycle into multiple sections, we have found that improved arc detection can be achieved.

Figure 5A:
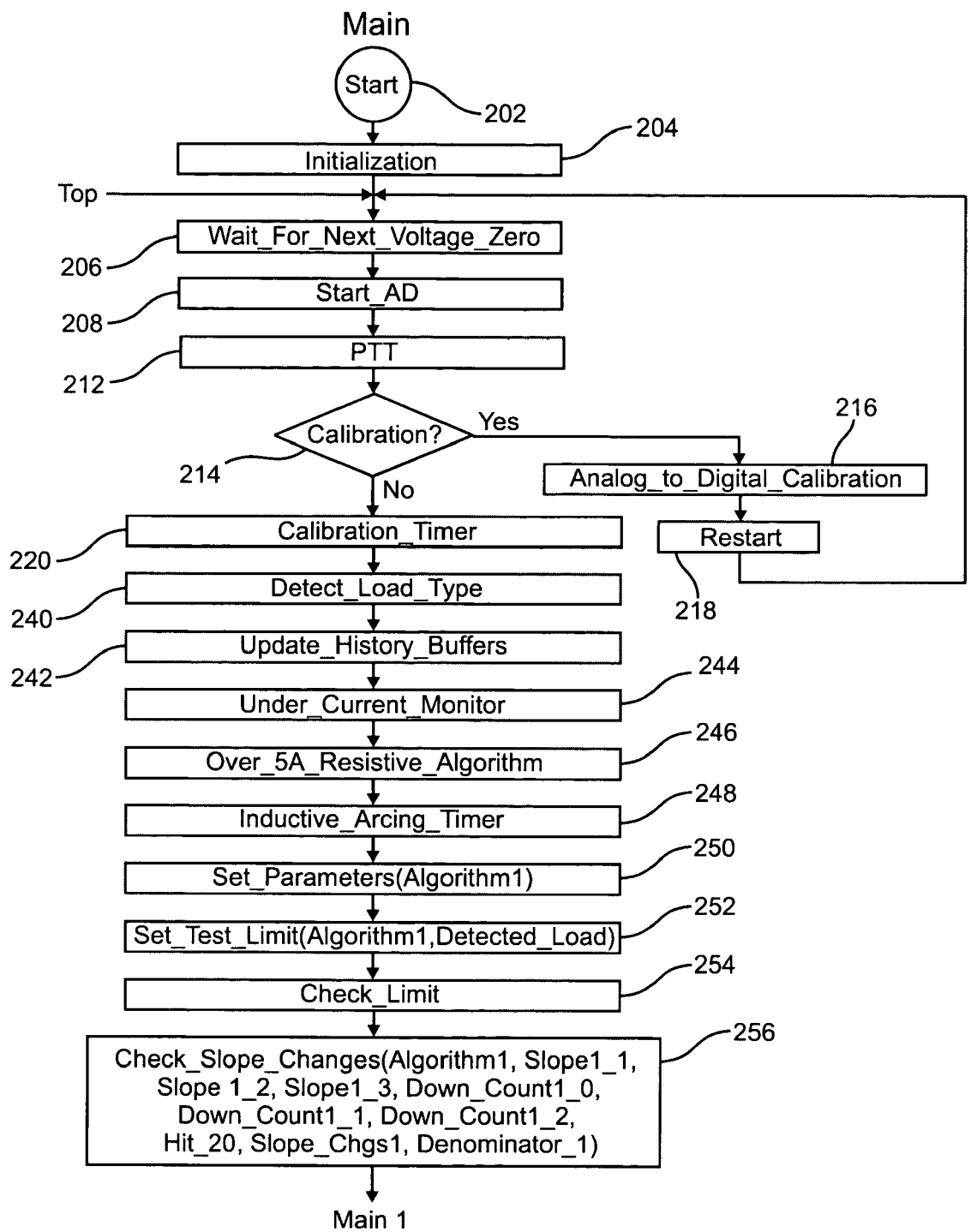
FIGS. 5A–5C are flowcharts showing operation of a main program sequence in accordance with the invention.
Figure 5B:
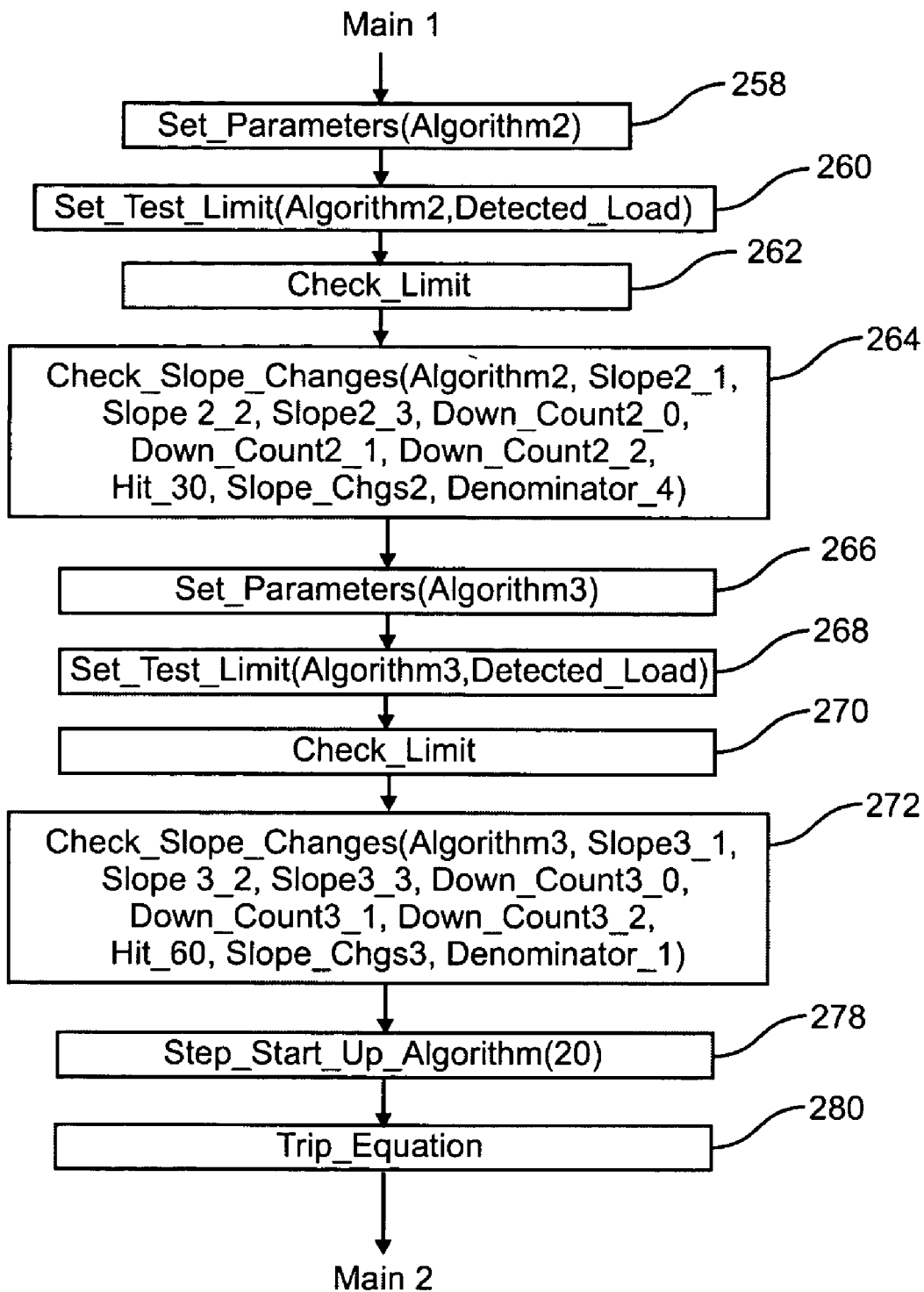
Figure 5C:
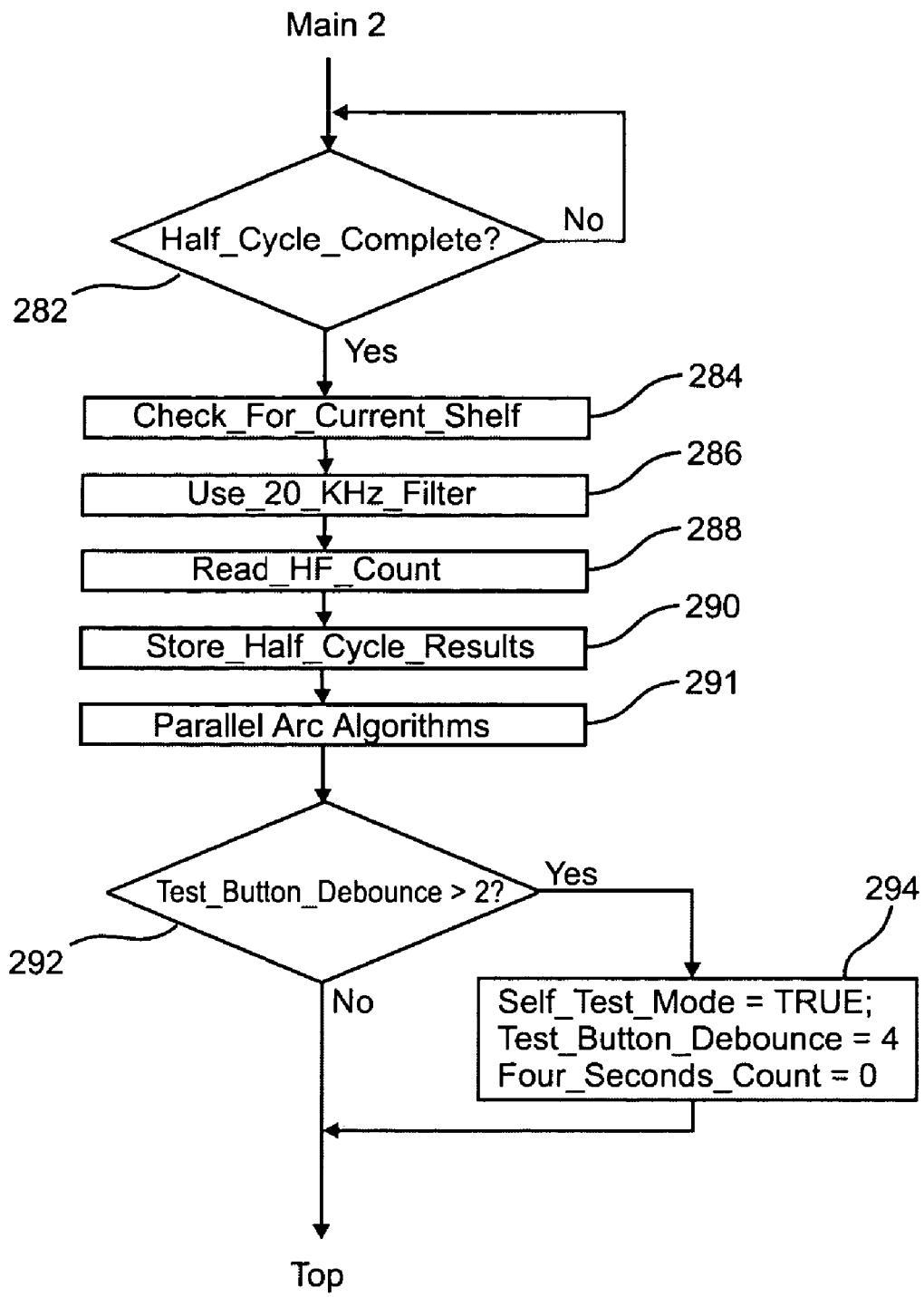

Referring now to FIGS. 5A–5C, a main program sequence at a start 202 initializes 204 the microprocessor or controller (see FIG. 6), and then waits 206 for the next zero voltage crossing of monitored current and then starts A/D conversion 208. A self test or push to test (PTT) mode 212 is then enabled which, if called for and successful, energizes a trip solenoid to trip a breaker.

In addition to the foregoing, the flowcharts briefly described above and more fully discussed hereinbelow offer some additional improvements over those disclosed in our above-referenced copending application (Ser. No. 10/107,621, filed Mar. 27, 2002). One aim in the present application was to improve code efficiency and also to recompile the coding and modules for use with an improved processor type. In the embodiment described hereinabove, the processor, may be of a type designated ARM7TDMI provided by the ARM Company (Advanced Reduced Instruction Set Computer (IRSC) Machine) which is essentially code provided for the ASIC vendor to permit the ASIC carry out the arc detection in accordance with the invention.

Referring now again to FIGS. 5A–5C, the main program sequence then sequences through a number of other modules, further details of which are shown in the following figures of drawing. Briefly, these include a detect load type module 240, shown in FIGS. 7A–7J, an update history buffers module 242, shown in FIG. 8 and an undercurrent monitor module 244, shown in FIG. 9. These are followed by an over 5 amp resistive algorithm module 246 shown in FIG. 10, an inductive arcing timer module 248 shown in FIG. 11, and a set parameters module 250 shown in FIG. 12. This latter module 250 and the following three modules 252, 254 and 256 shown respectively in FIG. 12 FIGS. 13A–13F, FIGS. 14A–14B and FIGS. 15A–15D are repeated three times for each of three separate algorithms which are designated algorithm 1, algorithm 2 and algorithm 3. In each of these algorithms, some of the parameters are changed somewhat as each of the modules are run. Accordingly, modules 258, 260, 262 and 264 are identical modules run with somewhat differing parameters for "algorithm 2" and similarly, modules 266, 268, 270 and 272 are the same modules, again run with somewhat different parameters for "algorithm 3."

Figure 16:
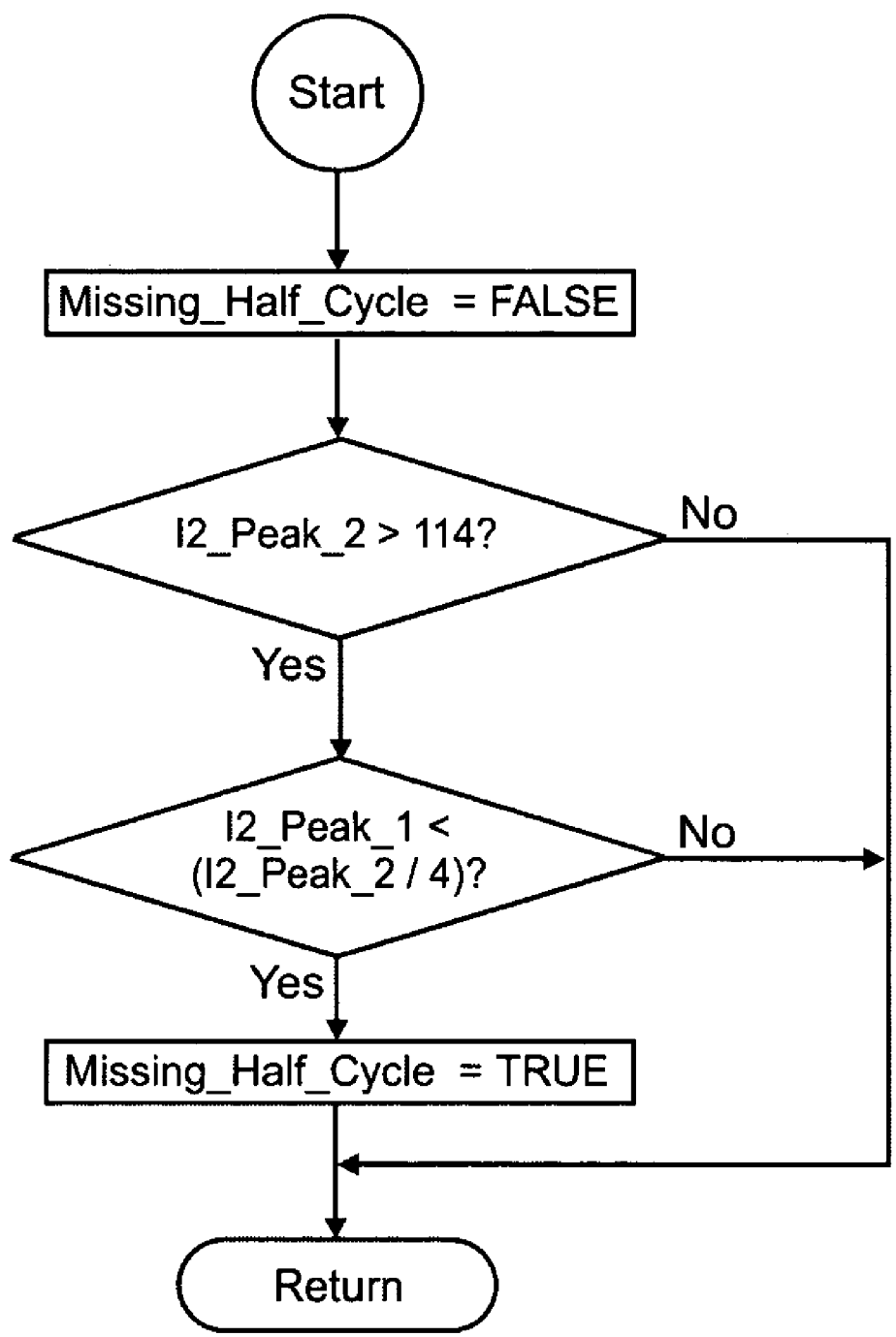
FIG. 16 is a flowchart showing operation of a missing half cycle check program module.
Figure 17A:
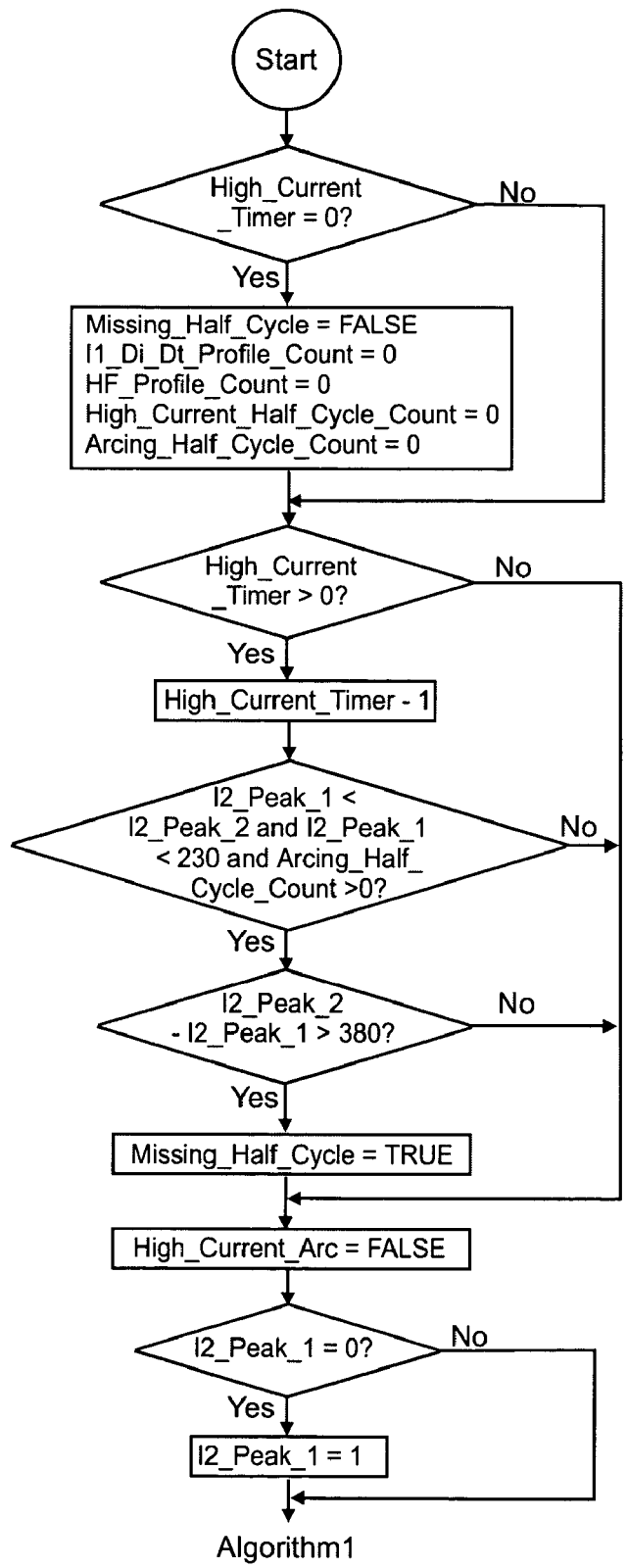
FIGS. 17A–17F show a flowchart showing operation of a parallel arc algorithms program module.
Figure 17B:
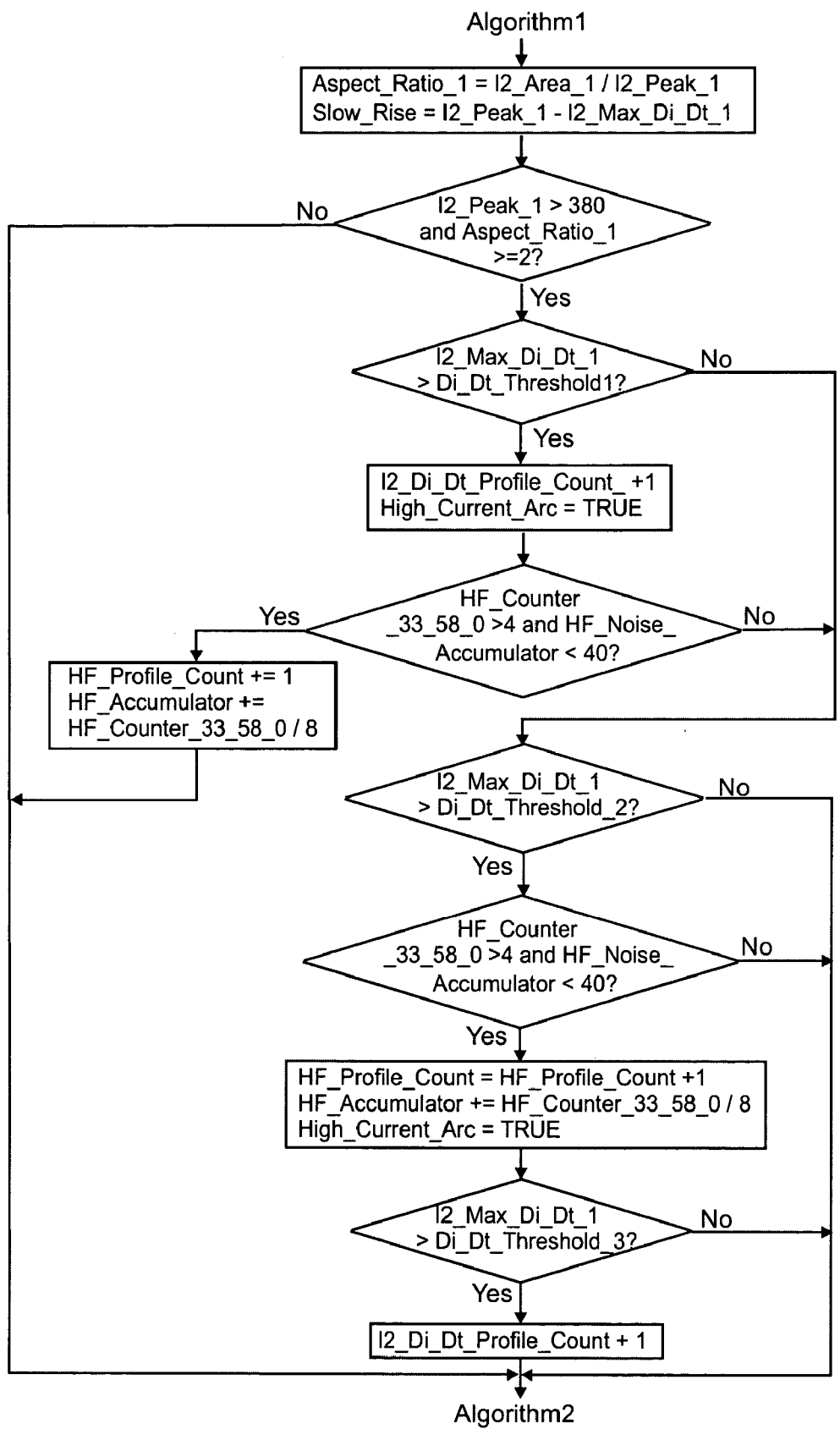
Figure 17C:
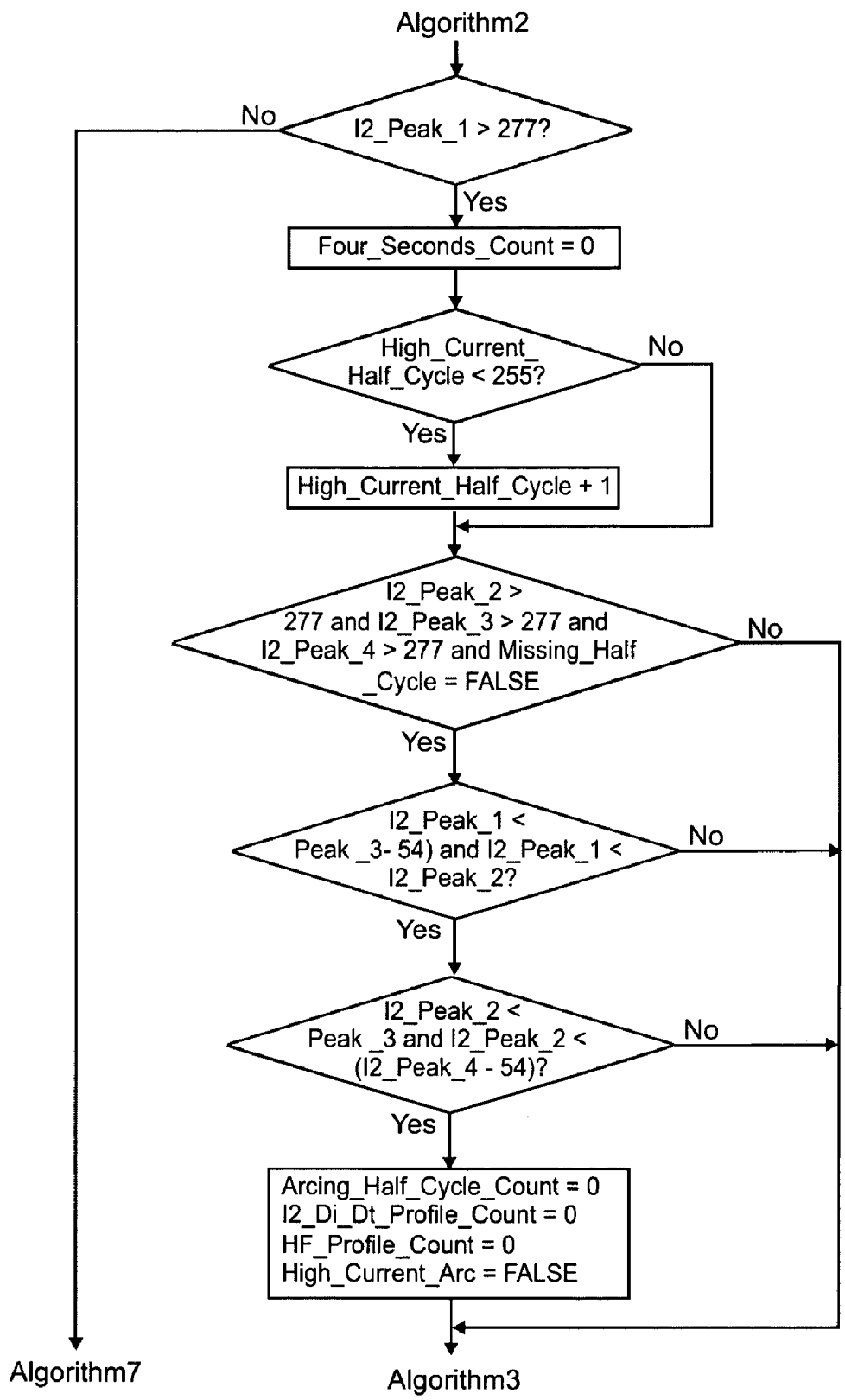
Figure 17D:
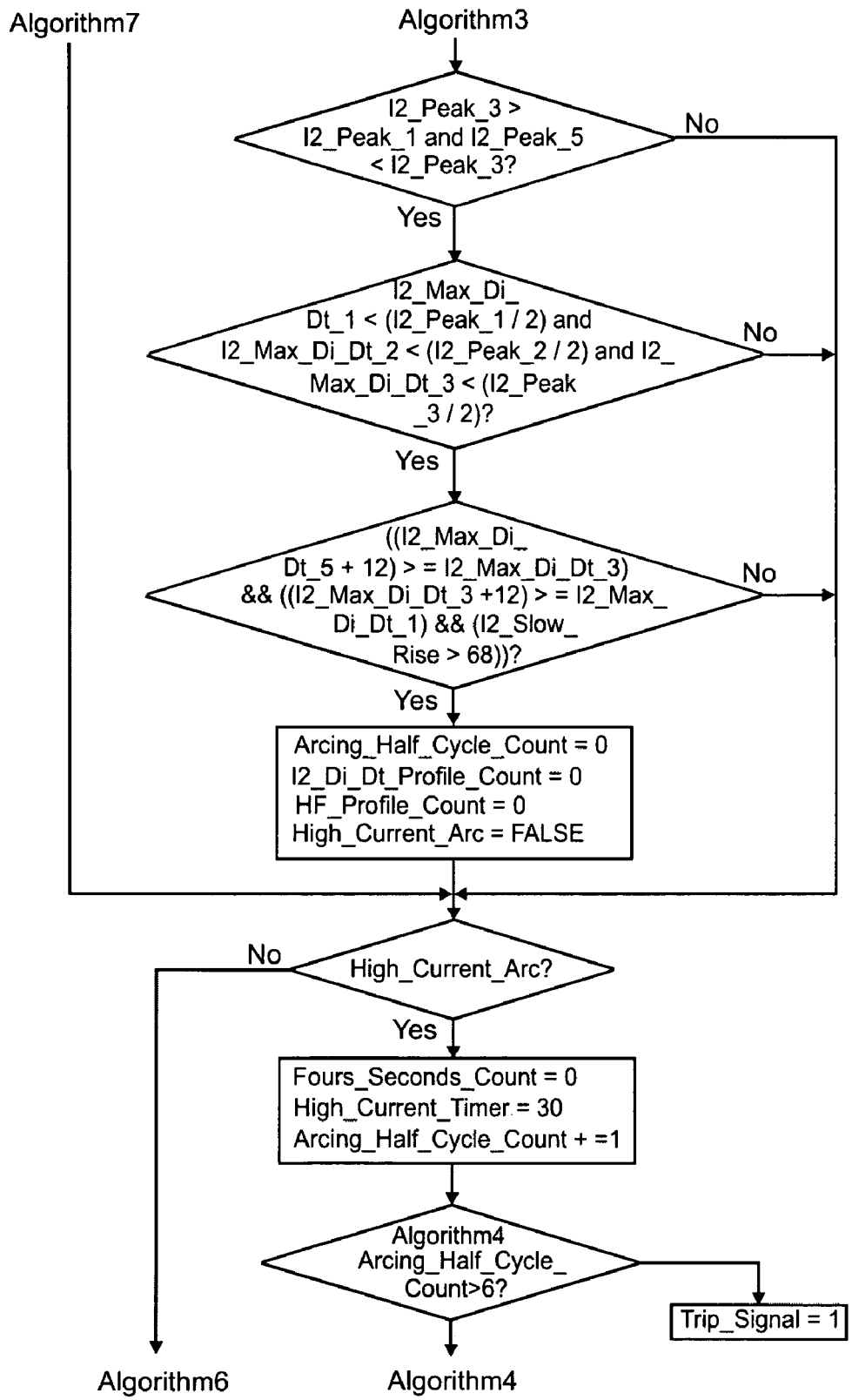
Figure 17E:
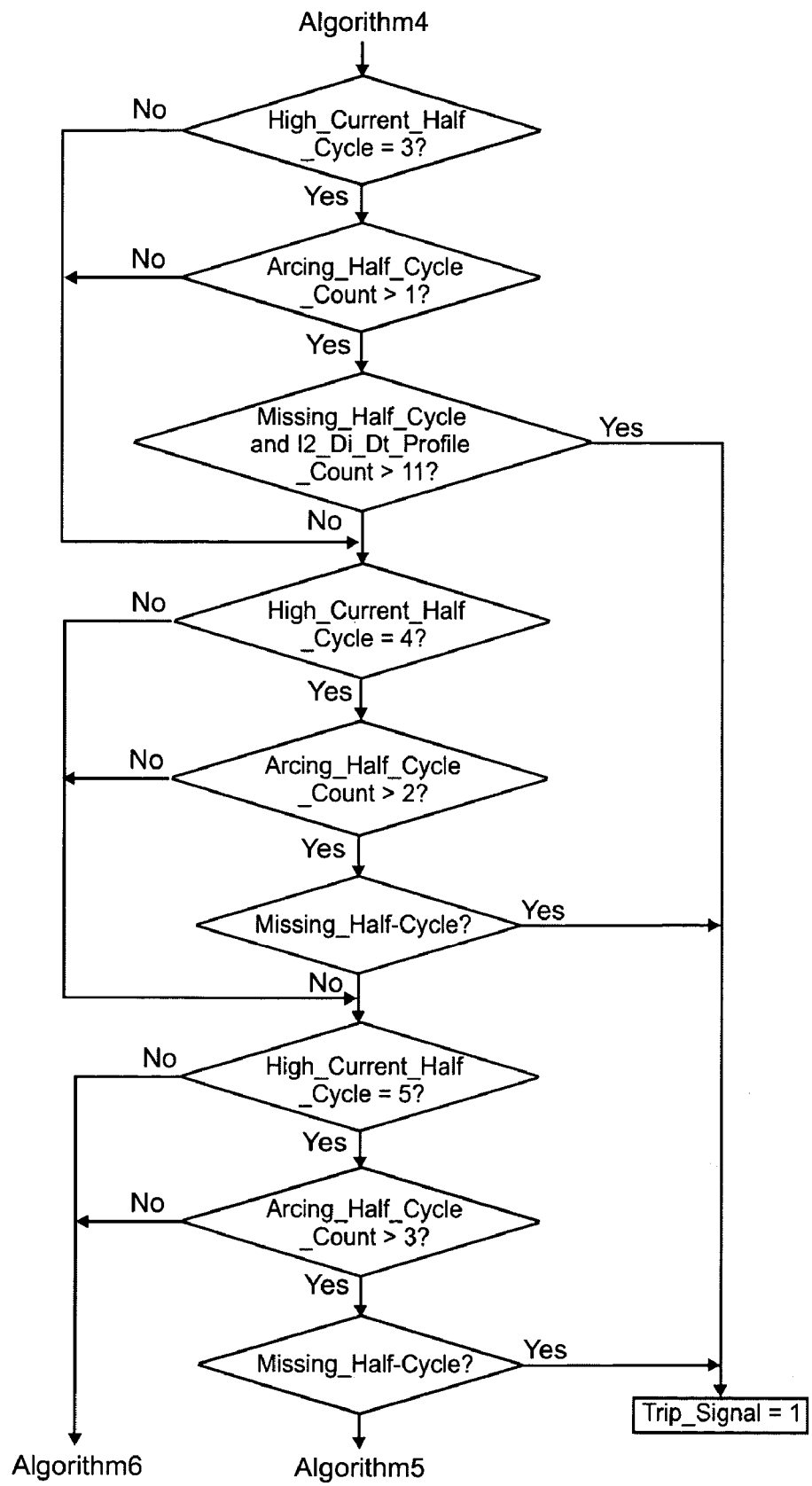
Figure 17F:
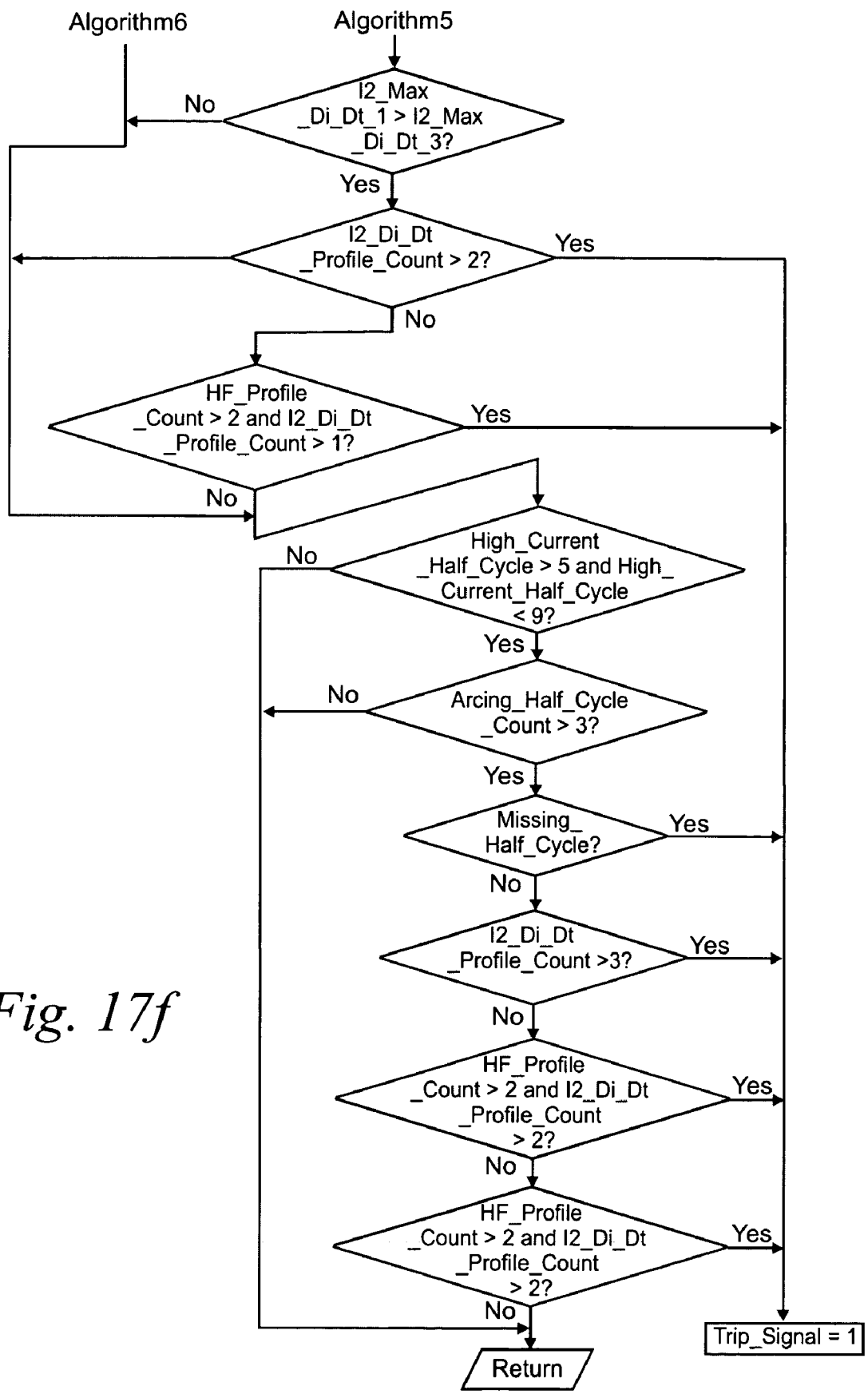

Next, a missing half cycle module 291 is shown in FIG. 16 and a parallel arc algorithms module 291 shown in FIGS. 17A–17F are run. This latter parallel arc algorithms module 291 is a so-called type B algorithm to test for parallel arcing in a manner more fully explained in our prior U.S. Pat. No. 6,259,996 accordingly, and referring briefly to FIGS. 13A–13F, the algorithms shown here are essentially similar to those shown in our above-referenced prior patent.

Figure 18:
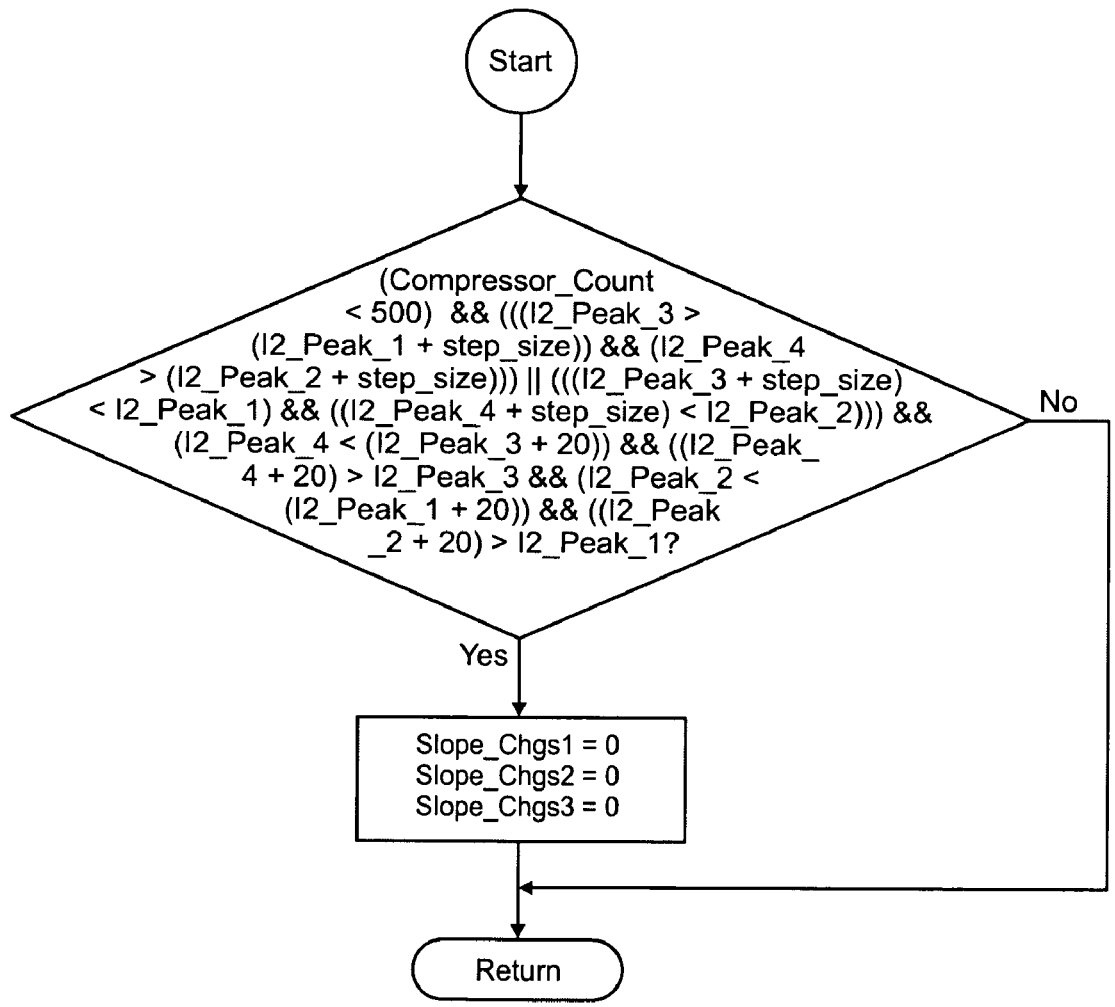
FIG. 18 is a flowchart showing operation of a step start up algorithms program module.

Following the parallel arc algorithms, start up algorithms 278 are performed as shown in FIG. 18. At this point, the trip equation is run at 280, as shown in FIGS. 19A–19J.

At 282, the program sequence checks for zero crossing to verify the half cycle is complete. Upon completion of the half cycle, the main sequence proceeds to a check for current shelf module 284 shown in FIGS. 20A–20B followed by a use 20 KHz filter module 286 shown in FIGS. 21A–21C. It is at this point that the 20 KHz filter is used in accordance with one aspect of the invention to monitor high frequency noise for each ⅛ line cycle as discussed above. The next module 288 reads the high frequency count from the 20 KHz filter as shown further in FIGS. 22A–22B, and the half cycle results are stored at module 290 shown in FIG. 23. A test button debounce register is read at 292 and if greater than 2, the self-test mode is set true, the test button debounce is set equal to 4 and the four seconds count register is set to zero at 294, whereupon the main sequence is ready to repeat from the top of FIG. 5A.

While the specific algorithms shown herein differ somewhat from those shown in the above-referenced parent application, the basic theory and manner of operation is the same, wherein the module looks at various peaks, areas and rise times, as well as various ratios of values from one sample to the next for over given groups of samples, as well as factors such as the change in peak position from one cycle to the next. All of these factors are used to increment or set a number of registers or counters in software for selecting an appropriate load type algorithm to be run later in the arc detection algorithms or trip equation of FIGS. 19A–19J.

Figure 6:
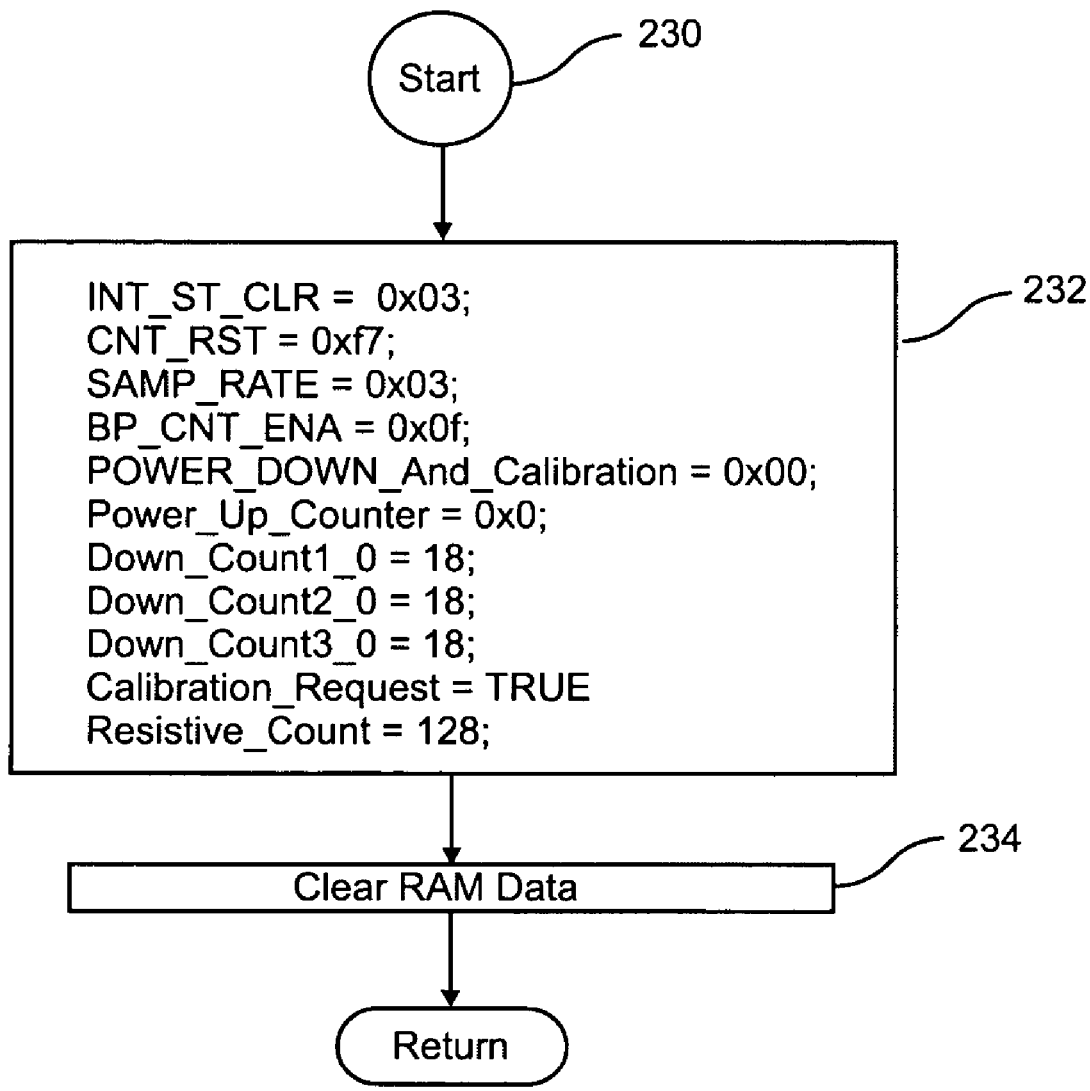
FIG. 6 is a flowchart showing operation of an initialization program module.

FIG. 6 shows the above-referenced initialization module 204 which includes a start 230, initialization of software counters/registers 233, clears RAM data, and goes to a return.

The designated load types in the present embodiment are compressor load, computer load, resistive computer load, resistive, inductive brush load, light dimmer, light dimmer resistive load and variable speed motor. Other load types or subgroupings of upload types based on the same or other criteria may be designated or utilized without departing from the invention.

In accordance with the described embodiment of the invention, the microcontroller or microprocessor implements a number of counters in software. These counters are incremented and decremented in accordance with the detect load type routine or module, to be described presently, as well as in accordance with other routines or modules, including an arc detection algorithm or "trip equation" to be described later. The controller then determines, based upon the states of various counters or subgroups of counters not only the load type, from among the types given above, but also whether arcing is present. As will be seen presently, a different algorithm or different subroutines or portions of algorithms are used for each kind of load, once the type of load has been determined, to determine whether arcing is occurring based upon the sensor inputs obtained as described above. Thus, a number of counters or registers are incremented and/or set in accordance with the incoming sensor signals. The states of these registers and/or counters are used in various algorithms or subroutines to determine not only the load type, but the occurrence of arcing of a type and/or sufficient magnitude to cause a trip signal to be given, so as to trip a circuit breaker to an open position. As will become apparent from the ensuing description, the method of the invention also selects one of the load types as a default. In the present embodiment, the resistive load type is the default selection in the event that none of the other load types is determined to be present by the detect load type routine of FIGS. 7A through 7J.

Figure 7A:
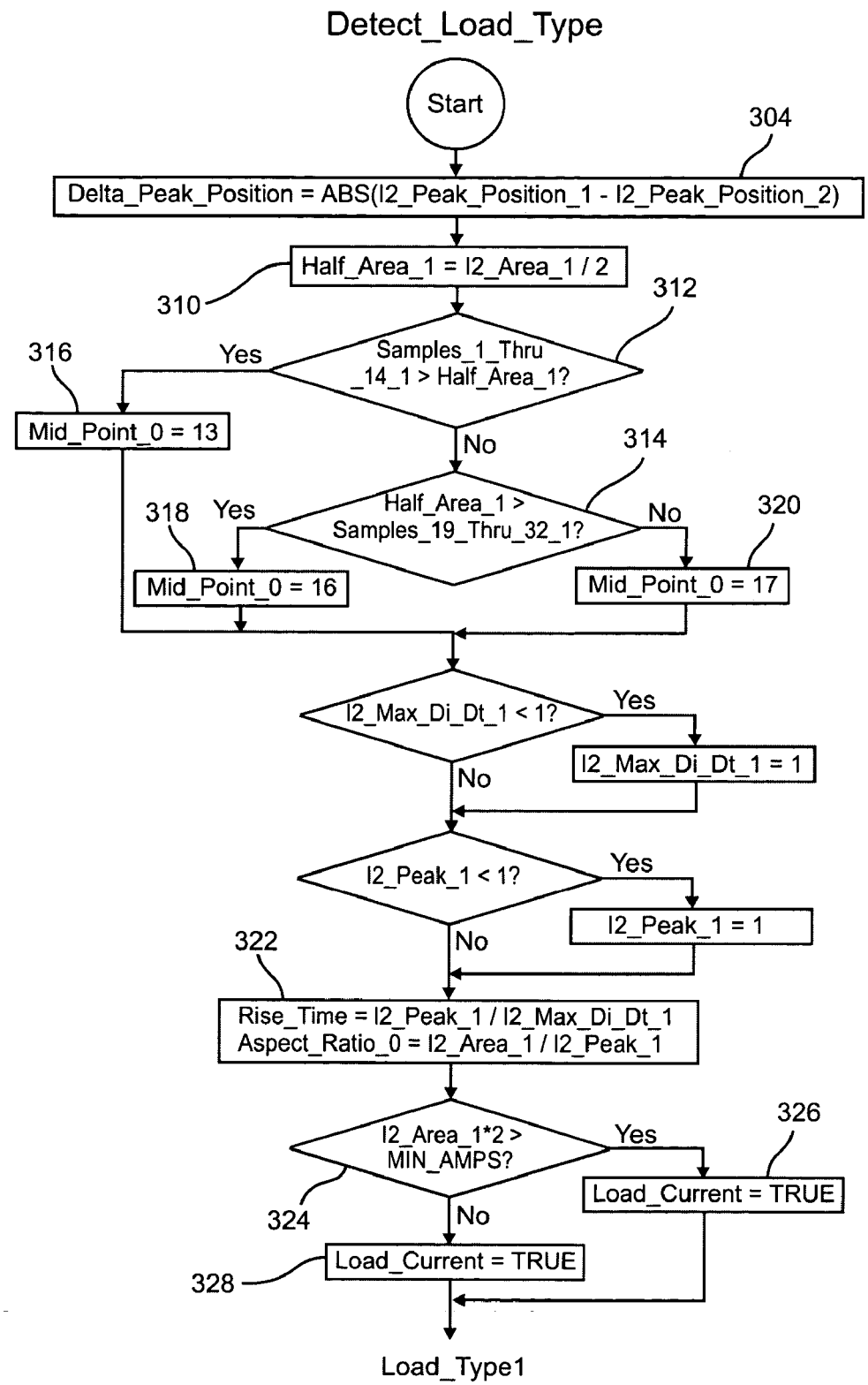
FIGS. 7A–7J are a flowchart showing operation of a detect load type program module.

Referring now to FIG. 7A, at 304 a peak position of the incoming waveform is monitored for the purpose of setting the absolute value for the peak position difference between half cycle 1 and half cycle 2 in a delta peak position register. Thereupon, a half area n register 310 sets the area equal to one half of area n, the area under the waveform on the nth (e.g., first) half cycle. The algorithm then looks at a plurality of previously taken samples (1–14) at 312 and (15–32) at 314 to determine an appropriate setting for a midpoint register at 316, 318 or 320. In this regard, the illustrated embodiment takes 32 samples per line cycle. The midpoint register or counter count corresponds to the sample and the cycle at which the midpoint or spike in current occurs. Next, at 322 a rise time register is set equal to the ratio of peak 1 to maximum di/dt1, i.e., of the first half cycle, and an aspect ratio register is set equal to the ratio of the area to the peak in the first half cycle. If two times the area in the first half cycle is greater than the value in the minimum amps register (324), load current is set true at 326. If not, load current is set false at 328.

Figure 7B:
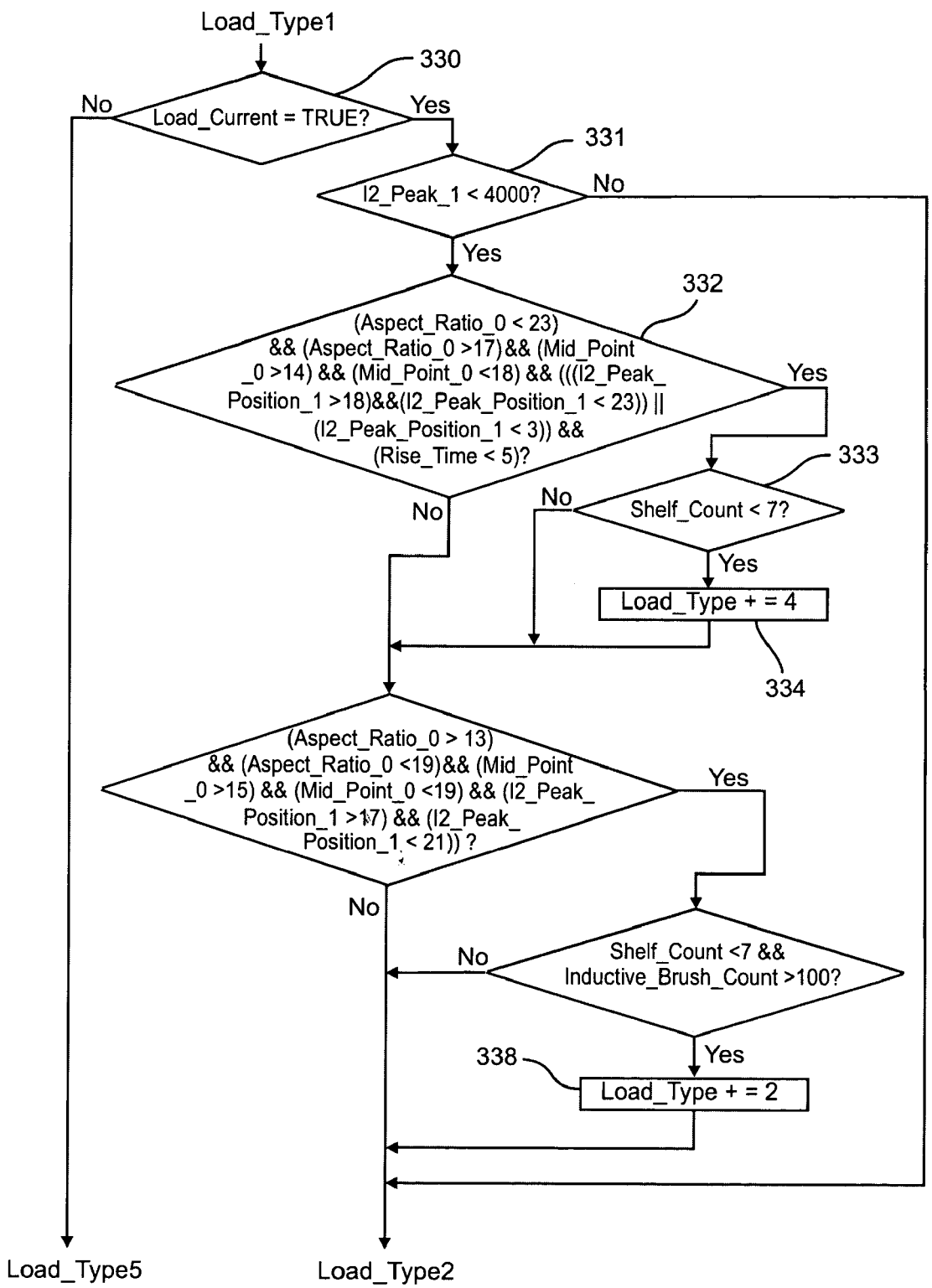
Figure 7C:
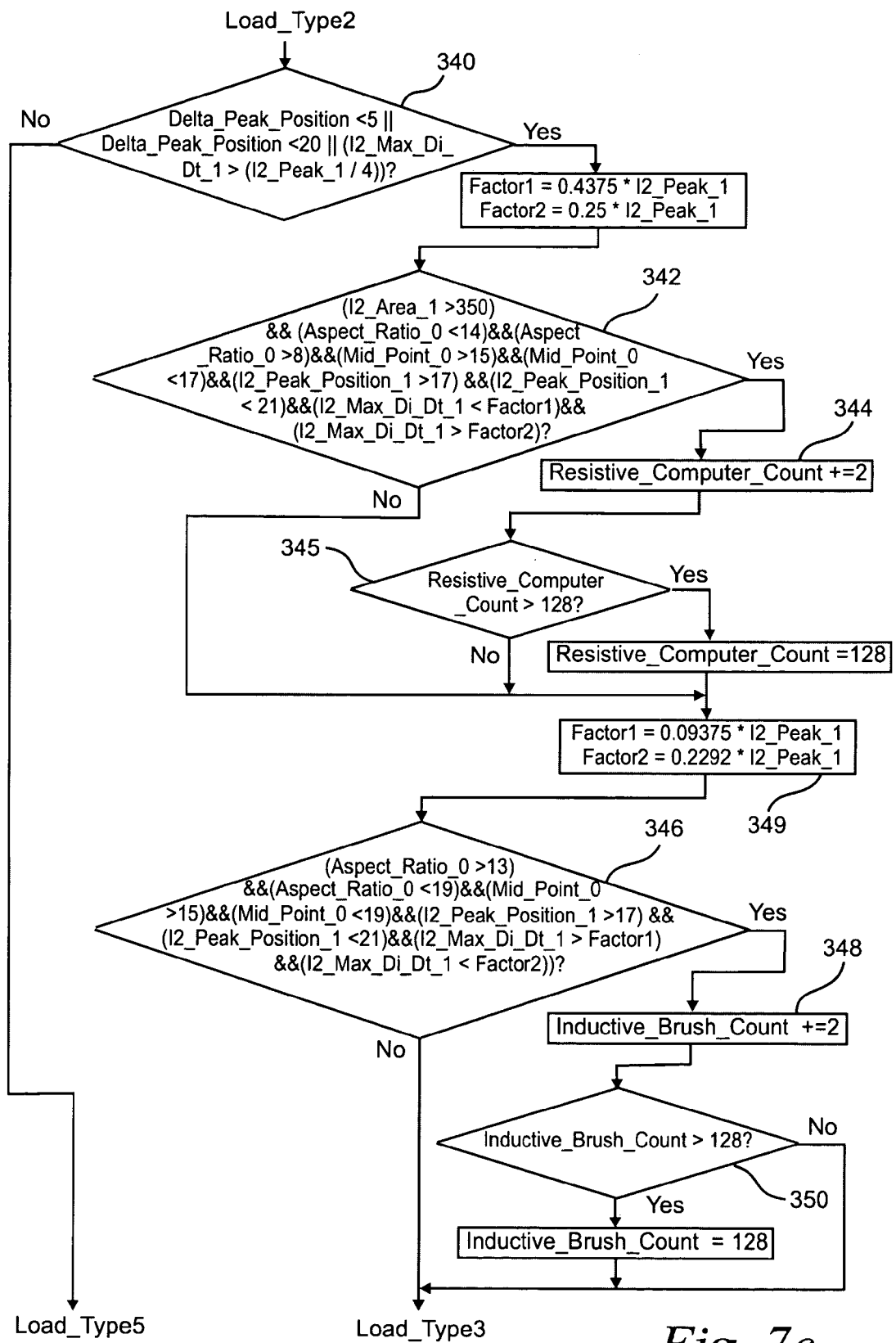

Continuing to FIG. 7B, if the load current is true 330, the peak register is checked, and if below 4000 (331), values in the aspect ratio peak position, rise tune and midpoint registers are checked at 332. The shelf count is checked at 333, and the load type counter is incremented 334 if these registers are less than certain values. If not, aspect ratio peak portion and midpoint values (at 336) the shelf count and inductive brush count (at 337) are checked and the load type register or counter is incremented by two at 338, depending on these values, i.e., if these values are greater than or less than selected quantities. In FIG. 7C, delta and peak position max di/dt register values are read at 340 and if these values are greater or less than selected quantities, the factor 1 and 2 register are set to selected values at 341. Next, aspect ratio register and others are read at 342, and if greater or less than selected quantities, the resistive computer count register or counter is incremented by two at 344. Additional checking of register values and incrementing of inductive brush count and resistive computer count load type register and setting of factors are illustrated at 345, 346, 347, 348, 349, 350 and 352, whereupon the program proceeds to FIG. 7D. It will be noted that a "false" reading in the load current =true register 330 or a "no" at the peak position and midpoint readings 340 direct the program to FIG. 7G.

Figure 7D:
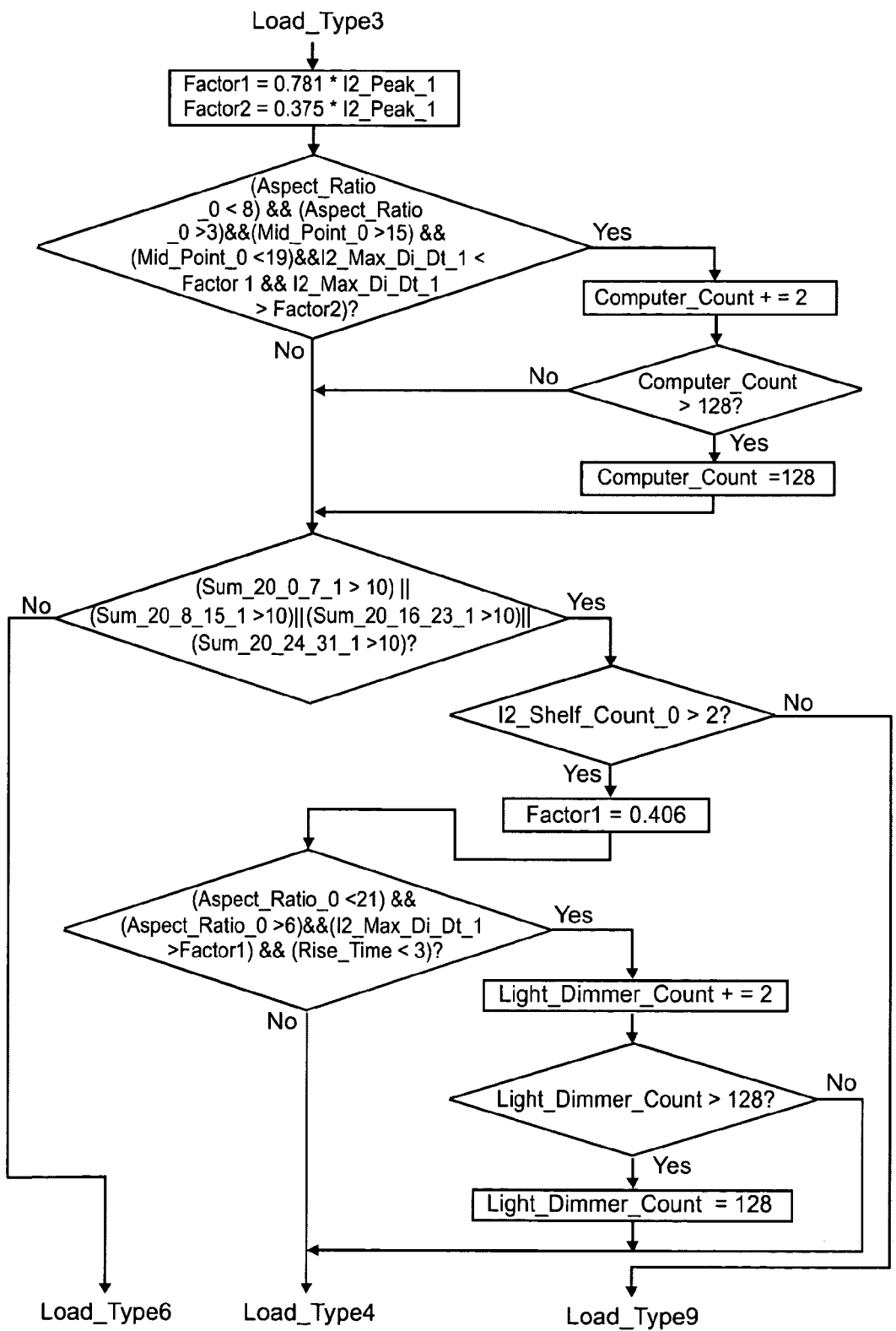
Figure 7E:
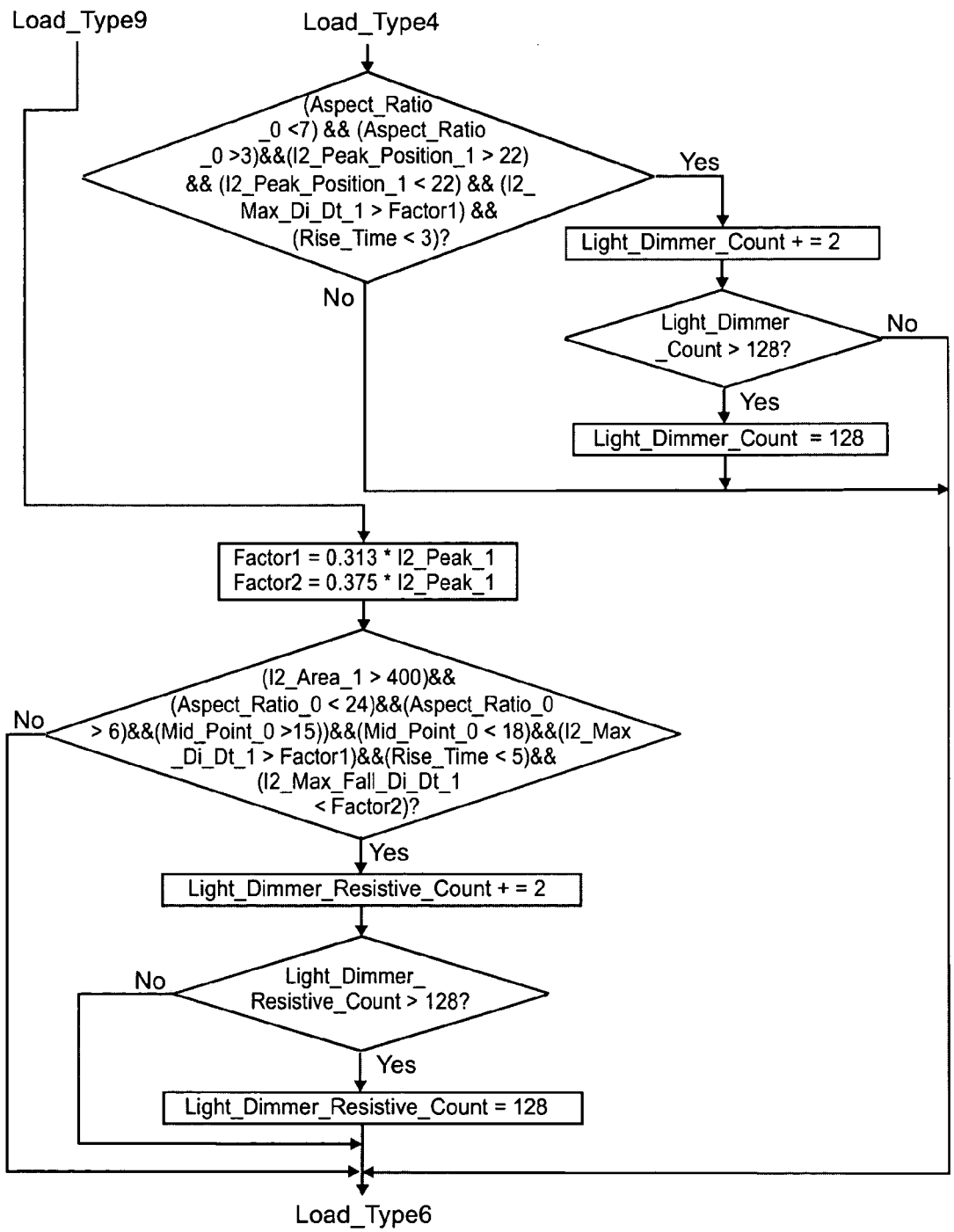
Figure 7F:
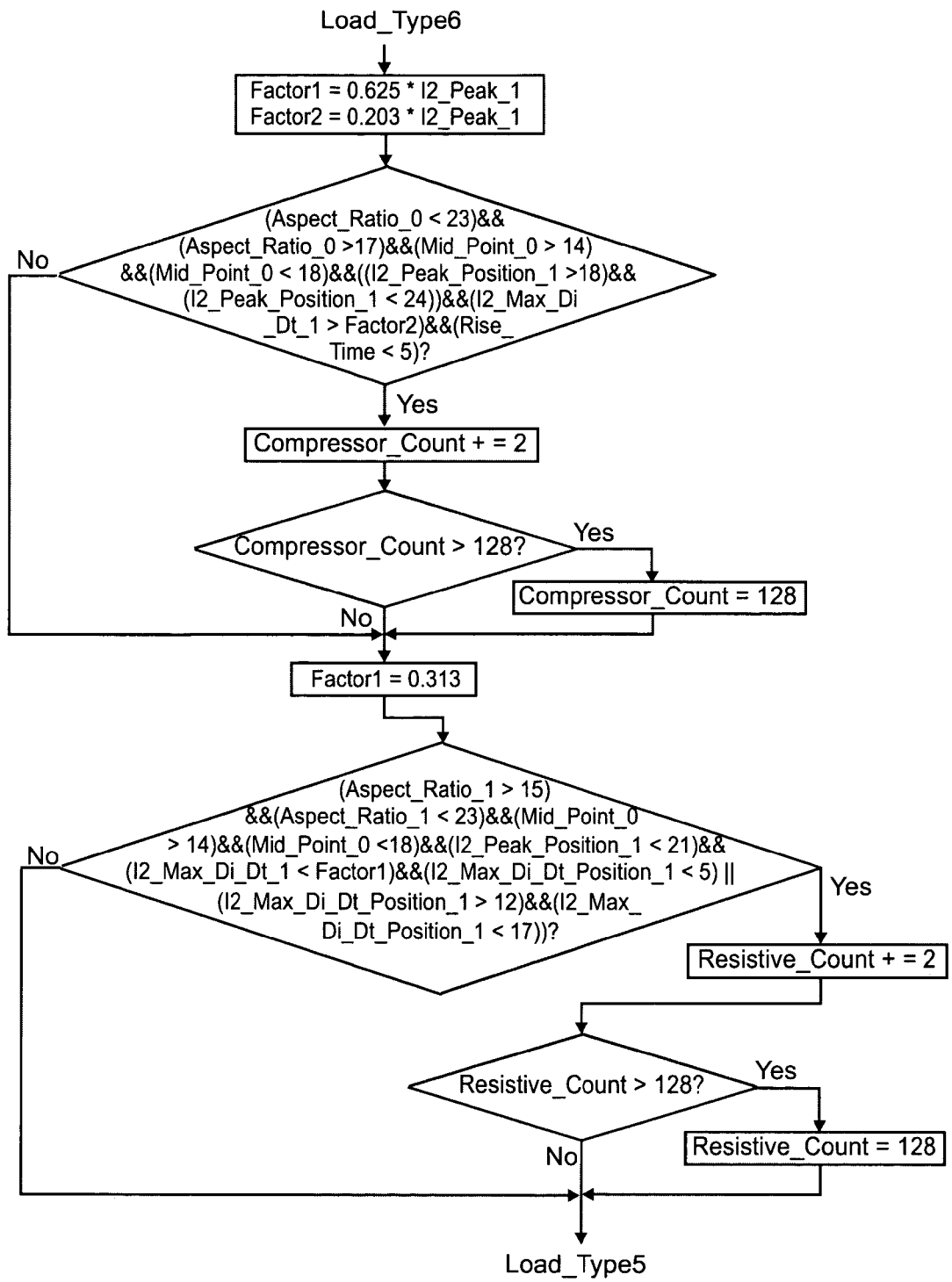

In FIGS. 7D, 7E and 7F, a number of other register values are tested and if within certain ranges, or above or below certain values, various load type registers and factor registers are set, in much the same way as in FIG. 7C.

Figure 7G:
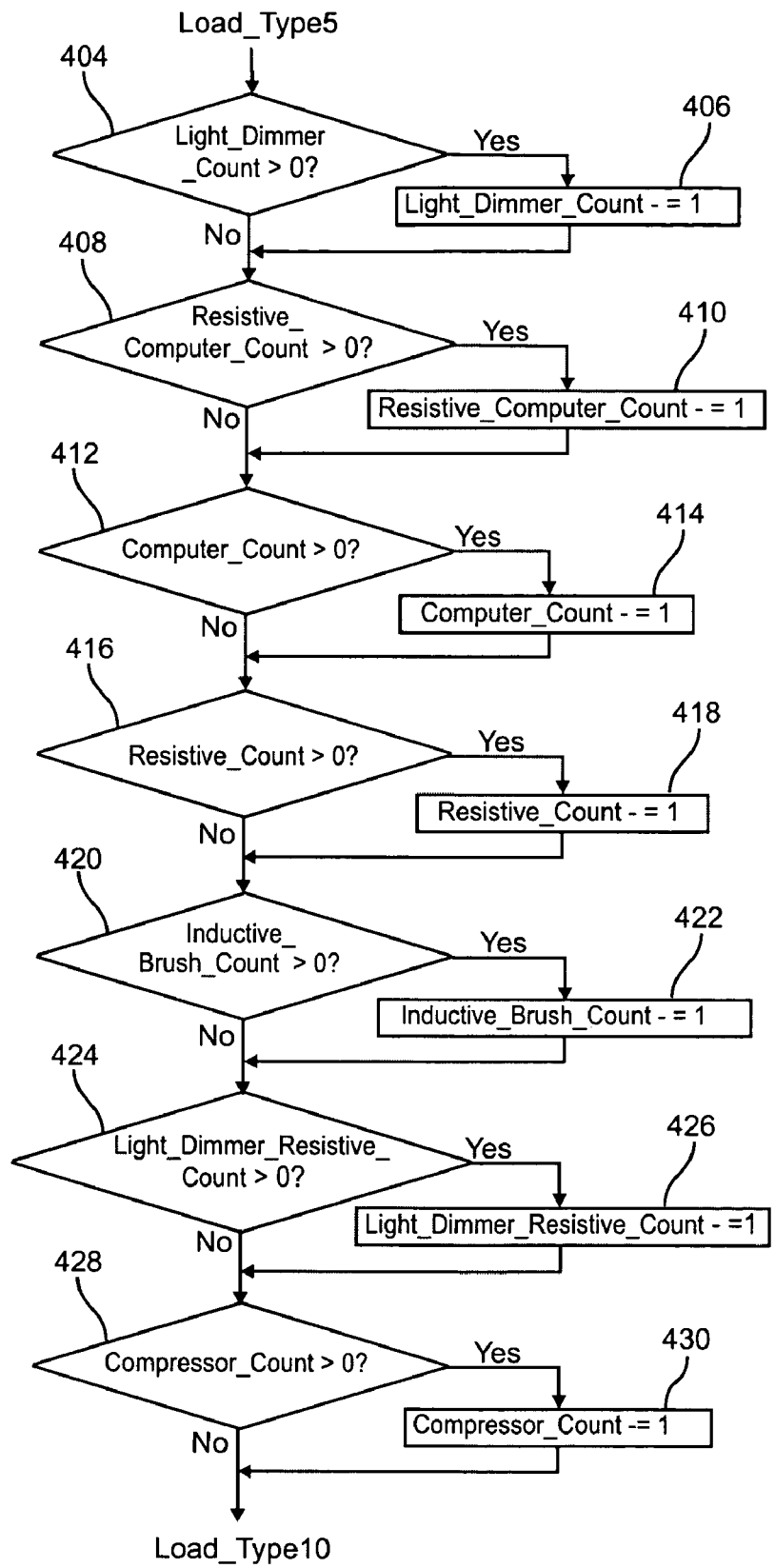

Referring next to FIG. 7G, in the described embodiment, the load type counters are essentially free running, and in order to prevent them from overflowing, they are all decremented by one count, assuming they are currently above zero. This is illustrated in the steps 404 through 430.

Figure 7H:
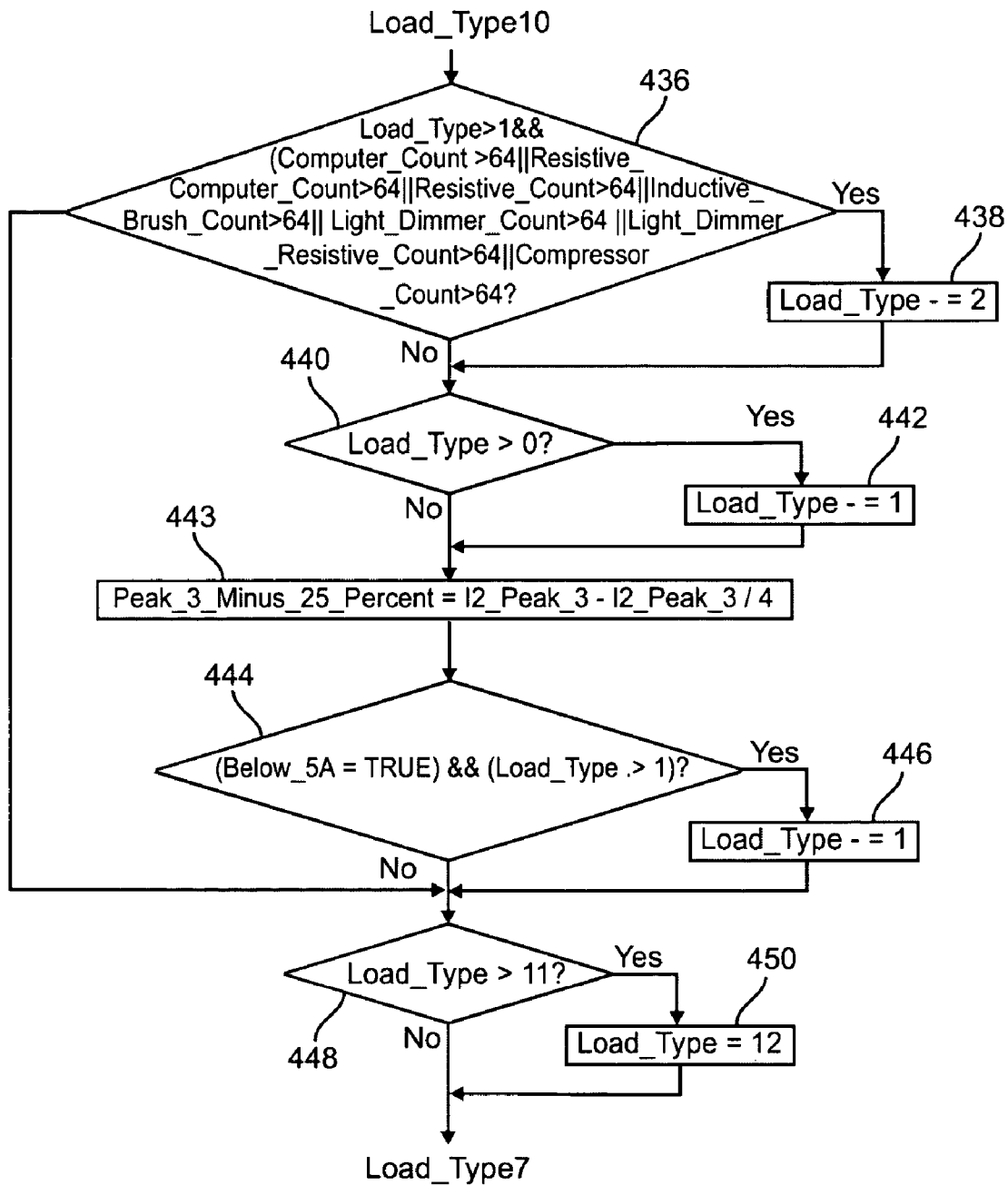

Proceeding to FIG. 7H, the counts in the counters for the various load type are checked at 436 along with a "load type" counter and if greater than certain values, the load type counter is decremented by two at 438 or, if not, and the load type counter is non-zero (440), the load type counter is decremented by one at 442. If the load type counter is not greater than 0, a peak minus 25 percent register is reset at 443. At reference numerals 444–450, further checks of the load type counter and a below 5A register (at 444) are run for either decrementing the load type counter (446) or for setting the load type counter equal to 12 (450).

Figure 7I:
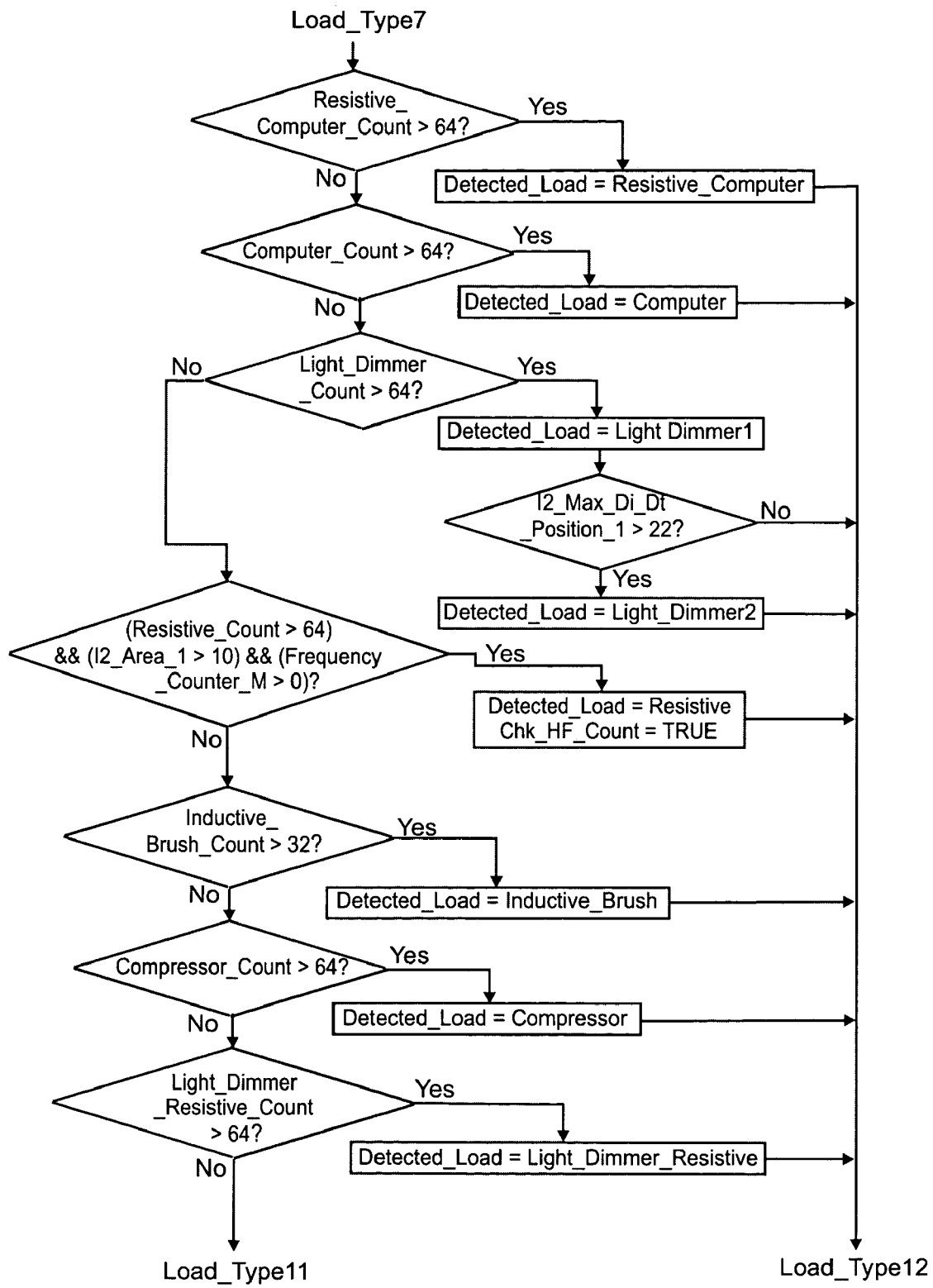
Figure 7J:
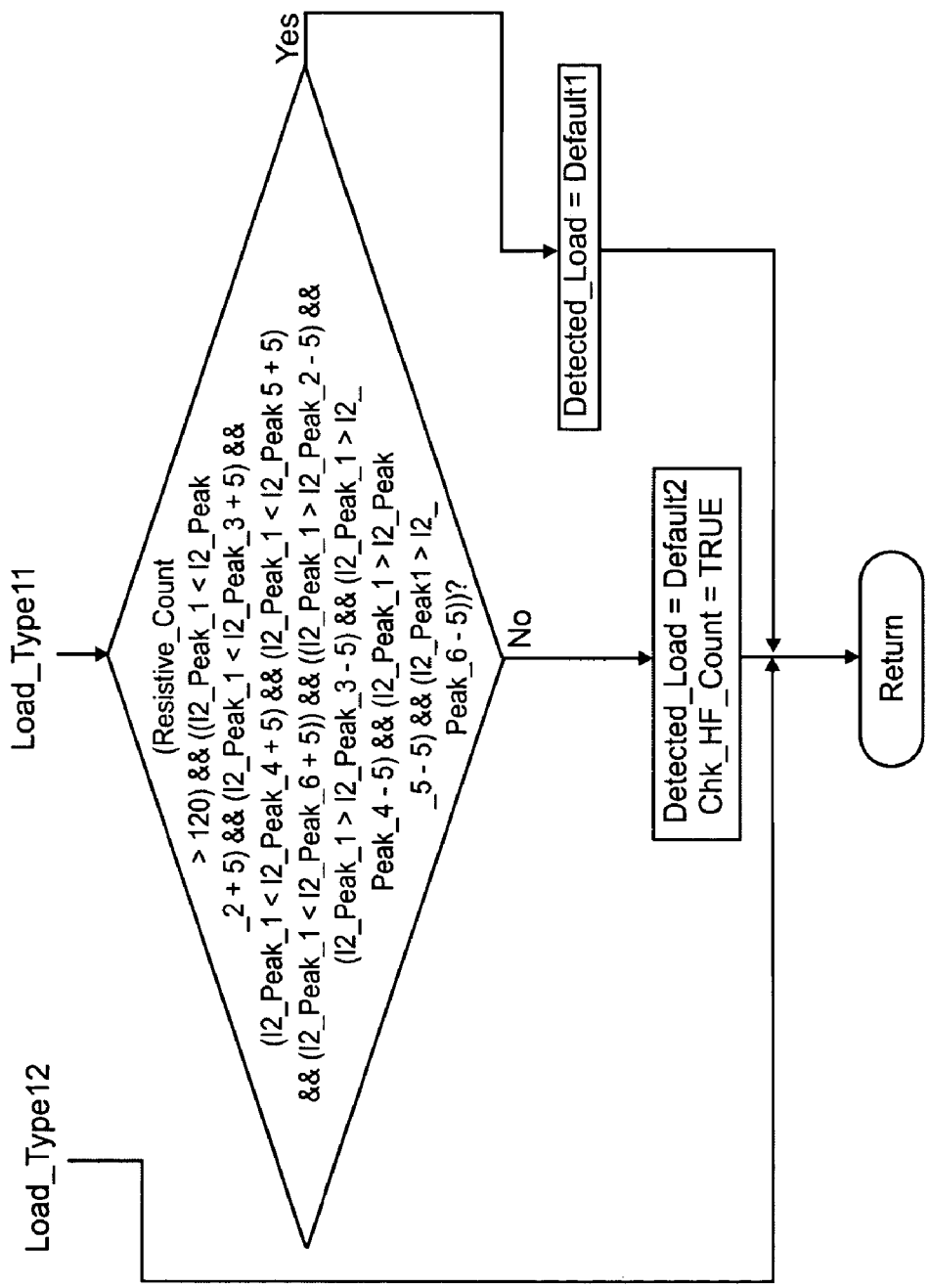

FIGS. 7I and 7J indicate a number of settings of a detected load counter or register, based upon the counts in a number of the load type counters. FIG. 7J indicates setting of a detected load counter to default 1 or default 2 conditions and the setting of a check high frequency count register to true based on certain conditions in resistive count and various peak counters as indicated.

Figure 8:
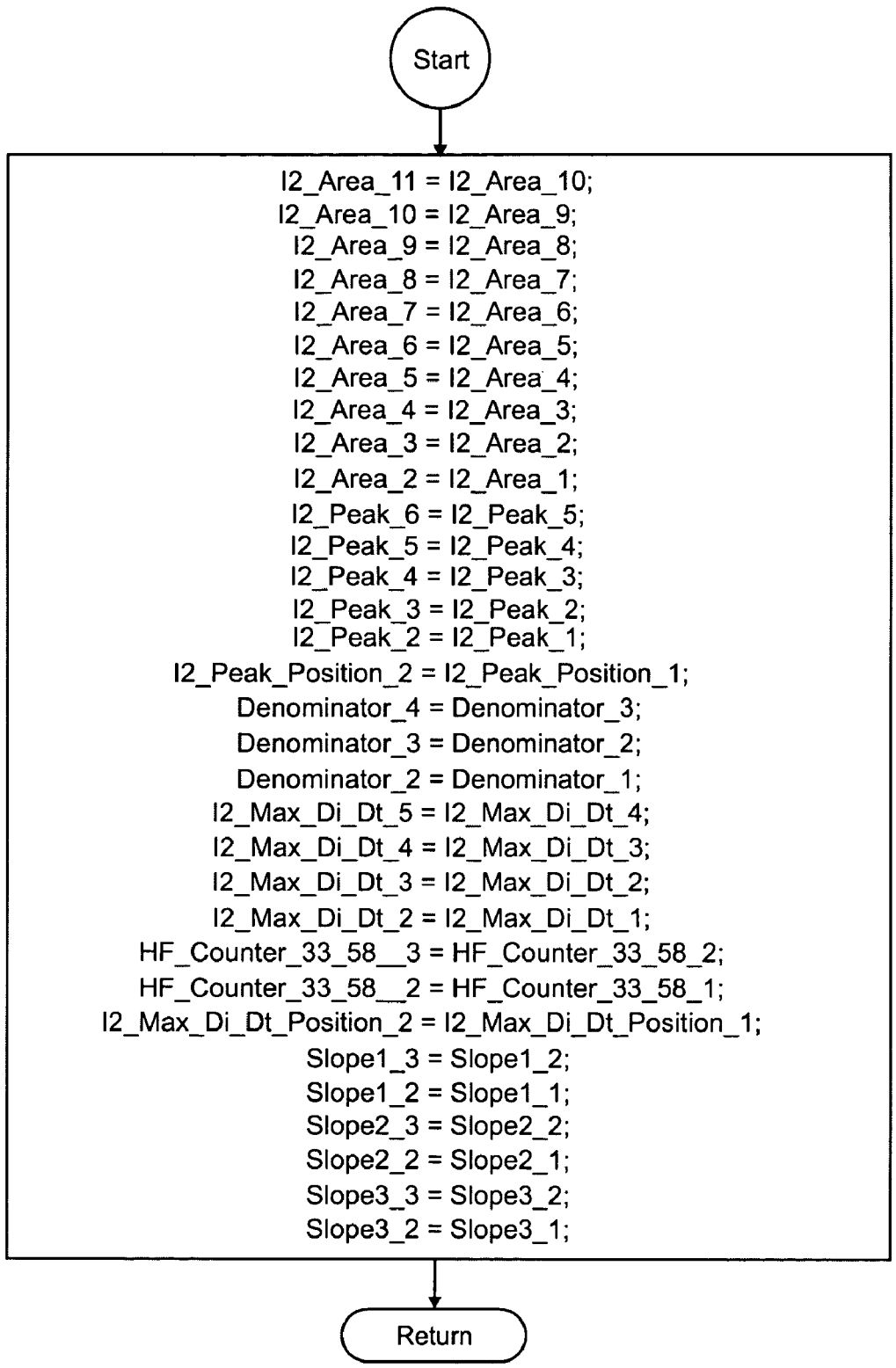
FIG. 8 is a flowchart of an update history buffers program module.
Figure 9:
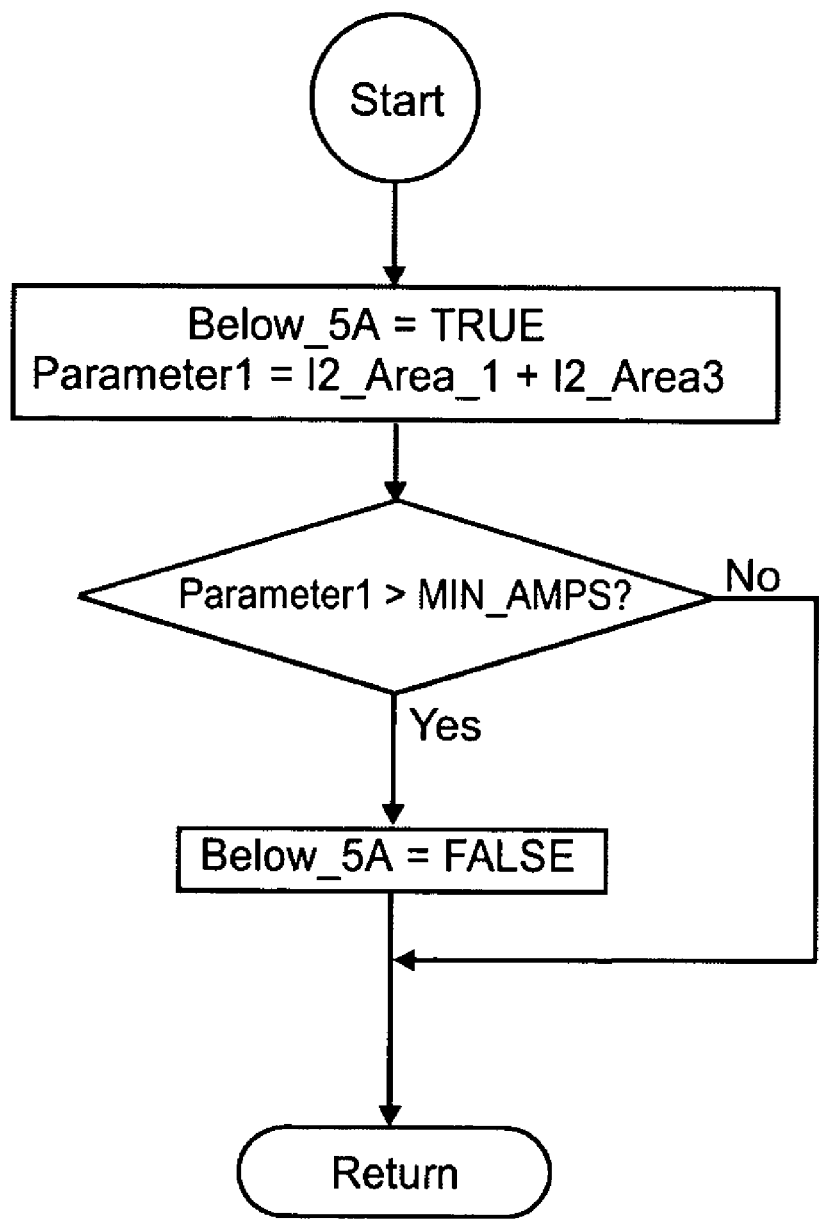
FIG. 9 is a flowchart of an under current monitor program module.

FIG. 8 shows the module 242 for updating history buffers in which a number of registers or buffers are updated as indicated. FIG. 9 shows the undercurrent monitor module 244 which checks for a below 5 amp current condition.

Figure 10:
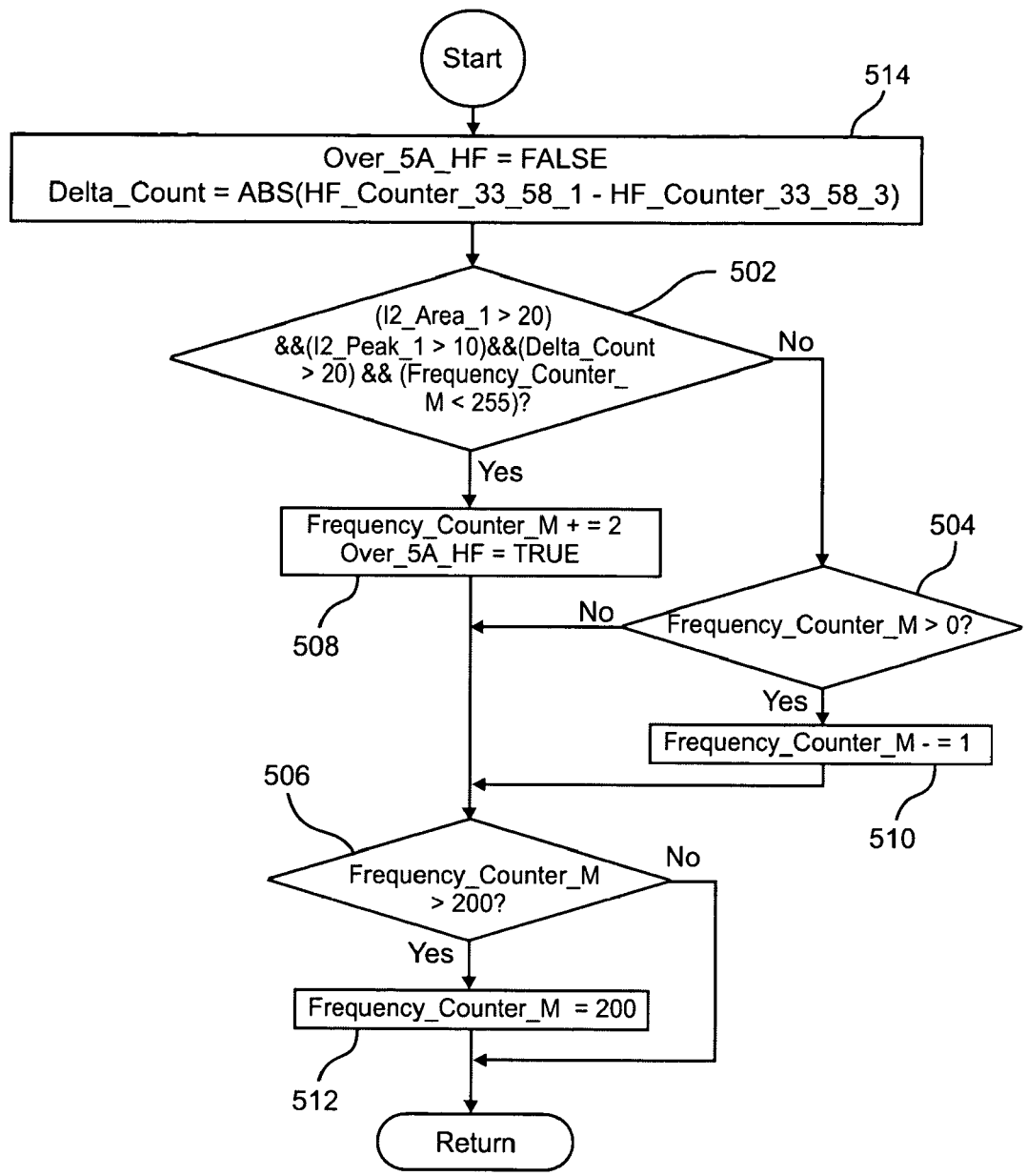
FIG. 10 is a flowchart of an over 5 amp resistive program module.

FIG. 10 shows the over 5 amp resistive module 246. This module monitors the condition of a number of counters as indicated at 502–506 and increments or decrements a frequency counter, as shown at 508–512. At 514, an over 5 amp high frequency register is initially set false and the absolute value of the difference between a high frequency count at 33 KHz and 58 KHz for the first and third half cycles is calculated.

Figure 11:
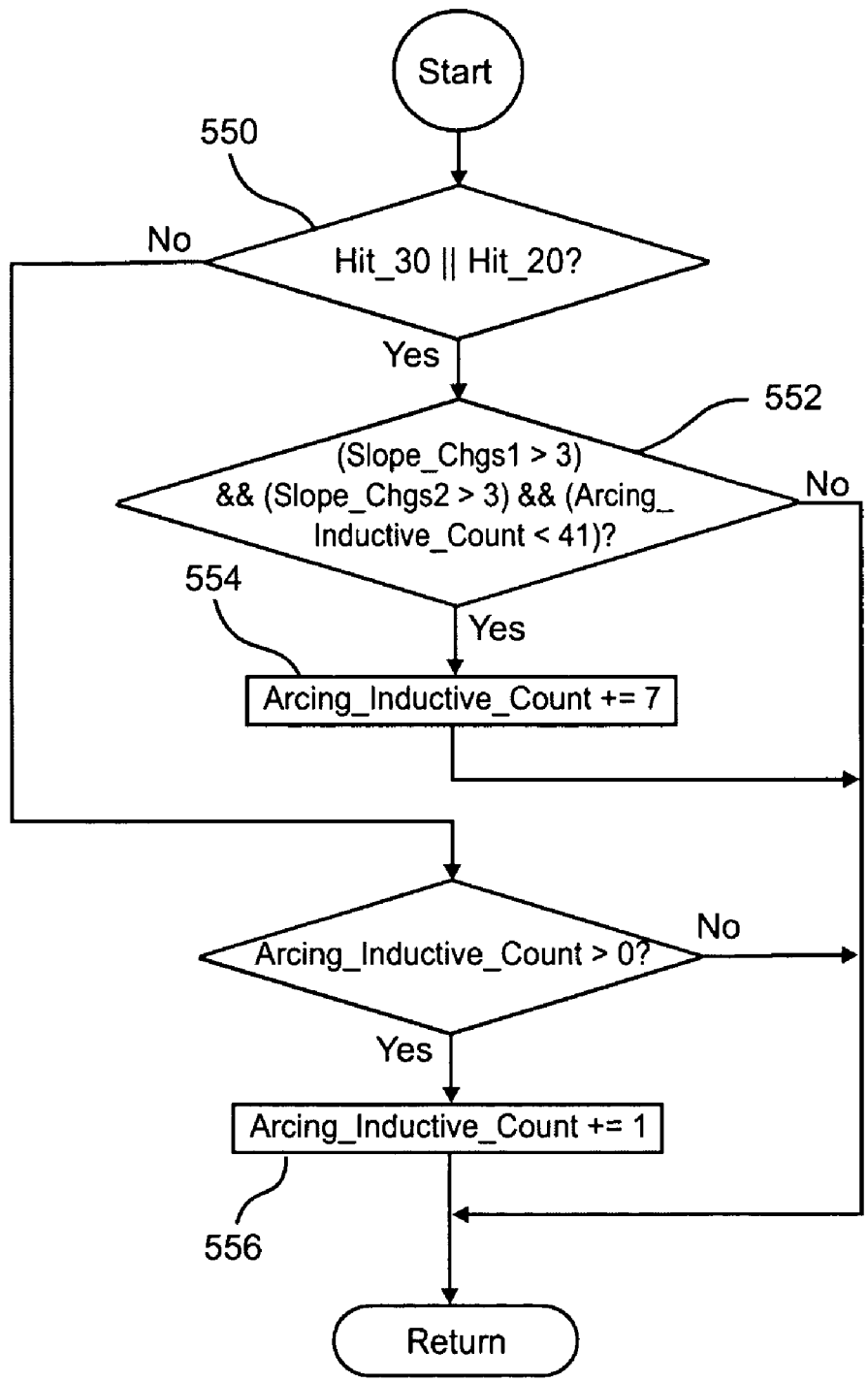
FIG. 11 is a flowchart showing operation of an inductive arcing timer program module.

Referring now to FIG. 11, the inductive arcing timer module 248 is shown in additional detail. This module begins at 550 by checking hit 30 and hit 20 registers. These registers relate to 30 Hz or 20 Hz harmonics in the current signature. The inductive arcing timer module then checks the states of slope changes counters and correspondingly increments or decrements an arcing inductive counter at 552 and 554 or 556, depending on its current state.

Figure 12:
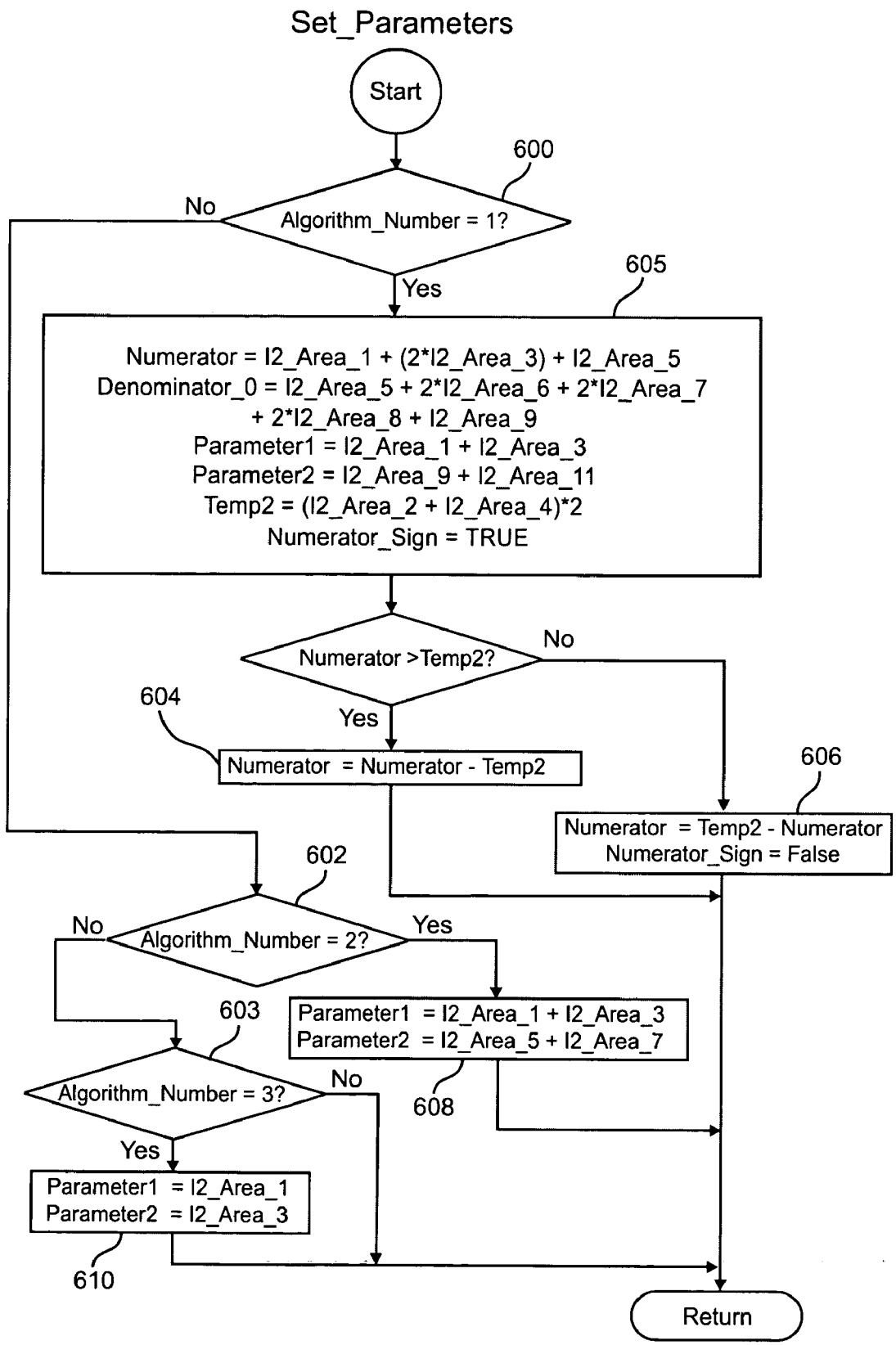
FIG. 12 is a flowchart showing operation of a set parameters program module.
Figure 13A:
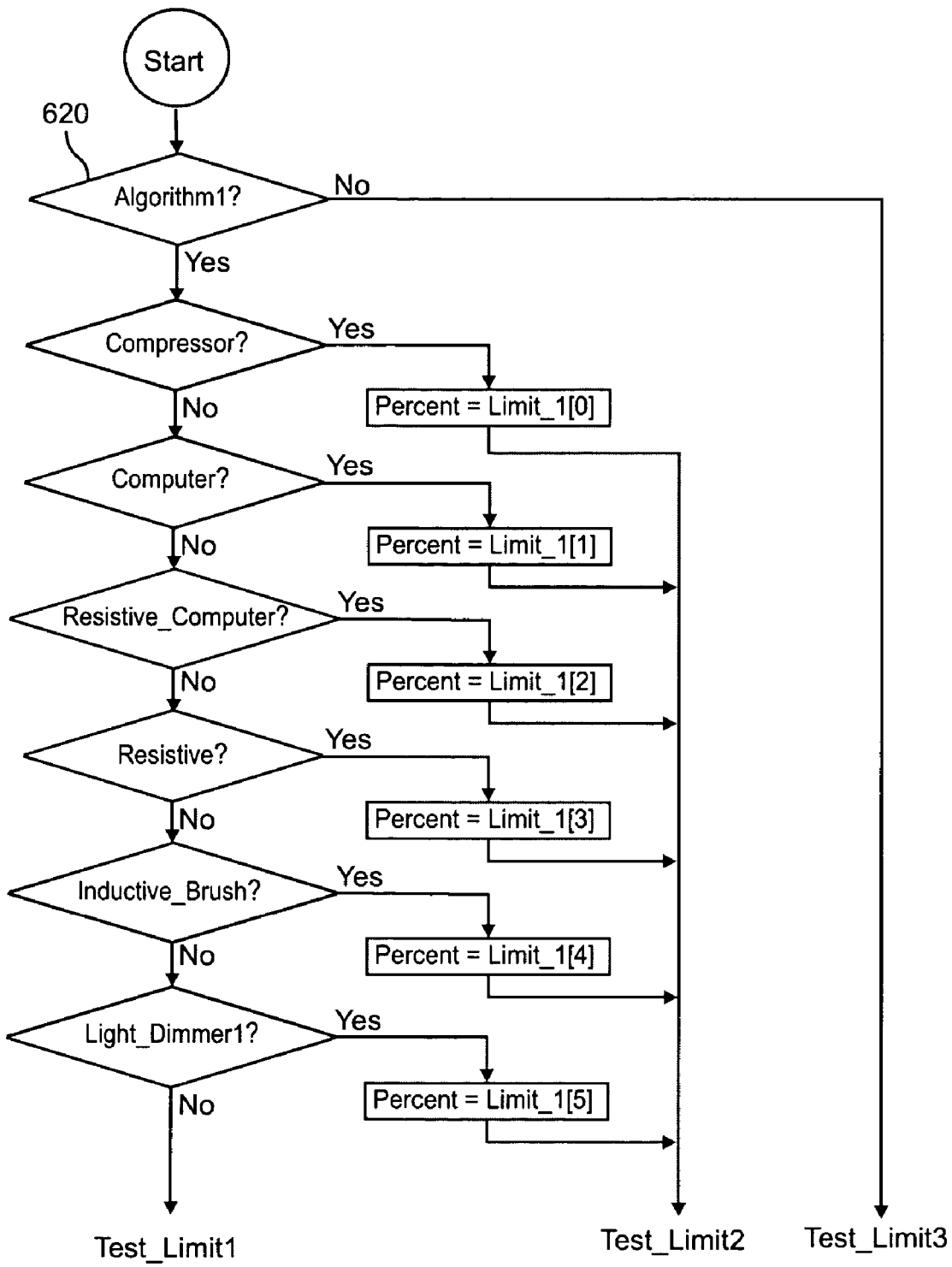
FIGS. 13A–13F show a flowchart showing operation of a set test limit program module.
Figure 13B:
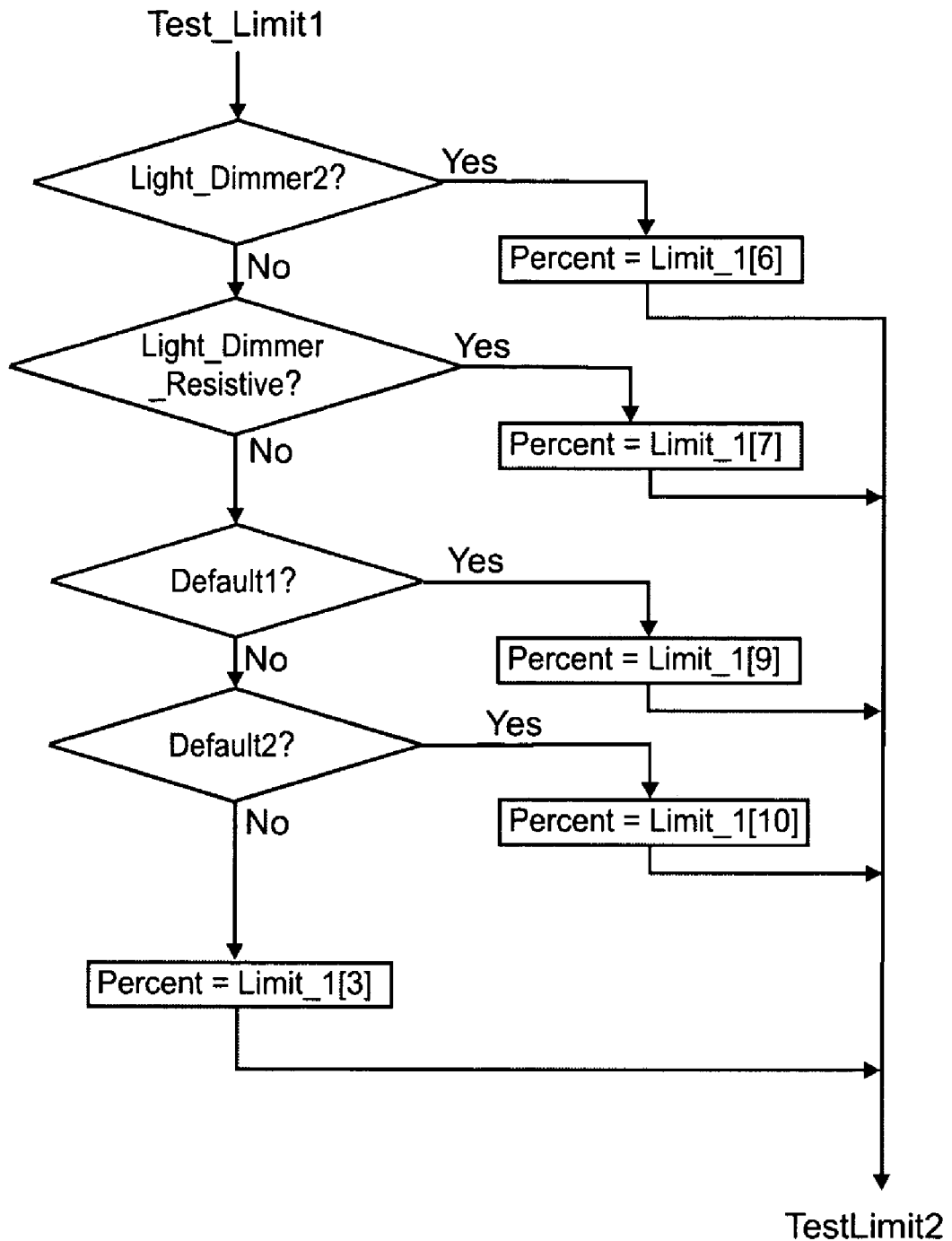
Figure 13C:
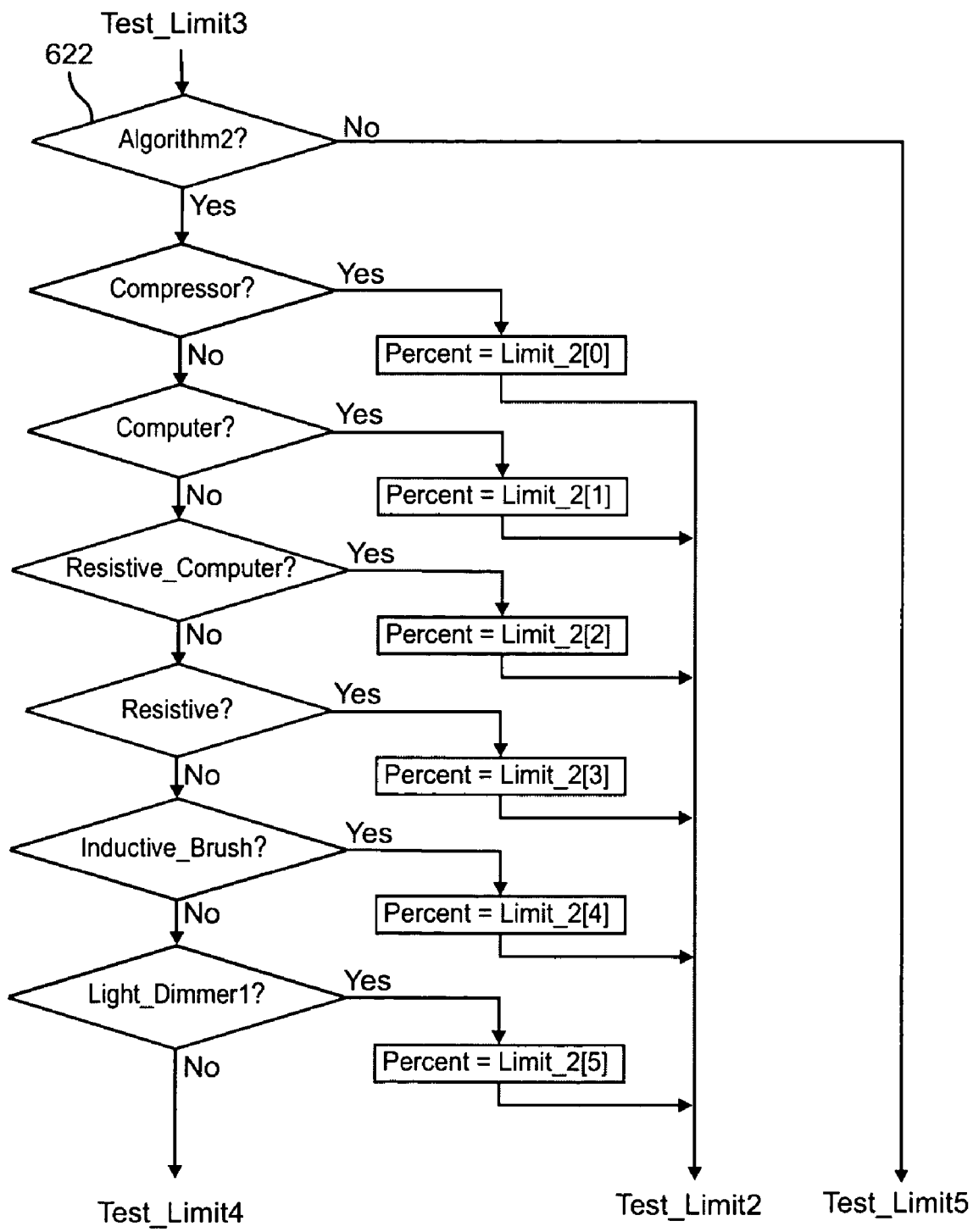
Figure 13D:
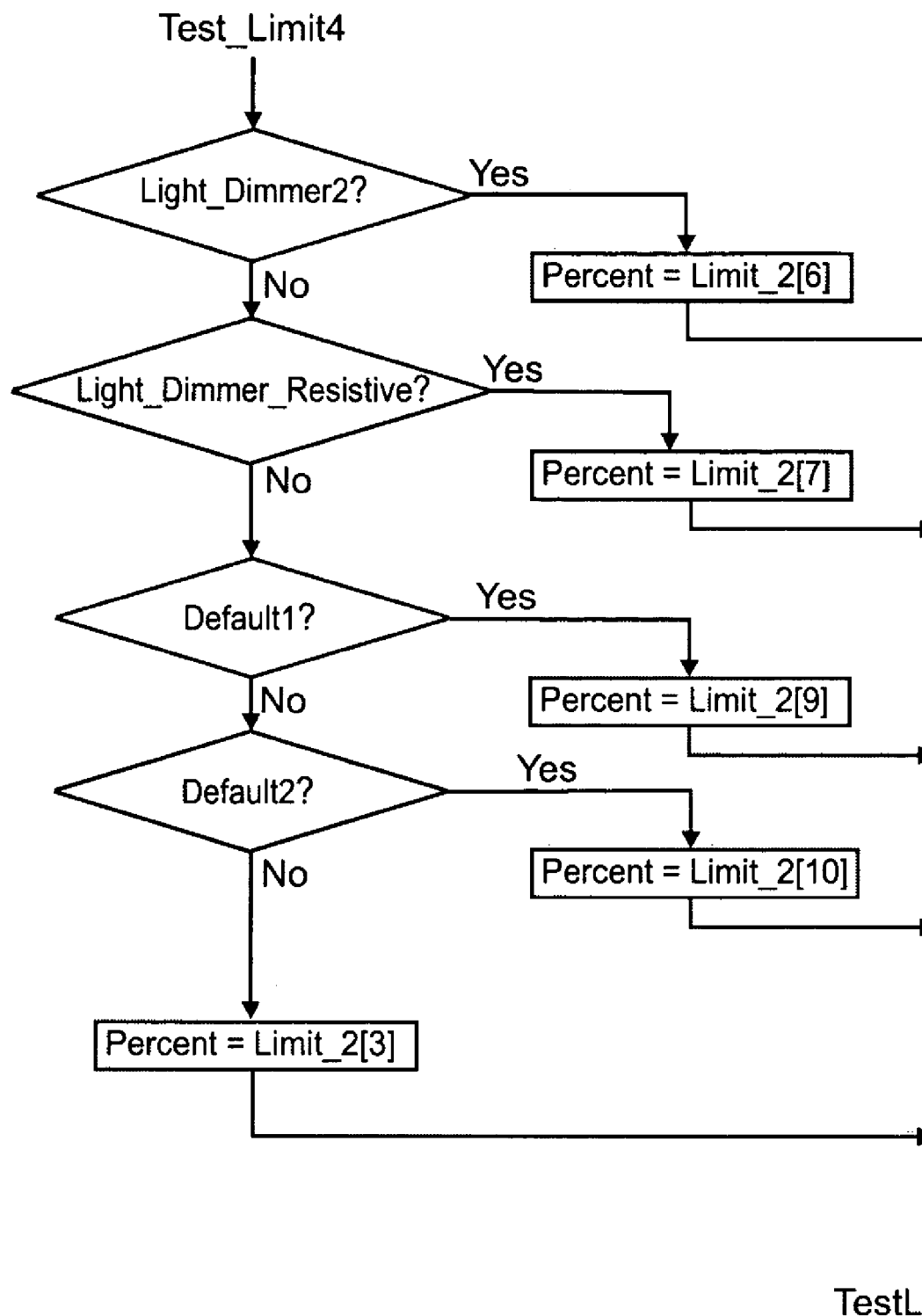
Figure 13E:
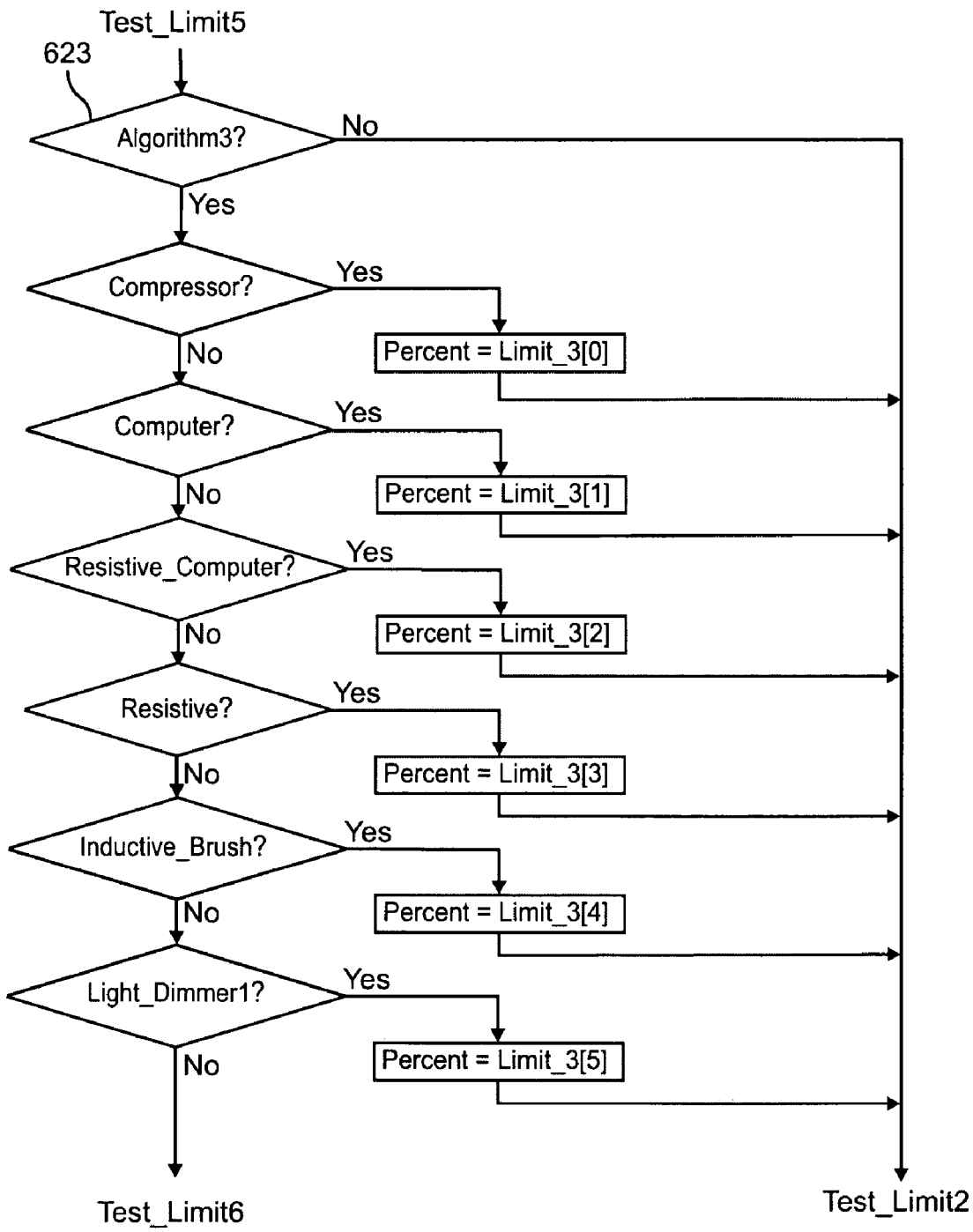
Figure 13F:
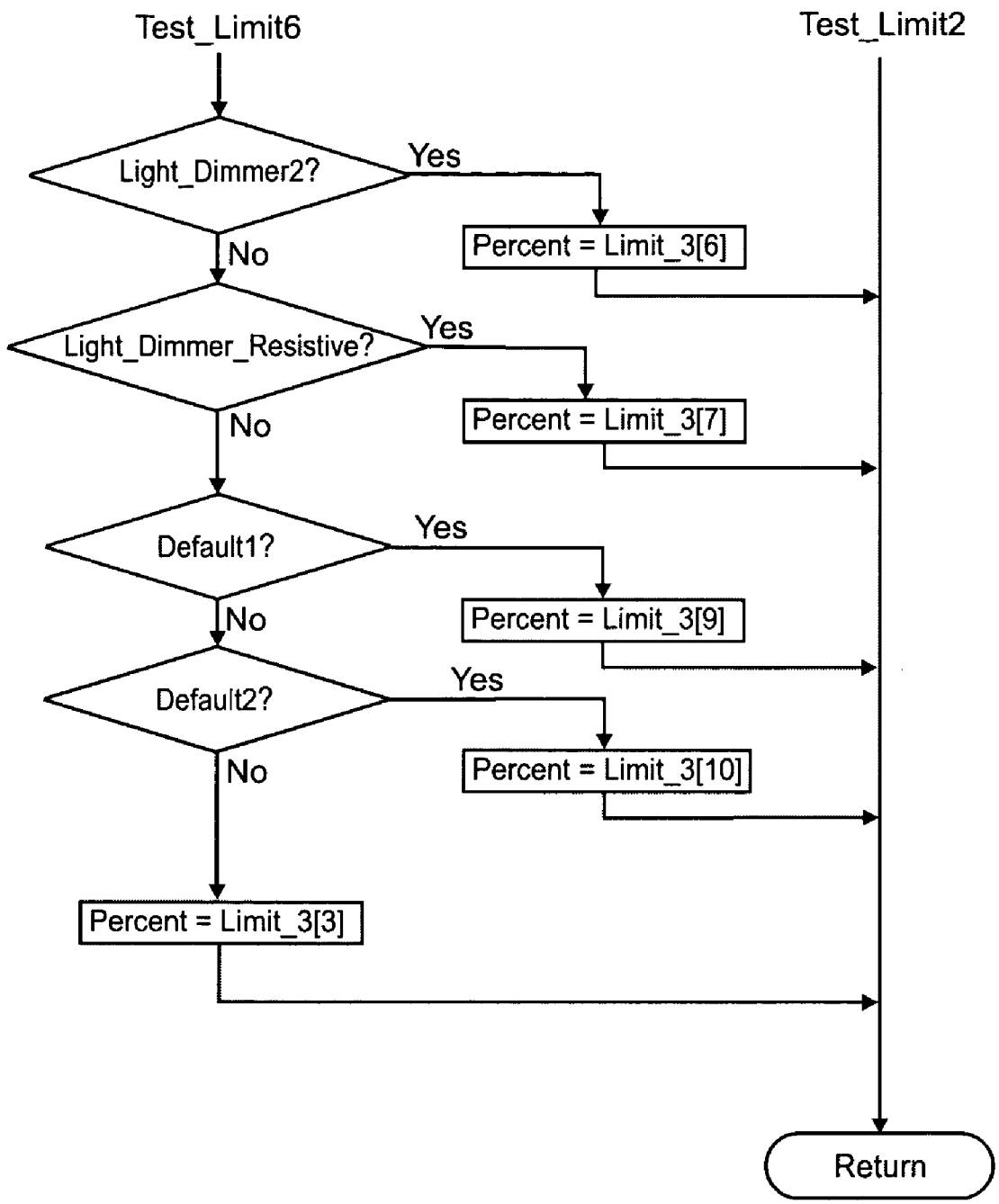

FIG. 12 shows the set parameters module 250. This module sets parameter 1 and parameter 2 registers and a numerator and denominator sign register as well as an a Temp 2 register, depending on the algorithm selected. In this regard three algorithms are selectable in the illustrated embodiment, and as seen with respect to the main program sequence. In FIGS. 5A–5C, the module of FIG. 12 is run three times, one for each of these algorithms. The module itself, as seen in FIG. 12, determines which algorithm is being called for, as indicated at reference numerals 600, 602 and 603. Similarly, the registers set by the module are indicated at reference numerals 604, 605, 606, 608 and 610.

FIGS. 13A–13F show a self-test limit module 252. This module sets certain limits of a percent register for each of the three algorithm types, and like the module of FIG. 12 is run three times as shown in FIGS. 5A–5C, one time for each algorithm, determined as indicated at 620, 622 and 623. In each case, the module sets percent limits (as defined in the table below) for the various load types for each algorithm as generally shown in FIGS. 13A–13F. This includes settings for default 1 and default 2 load types as well.

TABLE 1

Test Limits Definitions

| | | |
|---|---|---|
| Limit_1[0] = 12 | Limit_2[0] = 12 | Limit_3[0] = 16 |
| Limit_1[1] = 24 | Limit_2[1] = 24 | Limit_3[1] = 16 |
| Limit_1[2] = 128 | Limit_2[2] = 128 | Limit_3[2] = 128 |
| Limit_1[3] = 64 | Limit_2[3] = 64 | Limit_3[3] = 32 |
| Limit_1[4] = 32 | Limit_2[4] = 32 | Limit_3[4] = 32 |
| Limit_1[5] = 64 | Limit_2[5] = 64 | Limit_3[5] = 64 |
| Limit_1[6] = 100 | Limit_2[6] = 100 | Limit_3[6] = 100 |
| Limit_1[7] = 100 | Limit_2[7] = 100 | Limit_3[7] = 64 |
| Limit_1[8] = 128 | Limit_2[8] = 128 | Limit_3[8] = 128 |
| Limit_1[9] = 32 | Limit_2[9] = 32 | Limit_3[9] = 32 |
| Limit_1[10] = 32 | Limit_2[10] = 32 | Limit_3[10] = 32 |

Figure 14A:
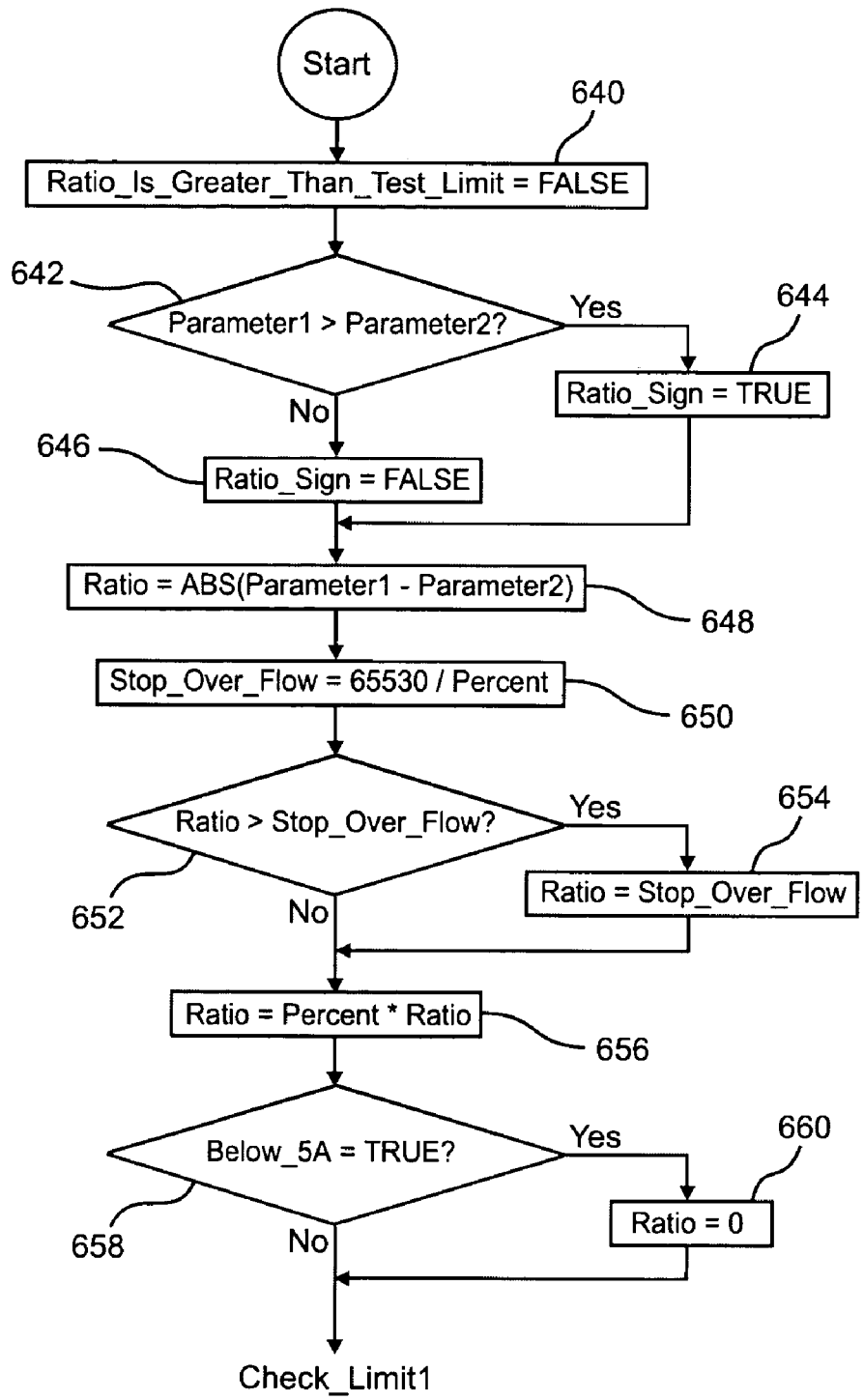
FIGS. 14A and 14B show a flowchart showing operation of a check limit program module.
Figure 14B:
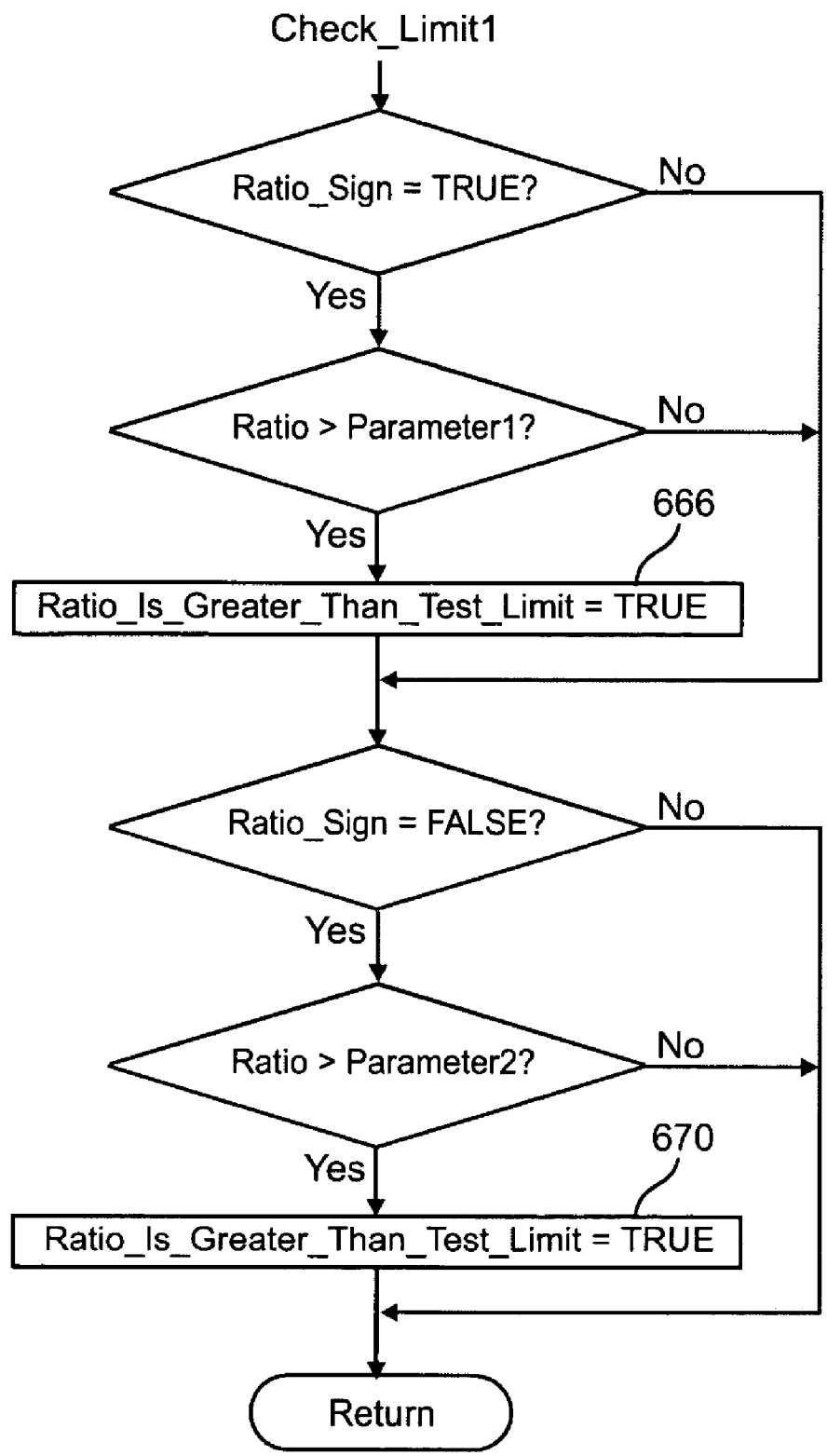

FIGS. 14A–14B show the check limit module 254. This module essentially checks to see if the "parameters" have changed by certain percentage limits as set in the module of FIGS. 13A–13F. A "ratio is greater than test limit" register or buffer is initially set to false as indicated at 640. The sign of the parameters from one sample to the next is next checked at 642 and if positive, indicating a rising wave form edge, the ratio sign is set true at 644 and if negative, indicating a falling edge, the ratio sign buffer is set false at 646. The value of a ratio register is then set as the absolute value of the difference between the parameters at 648, and at 650 a stop overflow limit is set. If the ratio is greater than the stop overflow setting as shown at 652, ratio is set equal thereto at 654 or is set equal to a percentage of the current ratio value at 656 if it is not greater than the stop overflow limit. The state of the below 5 amp buffer is checked at 658, and if true, the ratio is set to zero at 660. If not, if the ratio sign is true and ratio is greater than parameter 1, a ratio is greater than test limit register or buffer is set true at 666. If the ratio sign is set false and the ratio is greater than parameter 2, the ratio is greater than test limit buffer is set true as indicated at 670.

FIGS. 15A–15D show the check slope changes module 256. In the same fashion as the previous modules 250, 252 and 254, this module is also activated or run for each of the three algorithms in the illustrated embodiment, as indicated in FIGS. 5A–5C. It should be noted that in the modules as shown in the flowcharts, certain conventions have been used, including the use of an exclamation point (!) to indicate a logic NOT and && to indicate a logic AND.

Figure 15A:
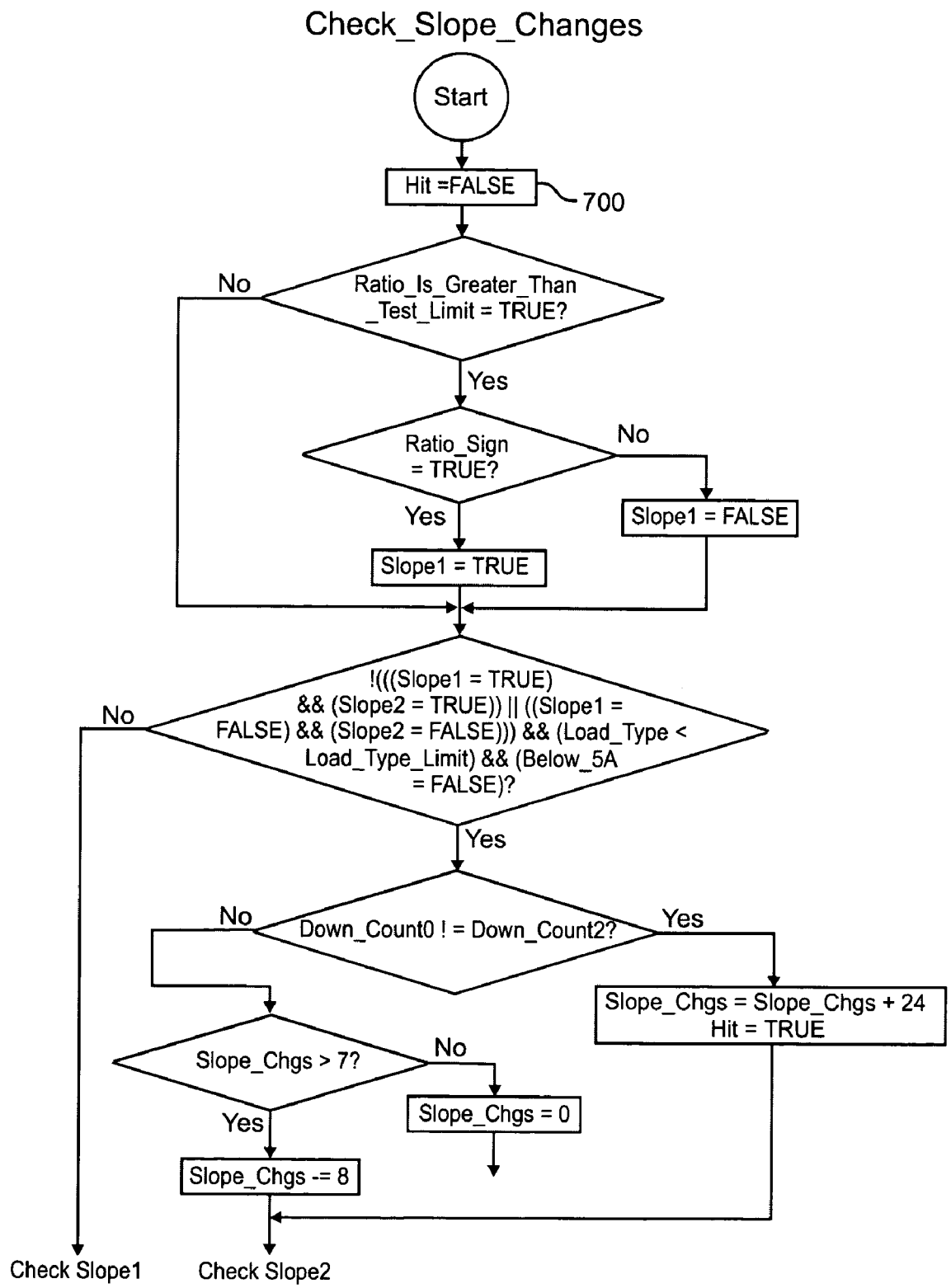
FIGS. 15A–15D show a flowchart showing operation of a check slope changes program module.
Figure 15B:
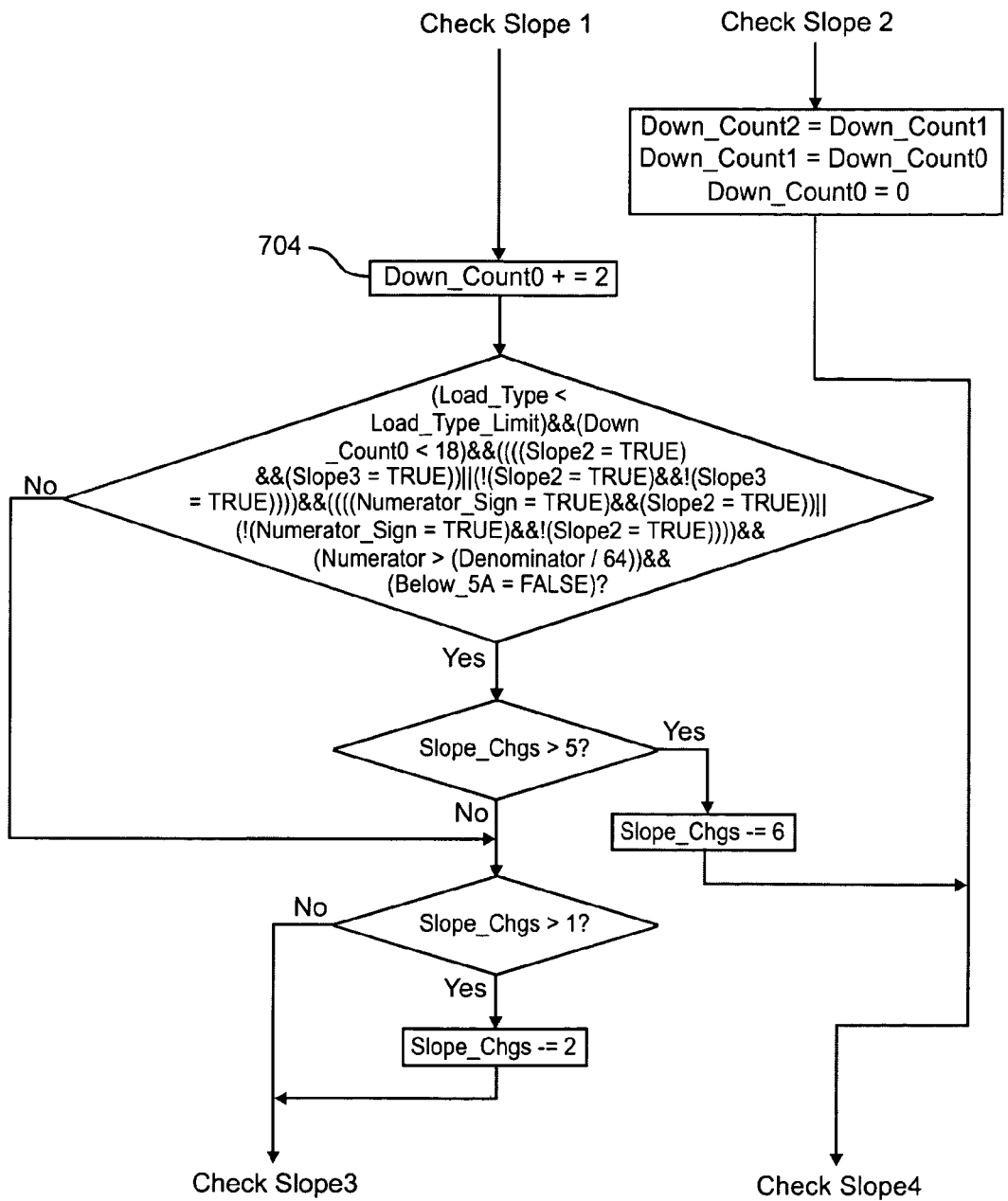
Figure 15C:
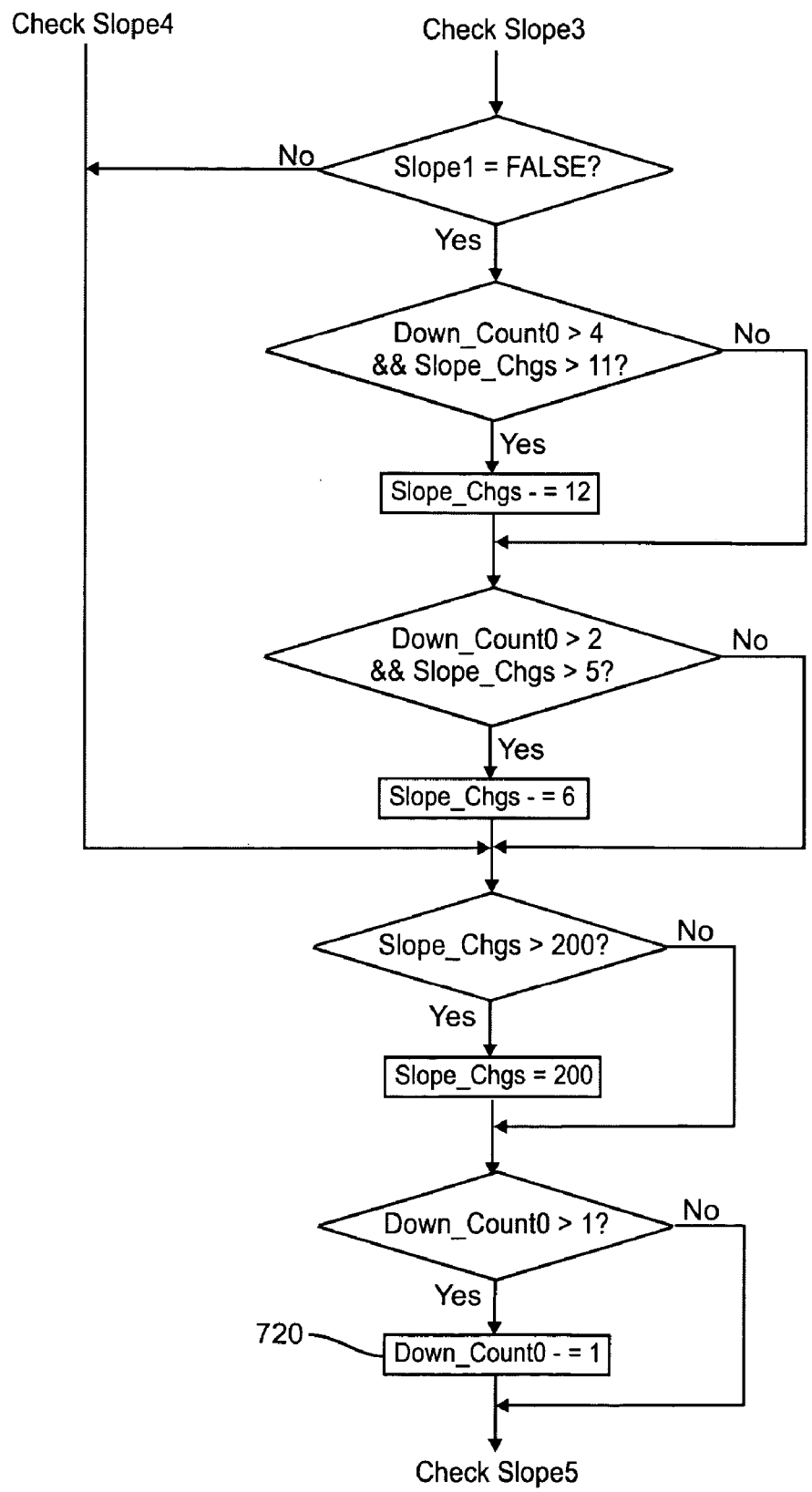
Figure 15D:
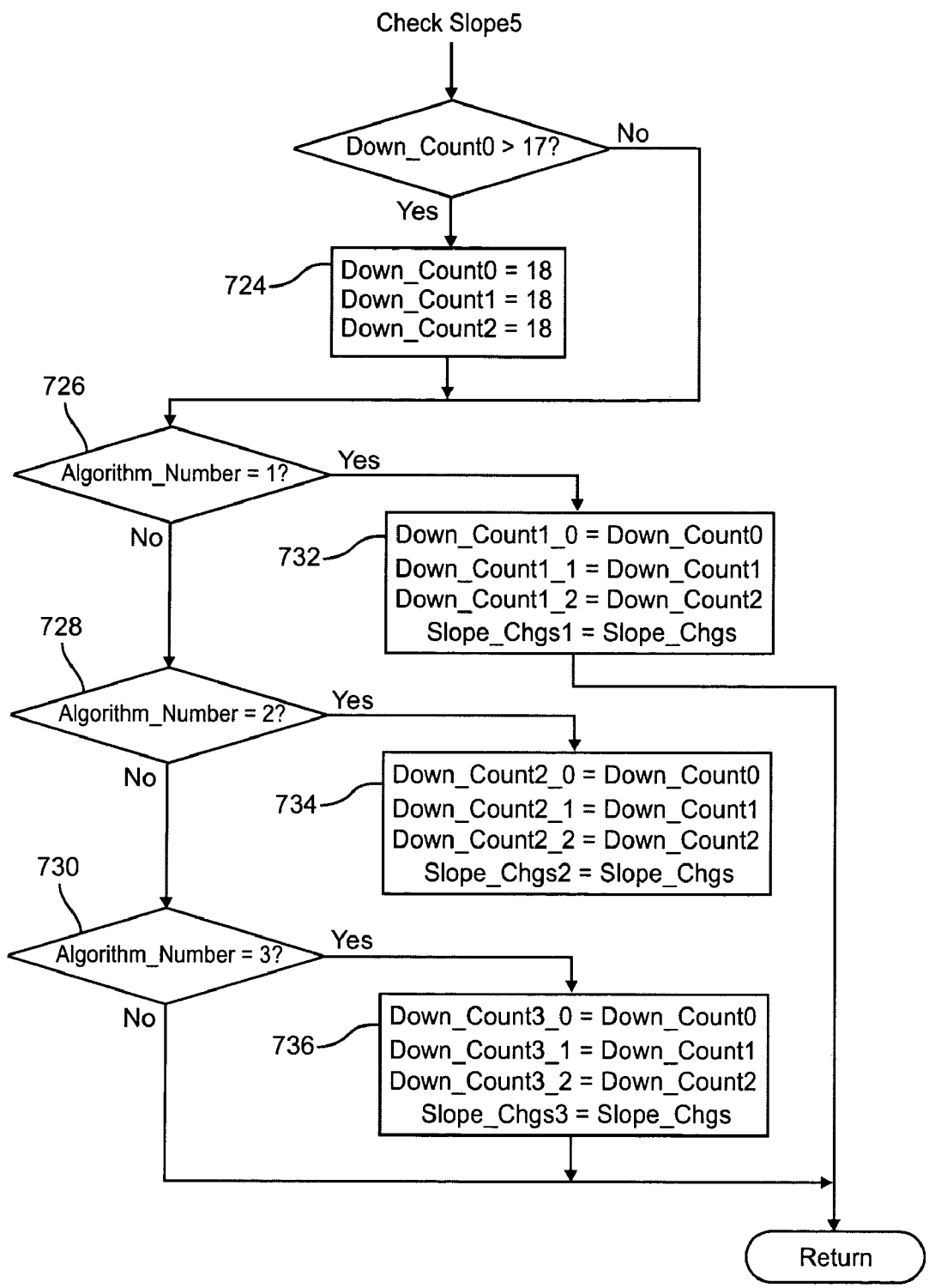

In the check slope changes module, initially a hit buffer is set false showing at reference numeral 700 and this buffer will be set true if certain slope change conditions are met as determined by the remainder of the module. Here, slope one refers to algorithm 1 and slope 2 to algorithm 2 and slope 3 to algorithm 3. The portion of the module in FIG. 15A determines whether the current signature appears more like a start up condition or more like an arcing condition. This portion of the module extends up to and including step 704 in FIG. 15B. Similarly, the portion of the module following step 704 through and including the remaining portion of FIG. 15B comprises further checks for start up conditions vs. arcing. In the portion of the module in FIG. 15C, as the down count increases, this indicates a greater probability of a start up condition. Finally, the down count is decremented each cycle as indicated at reference numeral 720 of FIG. 15C to avoid overfilling its register. In the illustrated embodiment, the maximum down count in the down count register is 18 as indicated in FIG. 15D at reference numeral 724. Finally, at reference numeral 726–730 the member of the algorithm (i.e. 1, 2 or 3) being run is determined and values of the down count registers suitable for the selected algorithm are set at 732, 734 and 736.

Referring to FIG. 16, a missing half cycle check module 274 is shown. This module essentially looks at peaks to determine when arcing is absent from a given half cycle of the current signature.

FIGS. 17A–17F, as mentioned above, are the "type B" algorithms for detecting parallel arcing and are essentially the same as the algorithms described in our above-referenced U.S. Pat. No. 6,259,996.

FIG. 18 shows the step start up algorithms 278 which are provided essentially to accommodate a new load coming online as determined by the current signature. If the start up algorithms as indicated in FIG. 18 are satisfied, tripping is prevented until all of the modules are run once again for a new half cycle.

Referring to FIGS. 19A–19J, the trip equation (algorithm) 262 for the described embodiment of the invention is illustrated. The trip algorithm decides whether or not to cause the controller to produce a trip signal based on a check of the states of different ones and combinations of ones of the counters and the states of various registers or buffers that were incremented and/or decremented or set to true or false or other states of values in the previously described modules.

Figure 19A:
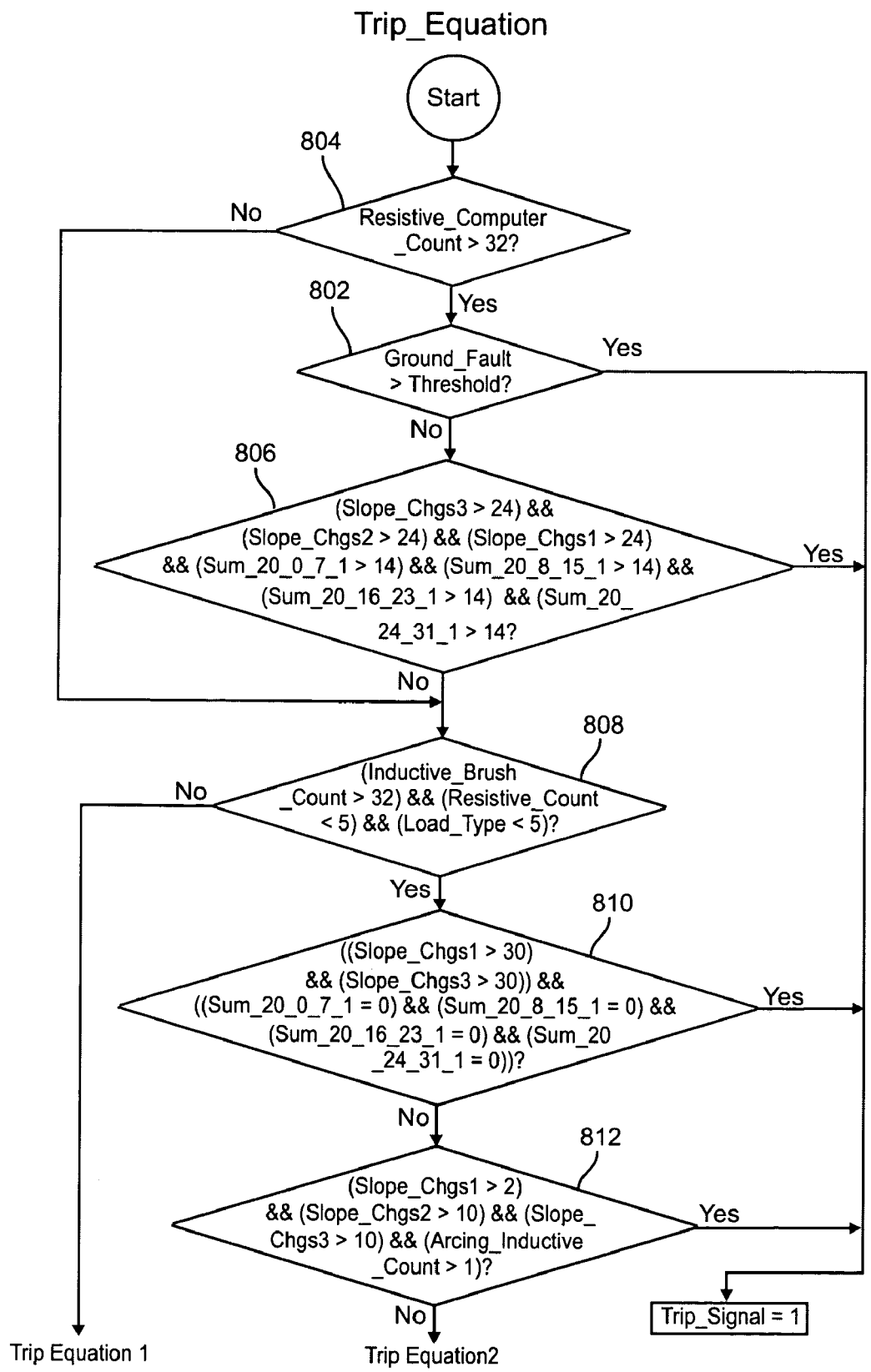
FIGS. 19A–19J show a flowchart showing operation of a trip equation program module.

In FIG. 19A, a trip signal is set at 1 if one of several conditions is met. One condition at 802 is a comparison of a ground fault counter to a threshold. Other criteria are a minimum count in a resistive computer counter at 804 and minimum counts in several slope change and sum counters at 806. Other such conditions include the counts in several slope change and sum counters as well as certain load type counters, as shown at 808–812. If the resistive computer count does not meet the minimum count indicated at 804, or if the conditions at 802–806 and those at 808 or 810 and 812 are not met, the program proceeds to test for an arcing fault based on a different set of criteria, as shown in FIG. 19B.

Figure 19B:
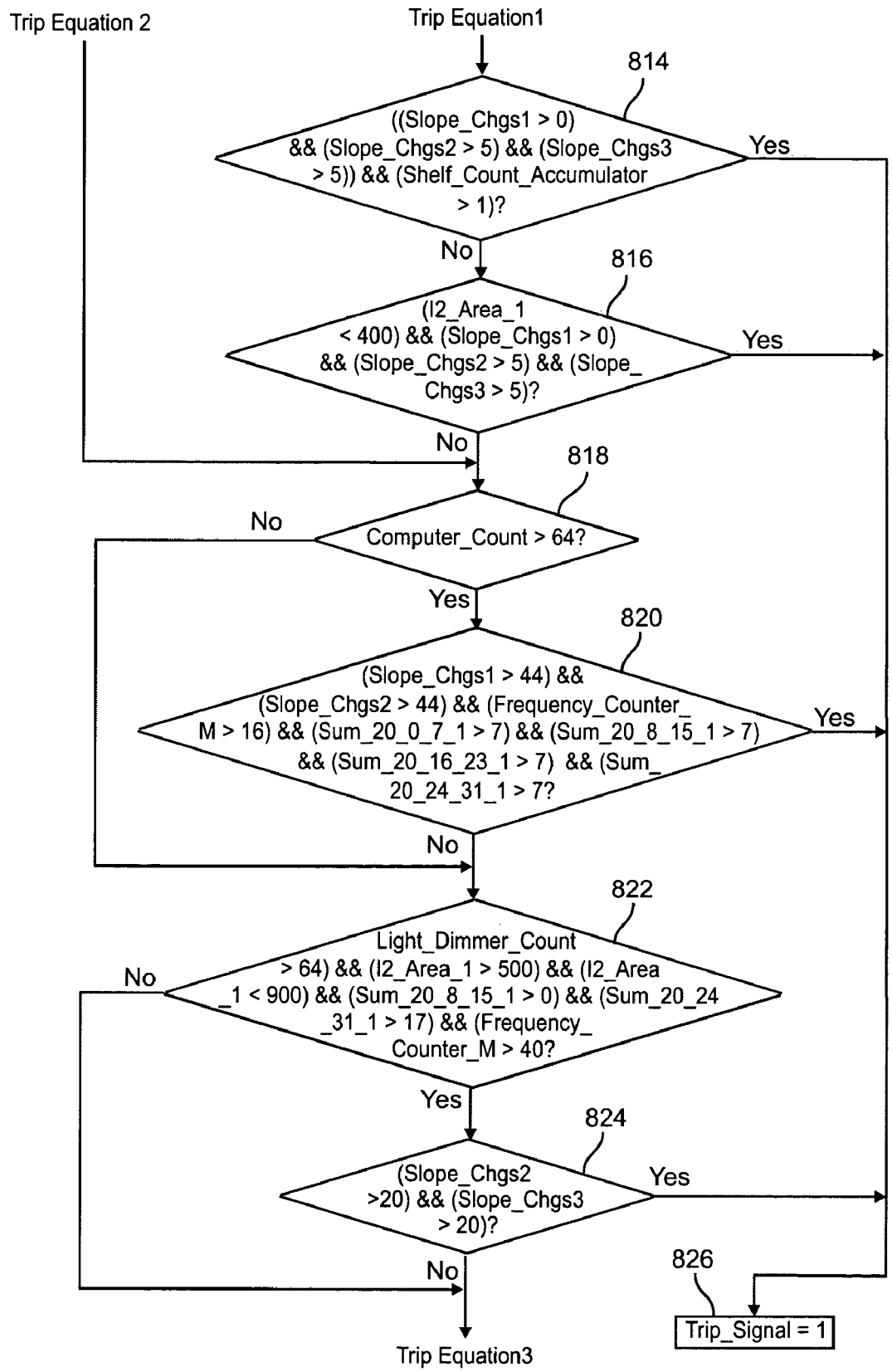
Figure 19C:
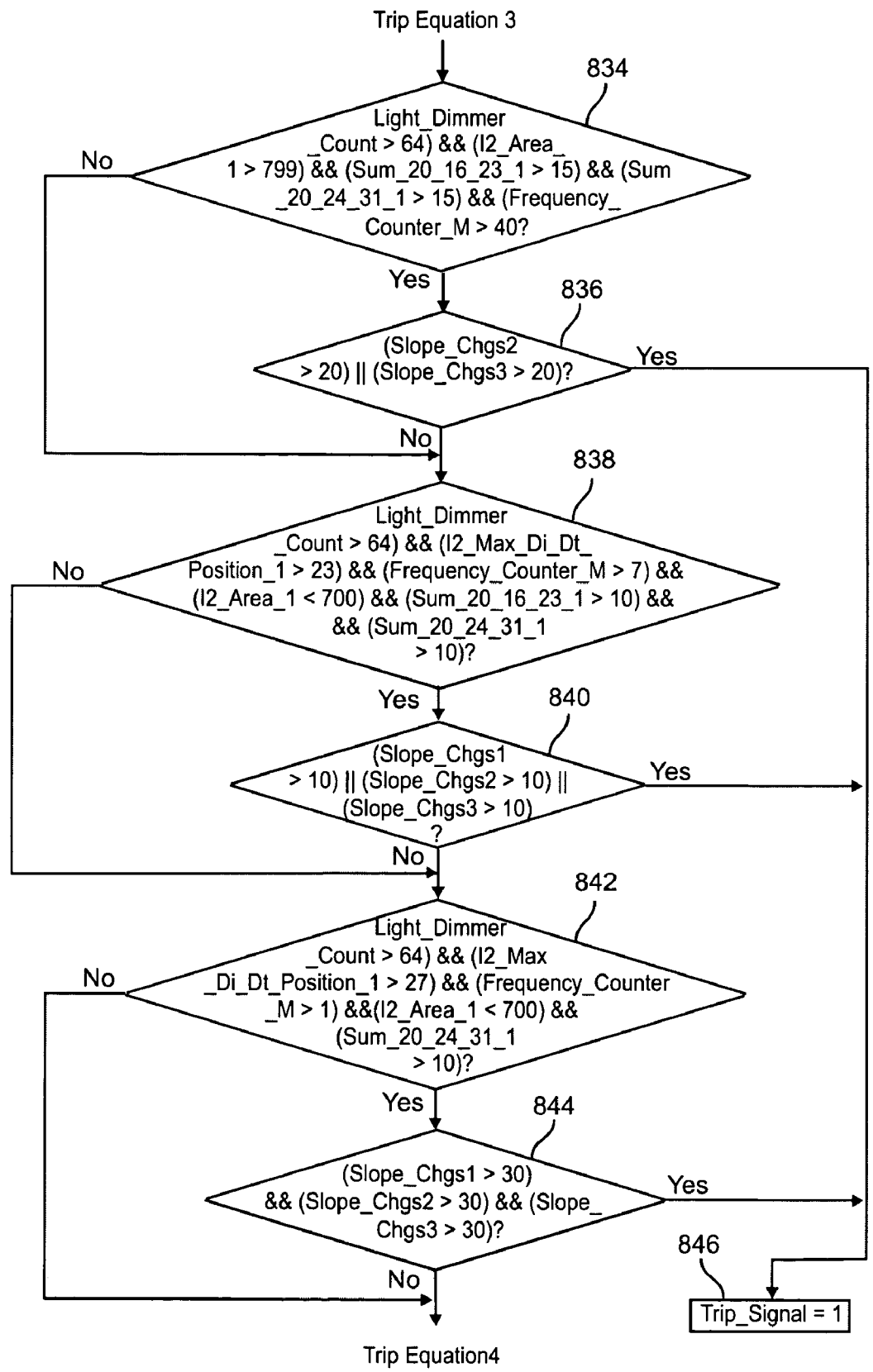
Figure 19D:
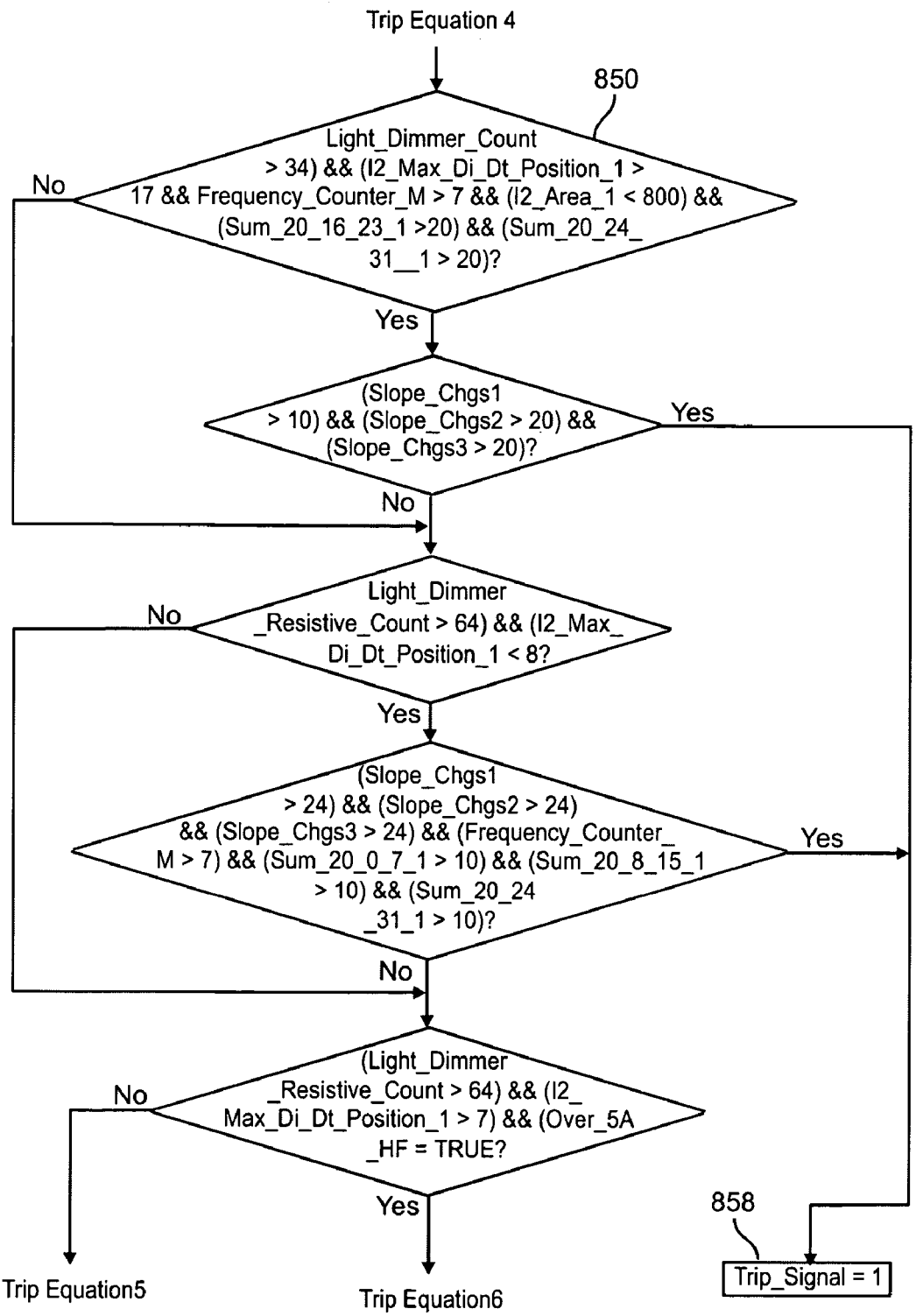
Figure 19E:
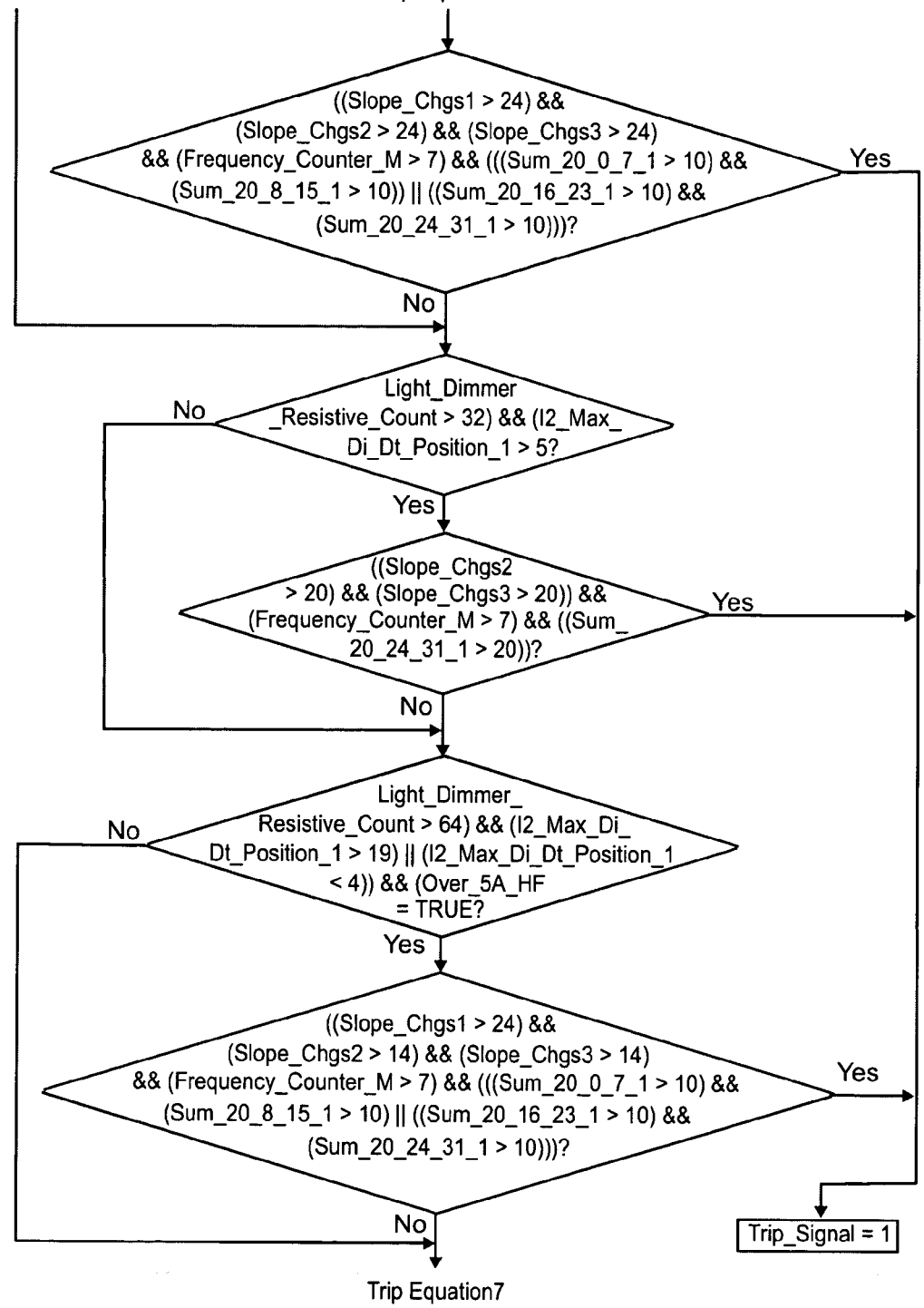
Figure 19F:
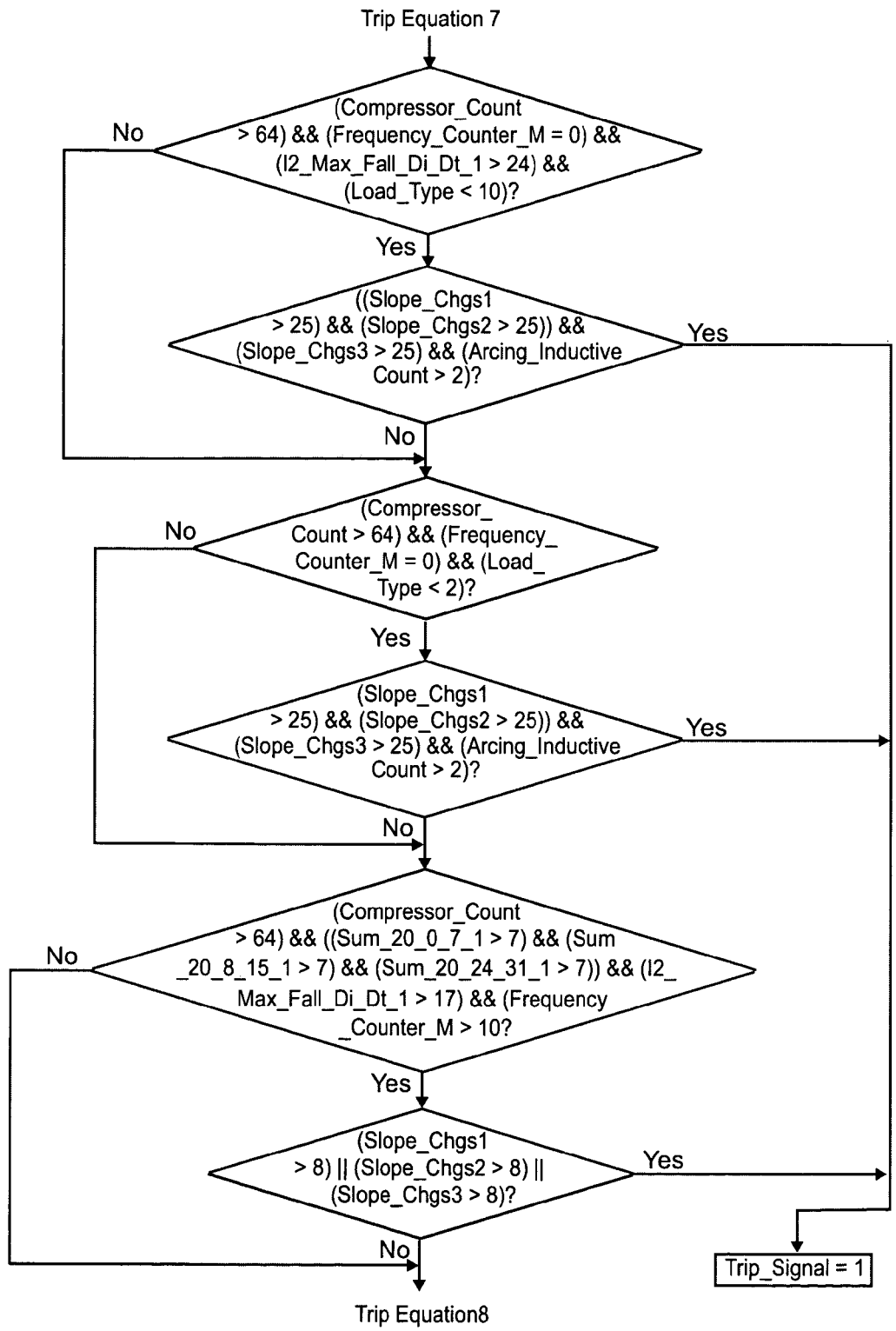
Figure 19G:
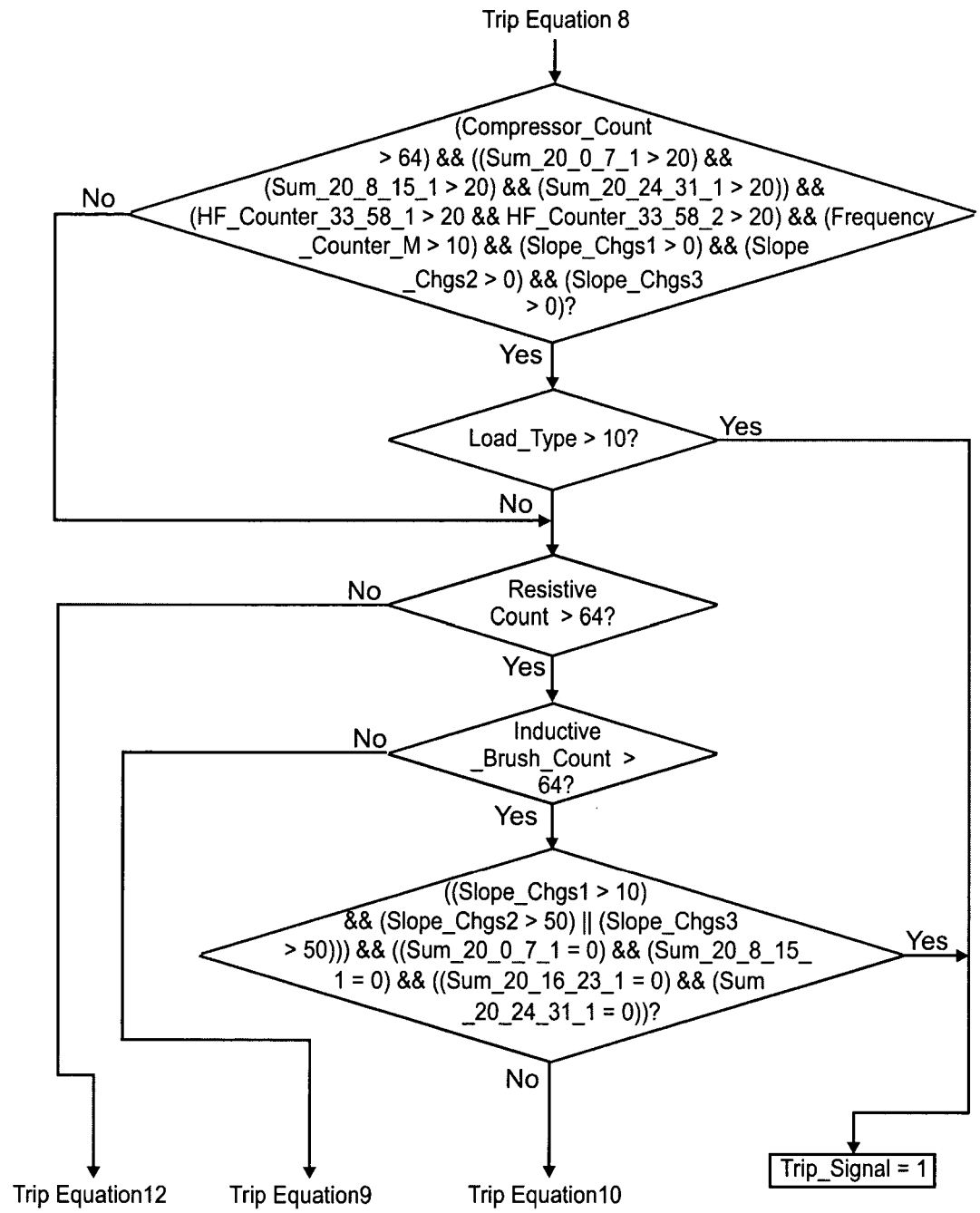
Figure 19H:
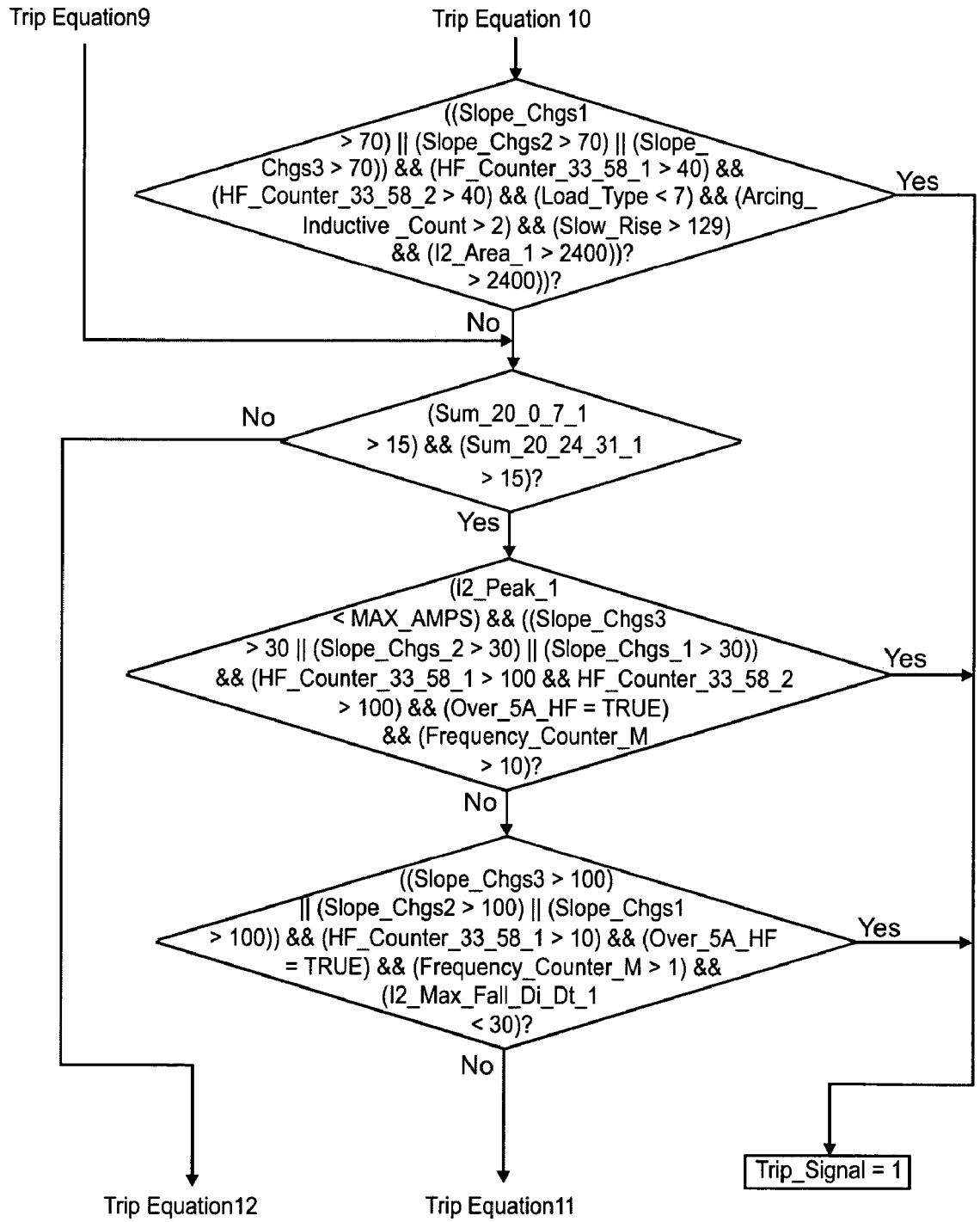
Figure 19I:
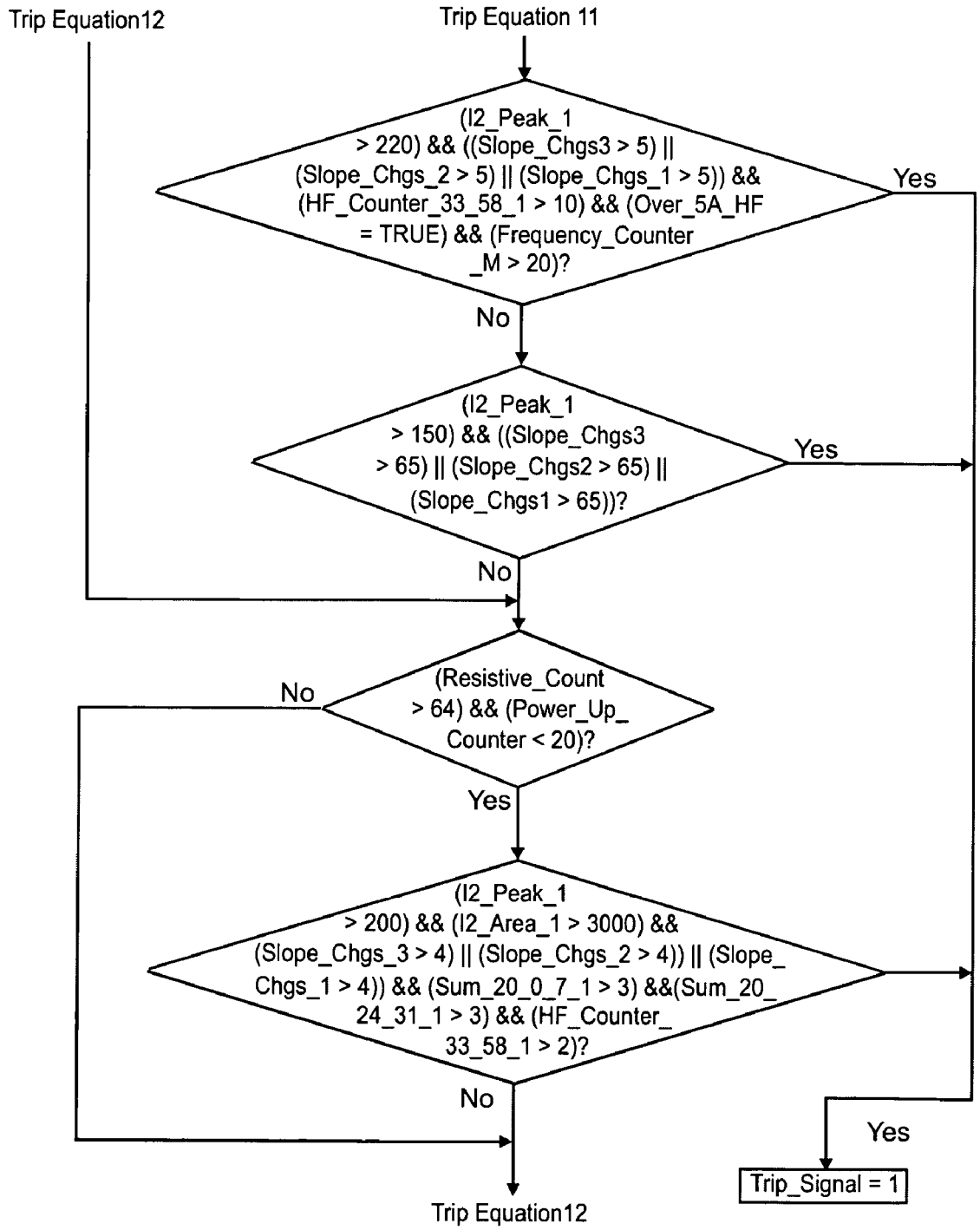
Figure 19J:
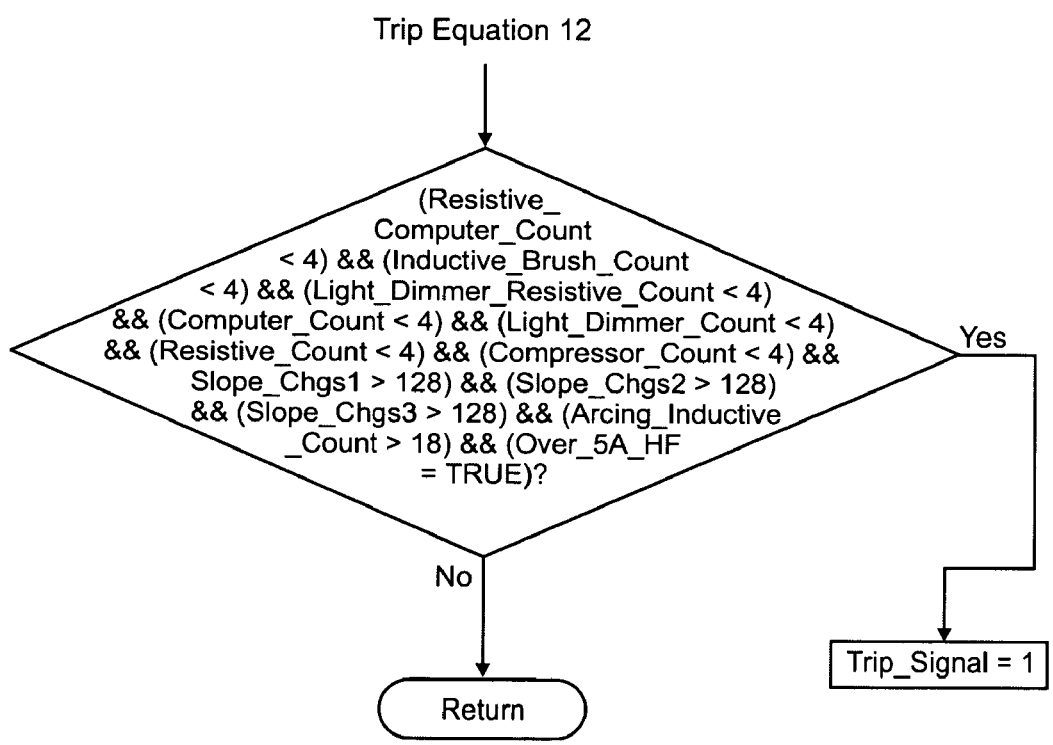

FIG. 19B shows a number of conditions which will cause the giving of a trip signal, including minimum readings in selected groups of counters, at steps 814 through 824. Some of these conditions, if met, will cause a trip signal to be set (826) and if not met, will cause the program to proceed to the next set of equations in FIG. 19C. In FIG. 19C, a similar process takes place focusing on a light dimmer load, and reading the counts in various counters and combinations of counters (834–844) to decide whether to set the trip signal at 846 or proceed to FIG. 19D. Similarly, FIG. 19D begins with a check of the light dimmer counter and other selected counters at 850 and proceed with a chain of checks of various counter contents which, as indicated in FIG. 19D will result in either setting a trip signal at 858 or proceeding to FIG. 19E.

In FIGS. 19E–19J, yet other selected groups of counters are read, and in similar fashion to the previously described FIGS. 19A–19D, either a trip signal is set or the module proceeds.

Figure 20A:
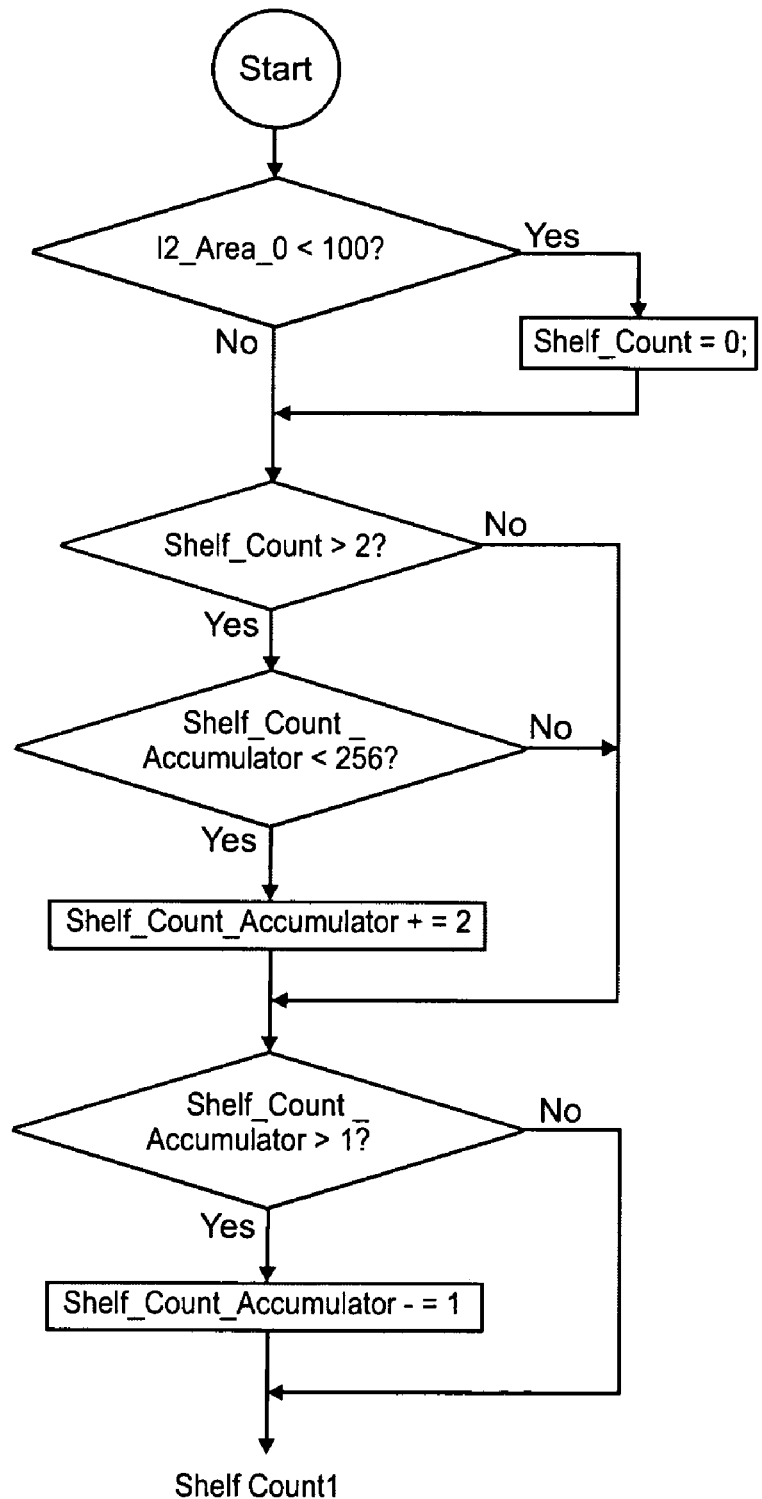
FIGS. 20A and 20B show a flowchart showing operation of a check for current shelf program module.
Figure 20B:
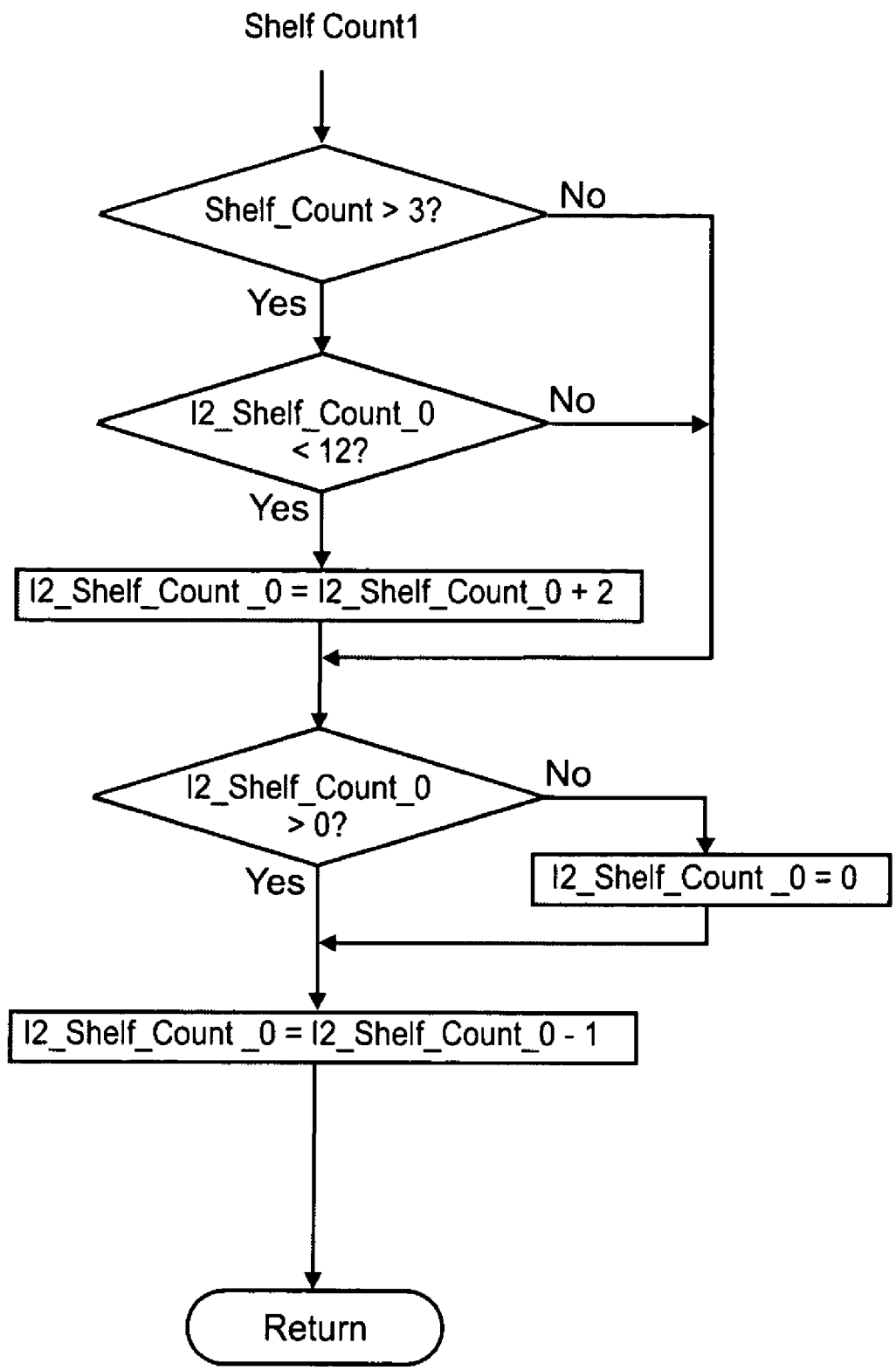

Referring to FIGS. 20A and 20B, the check for current shelf module 284 essentially looks for flat spots in the current signature. This module increments and/or decrements a shelf count accumulator in accordance with the area and shelf count registers as well as the current state of the shelf count accumulator.

Figure 21A:
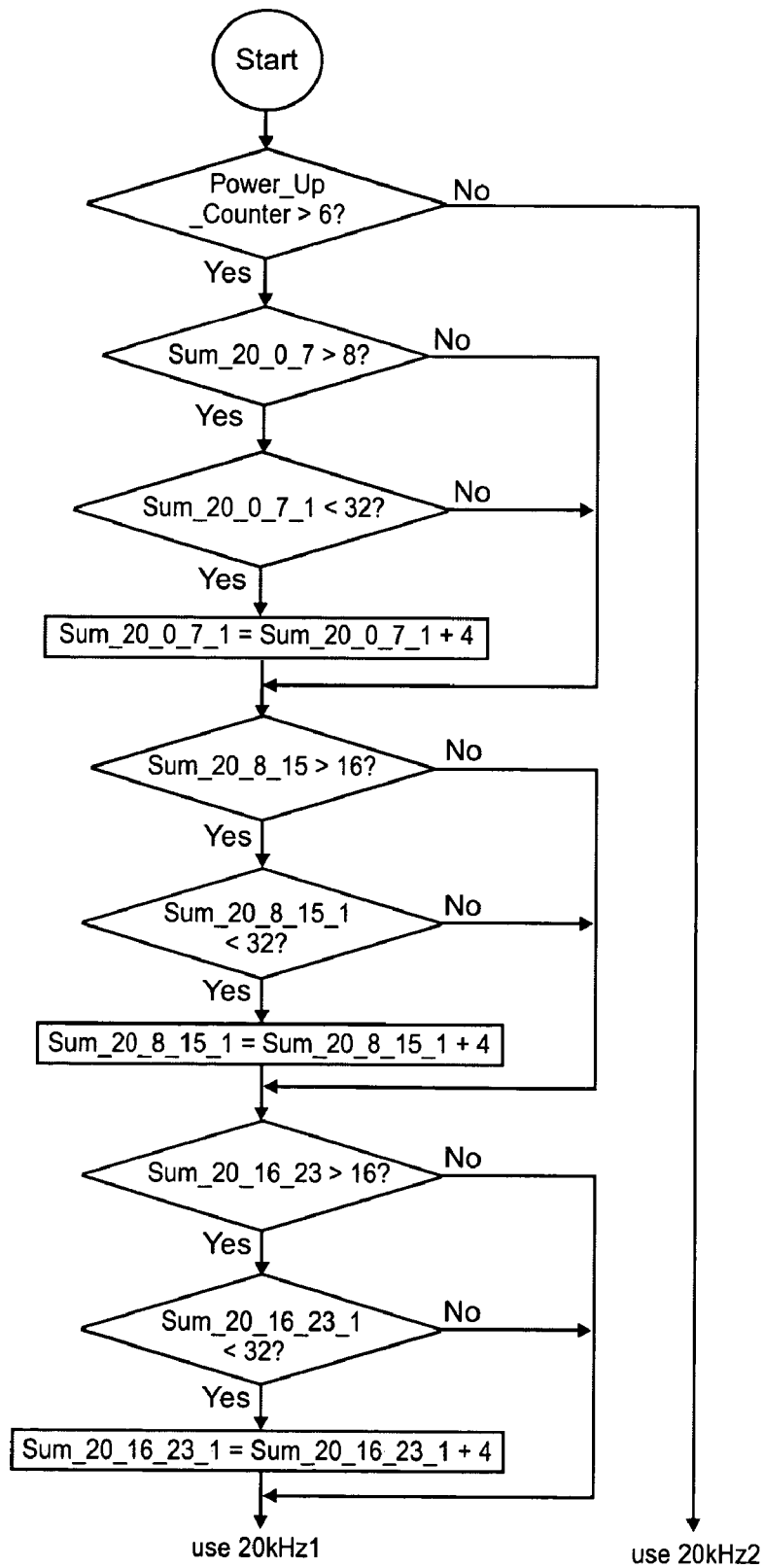
FIGS. 21A–21C show a flowchart showing operation of a use 20 KHz filter program module.
Figure 21B:
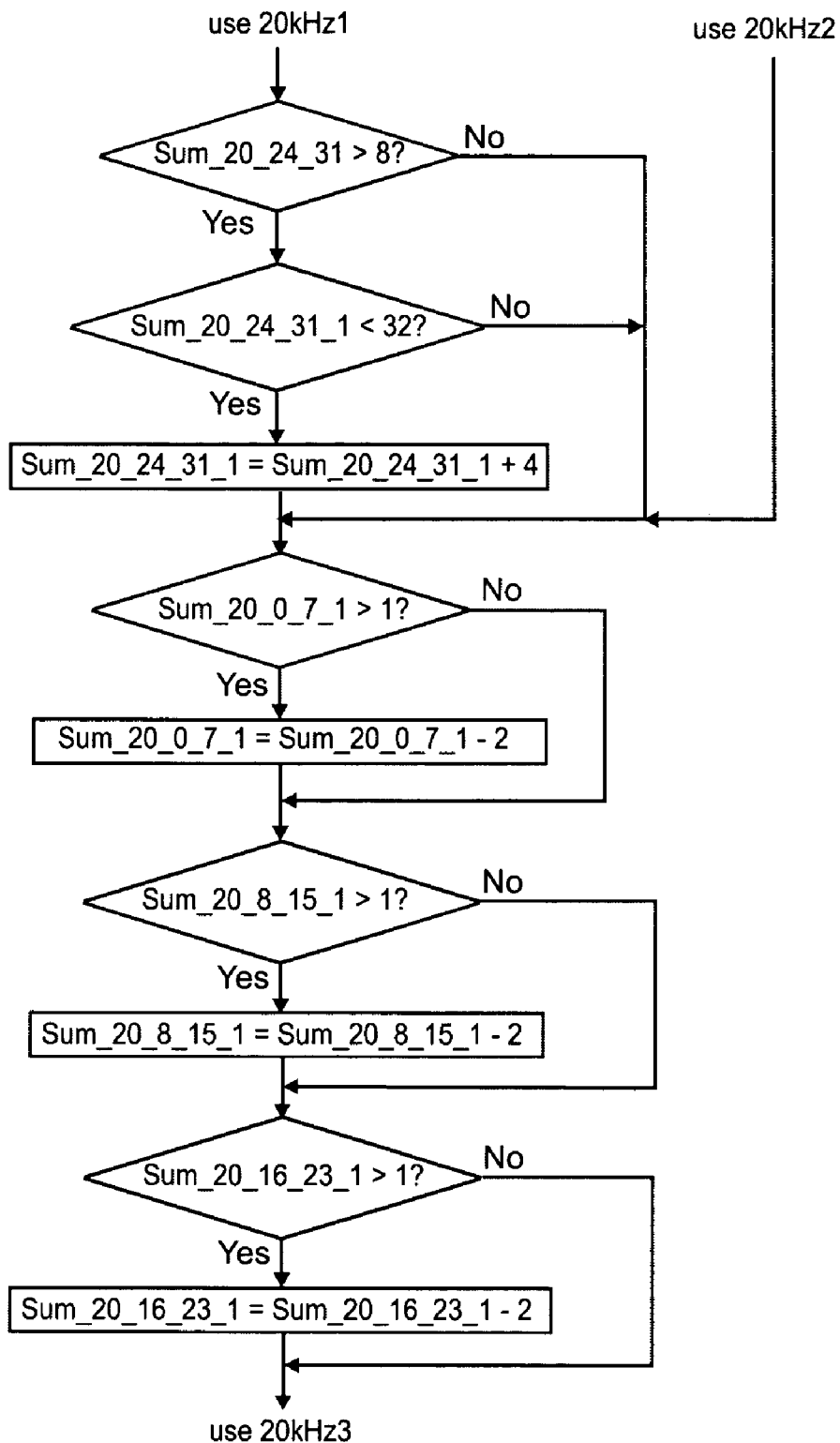
Figure 21C:
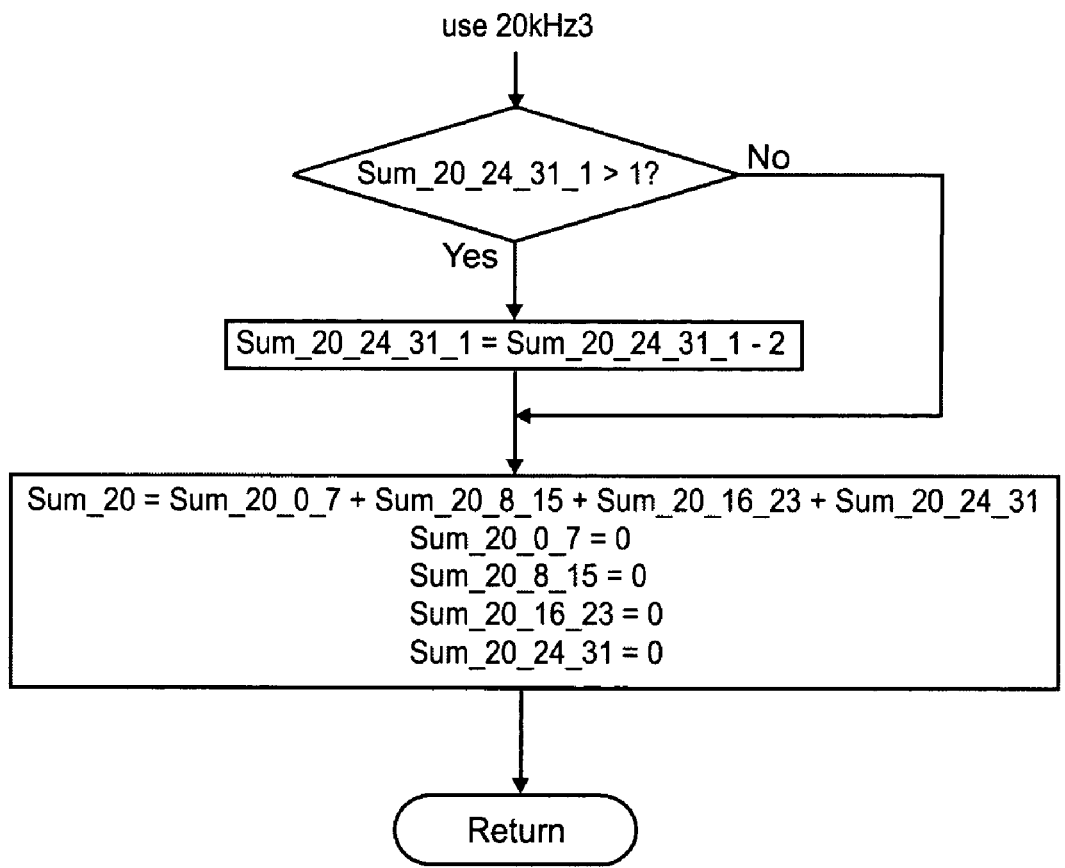

FIGS. 21A–21C show the use 20 KHz filter module 286. This module essentially splits the 20 KHz filter output into ⅛ cycle portions within which the 32 samples per half cycle are read. In this regard the maximum of each of the sum counters as shown in FIGS. 21A–21C is a count of 32. This algorithm sets the sum counters to various values as indicated therein and also sets and/or resets a shelf count accumulator as indicated.

Figure 22A:
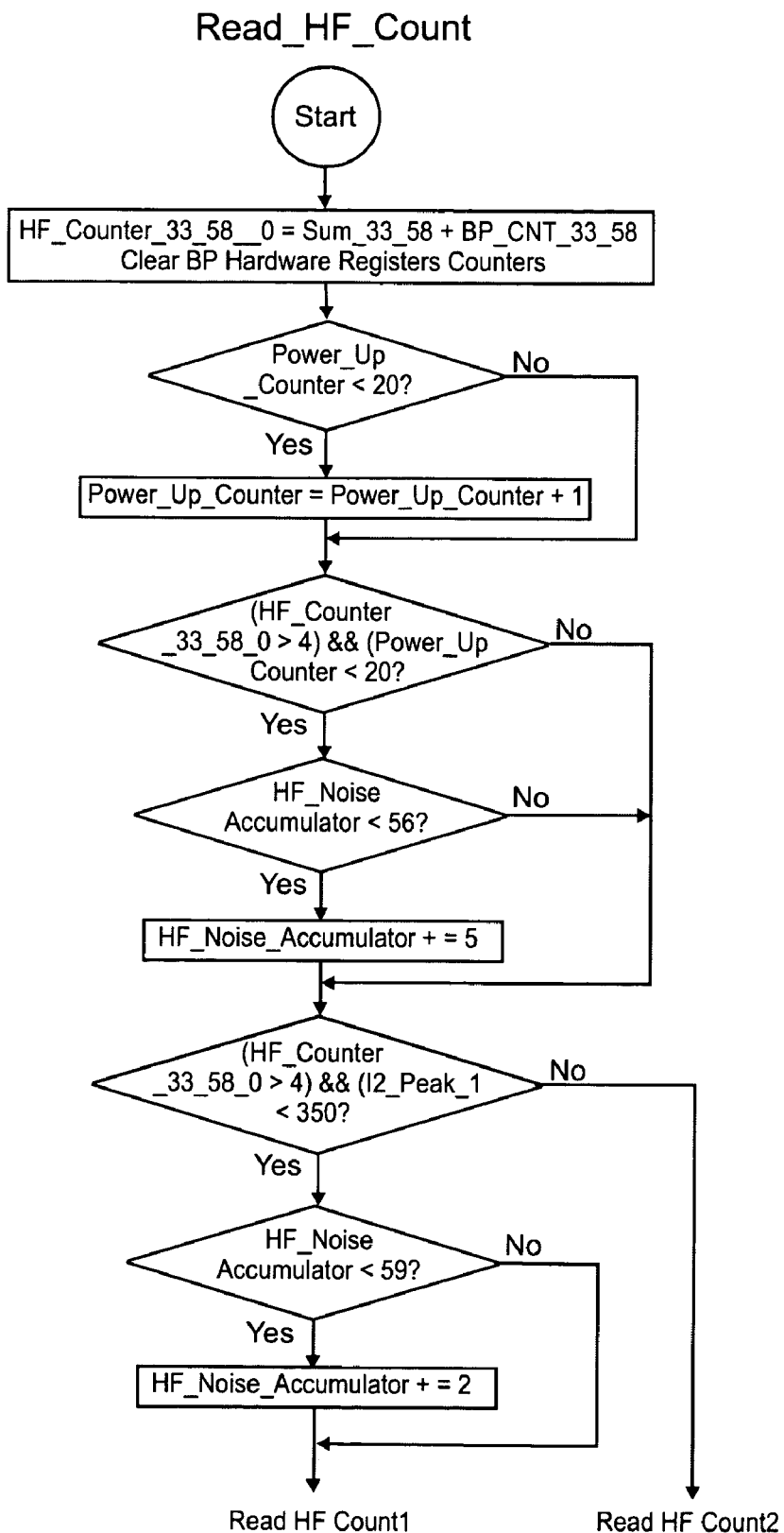
FIGS. 22A and 22B show a flowchart showing operation of a read HF count program module.
Figure 22B:
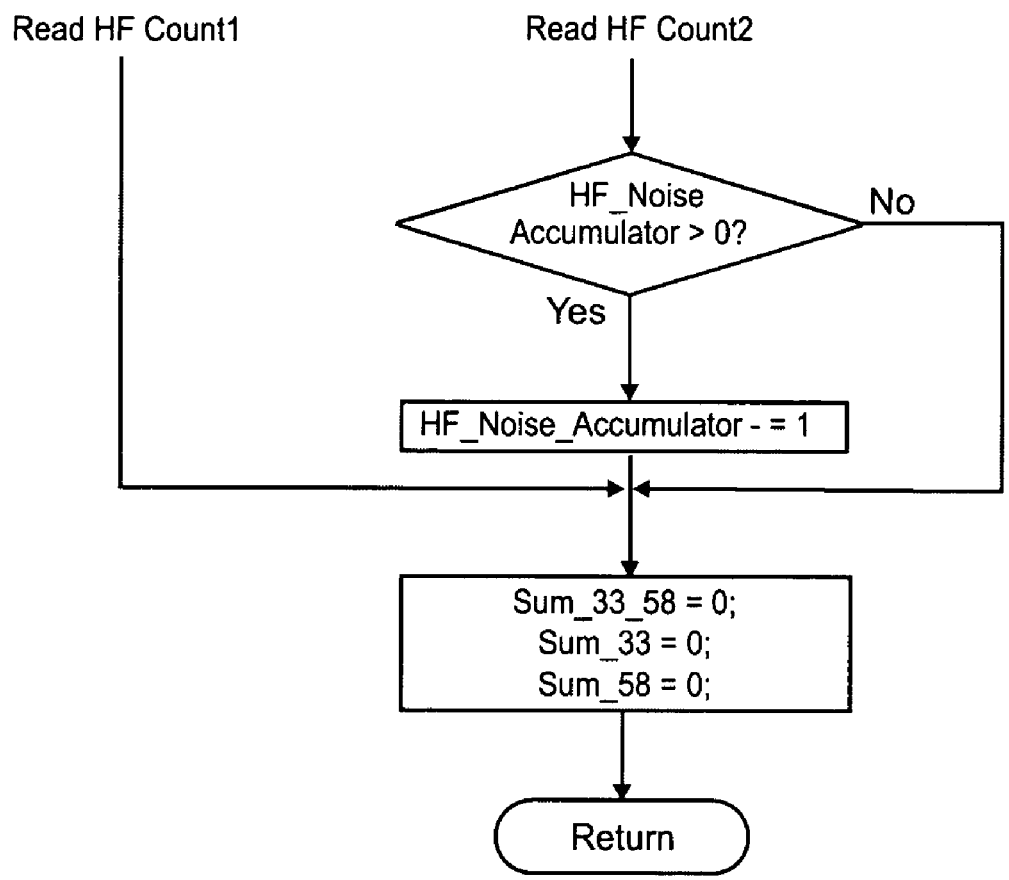

The read HF count module 288 is shown in FIGS. 22A and 22B. This module essentially checks various counters including the HF counter, the HF noise accumulator counter and power up counter and increments counters including the power up counter and HF noise accumulator counter as indicated. At the end of the module the "sum 3358," "sum 33" and "sum 58" counters are reset to zero.

Figure 23:
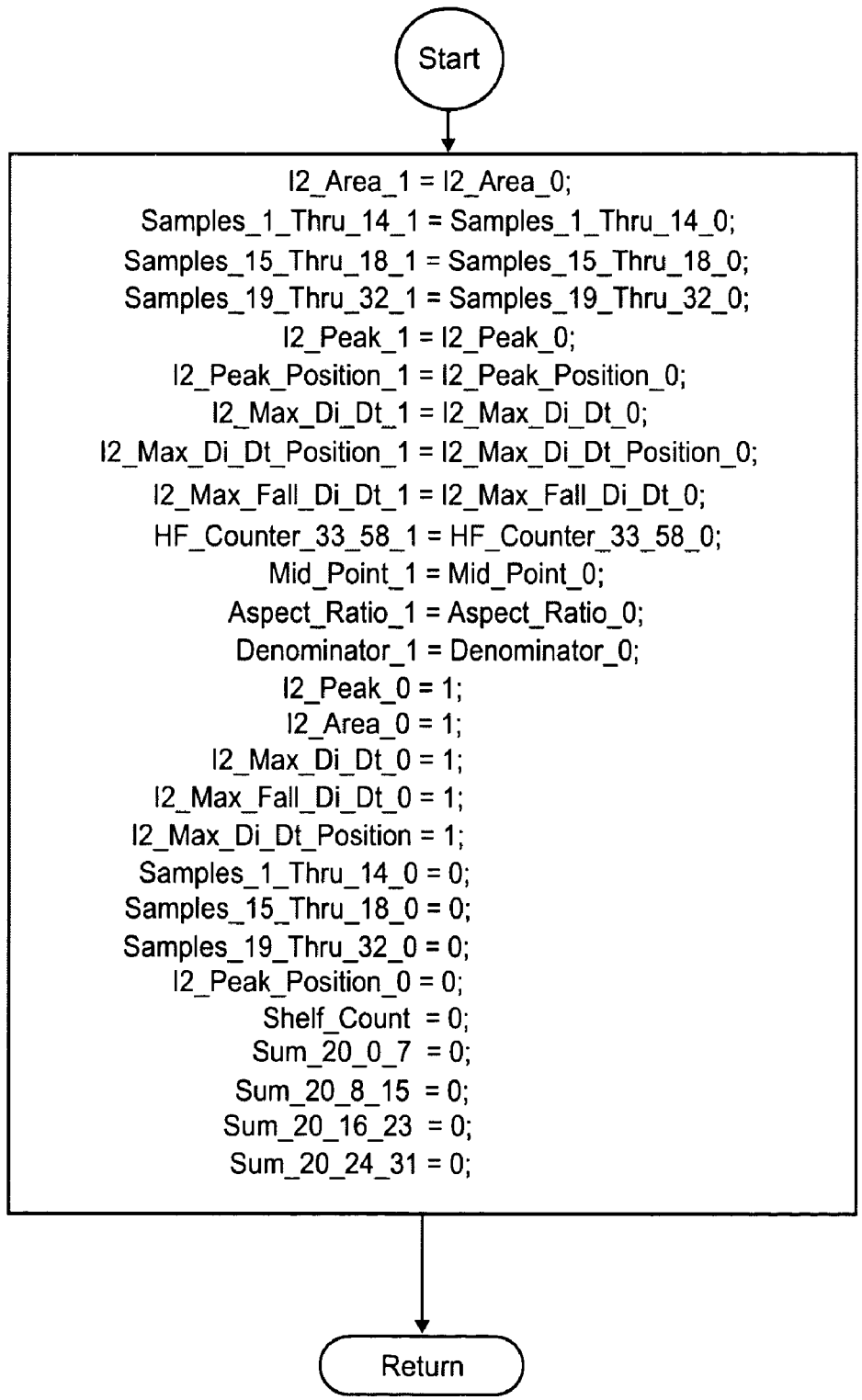
FIG. 23 is a flowchart showing operation of a store half cycle results program module.

Finally, FIG. 23 shows the store half cycle results module 290. This module again sets values into various registers or counters as indicated.

While particular embodiments and applications of the present invention have been illustrated and described, it is to be understood that the invention is not limited to the precise construction and compositions disclosed herein and that various modifications, changes, and variations may be apparent from the foregoing descriptions without departing from the spirit and scope of the invention as defined in the appended claims.

What is claimed is:

1. A method of determining whether arcing is present in an electrical circuit comprising:
    sensing a change in current in said circuit and developing a corresponding input signal;
    analyzing said input signal to determine the presence of broadband noise in a predetermined range of frequencies including a 20 KHz band, and producing a corresponding output signal; and
    processing said input signal and said output signal in a predetermined fashion to determine whether an arcing fault is present in said circuit;
    said processing including determining a type of load connected to said electrical circuit, based at least in part upon said input signal and said output signal, said processing also including incrementing one or more of a plurality of counters in a predetermined fashion in accordance with said input signal and said output signal and determining the type of load based at least in part on the states of one or more of said plurality of counters.

2. The method of claim 1 wherein said current is an alternating current and said analyzing includes monitoring noise in said 20 KHz band for each ⅛ cycle of said alternating current.

3. The method claim 1 wherein said processing comprises incrementing one or more of a plurality of counters in accordance with input signal and said output signal and periodically determining whether an arcing fault is present based at least in part on the states of said one or more of plurality of counters.

4. The method claim 1 wherein said processing comprises determining whether an arcing fault is present based at least in part on the states of one or more of said plurality of counters.

5. The method of claim 4 wherein said counters are implemented in software.

6. The method of claim 1 wherein said processing further includes determining whether an arcing fault is present based at least in part upon the type of load determined to be connected to said electrical circuit.

7. The method of claim 3 wherein said processing further includes determining whether an arcing fault is present based at least in part upon the type of load determined to be connected to said electrical circuit.

8. The method of claim 4 wherein said processing further includes determining whether an arcing fault is present based at least in part upon the type of load determined to be connected to said electrical circuit.

9. The method of claim 3 wherein said incrementing is further done in accordance with the type of load determined to be connected to said electrical circuit.

10. The method of claim 4 wherein said incrementing is further done in accordance with the type of load determined to be connected to said electrical circuit.

11. The method of claim 1 wherein said determining a type of load includes selecting one of a plurality of load types, including compressor load, computer load, resistor load, resistive load, inductive brush load, light dimmer load, light dimmer resistive load, and variable speed motor mode.

12. The method of claim 1 wherein said determining a type of load includes selecting one of a plurality of load types, including compressor load, computer load, resistive computer load, resistive load, inductive brush load, light dimmer load, light dimmer resistive load, and variable speed motor load.

13. The method of claim 8 wherein said determining a type of load includes selecting one of a plurality of load types, including compressor load, computer load, resistive computer load, resistive load, inductive brush load, light dimmer load, light dimmer resistive load, and variable speed motor load.

14. The method of claim 11 wherein said determining a type of load includes designating one of said load types as a default selection in the absence of a determination of any one of said other load types.

15. The method of claim 12 wherein said incrementing is performed in a different fashion for each of said load types.

16. The method of claim 4 wherein said incrementing includes incrementing a separate one or more of said counters for each type of load.

17. The method of claim 16 wherein said incrementing further includes incrementing a load type counter not associated with any of said load types.

18. The method of claim 13 wherein said incrementing includes incrementing a separate one or more of said counters for each of said load types.

19. The method of claim 3 wherein said determining whether an arcing fault is present includes using the states of selected ones of said plurality of counters for determining the presence of selected sub-harmonics in the current.

20. A system for determining whether arcing is present in an electrical circuit comprising:
   a sensor for sensing an alternating current in said circuit and developing a corresponding sensor signal;
   a circuit for analyzing said sensor signal to determine the presence of broadband noise in a predetermined range of frequencies, and producing a corresponding output signal;
   a controller for processing said sensor signal and said output signal to determine current characteristics and a type of load connected to said electrical circuit and to determine, using said load current characteristics and the presence of broadband noise, whether an arcing fault is present in said circuit; and
   a circuit for detecting high frequency noise in a 20 KHz frequency band for each ⅛ cycle of said alternating current, wherein said controller increments one or more of a plurality of counters in a predetermined fashion in accordance with said sensor signal and said output signal and determines the type of load based at least in part on the states of one or more of said plurality of counters.

21. The system of claim 20, wherein said controller and said circuit for analyzing further are provided on a single ASIC.

22. The system claim 20 wherein said controller increments one or more of a plurality of counters in accordance with said sensor signal and said output signal and periodically determines whether an arcing fault is present based at least in part on the states of one or more of said plurality of counters.

23. The system claim 20 wherein said controller periodically determines whether an arcing fault is present based at least in part on the states of one or more of said plurality of counters.

24. The system of claim 23 wherein said counters are implemented in software.

25. The system of claim 20 wherein said controller further determines whether an arcing fault is present based in part upon the type of load determined to be connected to said electrical circuit.

26. The system of claim 22 wherein said controller further determines whether an arcing fault is present based in part upon the type of load determined to be connected to said electrical circuit.

27. The system of claim 23 wherein said controller further determines whether an arcing fault is present based in part upon the type of load determined to be connected to said electrical circuit.

28. The system of claim 22 wherein said controller performs said incrementing in accordance with the type of load determined to be connected to said electrical circuit.

29. The system of claim 20 wherein said controller selects one of a plurality of load types, including compressor load, computer load, resistor load, resistive computer load, inductive brush load, light dimmer load, light dimmer resistive load, and variable speed motor load.

30. The system of claim 20 wherein said controller selects one of a plurality of load types, including compressor load, computer load, resistive computer load, resistive load, inductive brush load, light dimmer load, light dimmer resistive load, and variable speed motor load.

31. The system of claim 28 wherein said controller selects one of a plurality of load types, including compressor load, computer load, resistive computer load, resistive load, inductive brush load, light dimmer load, light dimmer resistive load, and variable speed motor load.

32. The system of claim 23 wherein said controller selects one of a plurality of load types, including compressor load, computer load, resistive computer load, resistive load, inductive brush load, light dimmer load, light dimmer resistive load, and variable speed motor load.

33. The system of claim 29 wherein said controller designates one of said load types as a default selection in the absence of a determination that one of said other load types is present.

34. The system of claim 30 wherein said controller increments said one or more of said plurality of counters in a different fashion for each of said load types.

35. The system of claim 23 wherein said controller increments a separate one or more of said counters for each type of load.

36. The system of claim 35 wherein said controller further increments a load type counter not associated with any of said specified load types in a predetermined fashion in response to said sensor signal and said output signal.

37. The system of claim 31 wherein said controller increments a separate one or more of said counters for each type of load.

38. The system of claim 22 wherein said controller determines whether an arcing fault is present using the states of selected ones of said plurality of counters for determining the presence of selected sub-harmonics in the current.

39. A controller for a system for determining whether arcing is present in an electrical circuit in response to input signals and producing a corresponding output signal, said input signals corresponding to an alternating current in said circuit and to the presence of broadband noise in a predetermined range of frequencies in said circuit including a 20 KHz band, said controller comprising:
  a plurality of counters;
  means for incrementing one or more of said plurality of counters in a predetermined fashion in accordance with said input signals and said output signal;
  means for determining a type of load connected to said electrical circuit and whether an arcing fault is present using at least the states of one or more of said plurality counters; and
  means for monitoring high frequency wire in said 20 KHz band for each ⅛ cycle of said alternating current.

40. The controller of claim 39 and further including means for producing a trip signal in response to a determination that an arcing fault is present in said circuit.

41. The controller of claim 39 wherein said counters are implemented in software.

42. The controller of claim 39 wherein said means for determining whether an arcing fault is present also uses the type of load determined to be connected to said electrical circuit.

43. The controller of claim 39 wherein said means for incrementing is responsive to the type of load determined to be connected to said electrical circuit.

44. The controller of claim 39 wherein said means for determining a type of load includes means for selecting one of a plurality of load types, including compressor load, computer load, resistive computer load, resistive load, inductive brush load, light dimmer load, light dimmer resistive load, and variable speed motor load.

45. The controller of claim 42 wherein said means for determining a type of load includes means for selecting one of a plurality of load types, including compressor load, computer load, resistive computer load, resistive load, inductive brush load, light dimmer load, light dimmer resistive load, and variable speed motor load.

46. The controller of claim 43 wherein said means for determining a type of load includes means for selecting one of a plurality of load types, including compressor load, computer load, resistive computer load, resistive load, inductive brush load, light dimmer load, light dimmer resistive load, and variable speed motor load.

47. The controller of claim 44 and further including means for designating one of said load types as a default selection in the absence of a determination of one of said other load types.

48. The controller of claim 44 wherein said means for incrementing operates in a different fashion for each of said load types.

49. The controller of claim 44 wherein said means for incrementing increments a separate one or more of said counters for each of said load types.

50. The controller of claim 44 further including means for incrementing a load type counter not associated with any of said load types.

51. The controller of claim 39 further including means for using the states of selected ones of said plurality of counters for determining the presence of selected sub-harmonics in the current.

52. The controller of claim 51 including means for incrementing one or more said counters in response to the presence of said one or more of selected sub-harmonics.

53. A method of determining whether arcing is present in an electrical circuit in response to input signals and producing a corresponding output signal, said input signals corresponding to an alternating current in said circuit and to the presence of broadband noise in a predetermined range of frequencies in said circuit, said method comprising:
  incrementing one or more of a plurality of counters in a predetermined fashion in accordance with said input signals and said output signal;
  determining a type of load connected to said electrical circuit and whether an arcing fault is present using the states of one or more of said plurality of counters; and
  monitoring high frequency noise in said 20 KHz band for each ⅛ cycle of said alternating current.

54. The method of claim 53 and further including producing a trip signal in response to a determination that an arcing fault is present in said circuit.

55. The method of claim 53 wherein said counters are implemented in software.

56. The method of claim 53 wherein said determining whether an arcing fault is present also uses the type of load determined to be connected to said electrical circuit.

57. The method of claim 53 wherein said incrementing is responsive to the type of load determined to be connected to said electrical circuit.

58. The method of claim 53 wherein said determining a type of load includes selecting one of a plurality of load types, including compressor load, computer load, resistive computer load, resistive load, inductive brush load, light dimmer load, light dimmer resistive load, and variable speed motor load.

59. The method of claim 55 wherein said determining a type of load includes selecting one of a plurality of load types, including compressor load, computer load, resistive computer load, resistive load, inductive brush load, light dimmer load, light dimmer resistive load, and variable speed motor load.

60. The method of claim 57 wherein said determining a type of load includes selecting one of a plurality of load types, including compressor load, computer load, resistive computer load, resistive load, inductive brush load, light dimmer load, light dimmer resistive load, and variable speed motor load.

61. The method of claim 58 and further including designating one of said load types as a default selection in the absence of a determination of one of said other load types.

62. The method of claim 58 wherein said incrementing operates in a different fashion for each of said load types.

63. The method of claim 58 wherein said incrementing includes incrementing a separate one or more of said counters for each of said load types.

64. The method of claim 58 further including incrementing one or more of a load type counter not associated with any of said load types.

65. The method of claim 53 wherein further including using the states of selected ones of said plurality of counters for determining the presence of selected sub-harmonics in the current.

66. The method of claim 65 including incrementing one or more others of said counters in response to the presence of said one or more of selected sub-harmonics.

67. A system for determining whether arcing is present in an electrical circuit comprising:

means for sensing a change in current in said circuit and developing a corresponding input signal;

means for analyzing said input signal to determine the presence of broadband noise in a predetermined range of frequencies including a 20 KHz band, and producing a corresponding output signal; and means for processing said input signal and said output signal in a predetermined fashion to determine whether an arcing fault is present in said circuit;

said means for processing including means for determining a type of load connected to said electrical circuit, based at least in part upon said input signal and said output signal and said means for processing including incrementing one or more of a plurality of counters in a predetermined fashion in accordance with said input signal and said output signal and determining the type of load based at least in part on the states of one or more of said plurality of counters.

68. The system of claim 67 wherein said current is an alternating current and wherein said means for analyzing includes means for monitoring noise in said 20 KHz band for each $\frac{1}{8}$ cycle of said alternating current.

69. The system of claim 67 wherein said means for analyzing and said means for processing comprise a single ASIC.

* * * * *